US012772644B2

(12) United States Patent
Hong et al.

(10) Patent No.: US 12,772,644 B2
(45) Date of Patent: Oct. 20, 2026

(54) DISPLAY SYSTEMS WITH LIGHT-EMITTING DIODES

(71) Applicant: Apple Inc., Cupertino, CA (US)

(72) Inventors: Ziruo Hong, San Jose, CA (US); Ganghun Kim, Milpitas, CA (US); Jun Qi, San Jose, CA (US); Rong Liu, Sunnyvale, CA (US); Saijin Liu, San Jose, CA (US); Tongbi T Jiang, Santa Clara, CA (US); Victor H Yin, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 429 days.

(21) Appl. No.: 18/180,763

(22) Filed: Mar. 8, 2023

(65) Prior Publication Data

US 2023/0361154 A1 Nov. 9, 2023

Related U.S. Application Data

(60) Provisional application No. 63/337,936, filed on May 3, 2022, provisional application No. 63/337,932, filed on May 3, 2022.

(51) Int. Cl.
*H10H 29/14* (2025.01)

(52) U.S. Cl.
CPC ................................ *H10H 29/142* (2025.01)

(58) Field of Classification Search
None
See application file for complete search history.

(56) References Cited

U.S. PATENT DOCUMENTS

| | | | |
|---|---|---|---|
| 6,580,089 B2 | 6/2003 | Bandara et al. | |
| 7,982,228 B2 | 7/2011 | Choi et al. | |
| 8,058,663 B2 * | 11/2011 | Fan | H10H 29/10 257/89 |
| 9,444,015 B2 | 9/2016 | Bower et al. | |
| 9,705,042 B2 | 7/2017 | Bower et al. | |
| 10,133,426 B2 | 11/2018 | Den Boer et al. | |
| 10,134,803 B2 | 11/2018 | Chaji et al. | |
| 10,170,671 B2 | 1/2019 | Chu | |
| 10,217,912 B2 | 2/2019 | Chae et al. | |

(Continued)

FOREIGN PATENT DOCUMENTS

KR 101878666 B1 8/2018

*Primary Examiner* — Bilkis Jahan
(74) *Attorney, Agent, or Firm* — Treyz Law Group, P.C.; Joseph F. Guihan; Jinie M. Guihan

(57) ABSTRACT

An electronic device may have one or more displays that produce images for a user. The display may include an array of light-emitting diodes. Each light-emitting diode in the array of light-emitting diodes may include a plurality of vias. The vias may be arranged in an array of rows and columns. The light-emitting diodes in the array may share a common cathode. The common cathode may include a conductive layer formed from a reflective material. The conductive layer may be formed in a grid that defines a plurality of openings for the light-emitting diodes or may be formed around the periphery of the array. The array may include light-emitting diodes of two different colors in a head-to-tail arrangement, connected in series, or that share a common cathode. The array may include light-emitting diodes of three different colors that are vertically stacked.

23 Claims, 36 Drawing Sheets

(56) References Cited

U.S. PATENT DOCUMENTS

| | | | | |
|---|---|---|---|---|
| 10,263,050 | B2 | 4/2019 | Hack et al. | |
| 10,600,767 | B2 | 3/2020 | Chong et al. | |
| 10,804,429 | B2 | 10/2020 | Wildeson et al. | |
| 10,892,296 | B2 | 1/2021 | Chae et al. | |
| 10,937,924 | B2 | 3/2021 | Zou et al. | |
| 11,114,499 | B2 | 9/2021 | Lee et al. | |
| 2005/0007000 | A1 | 1/2005 | Chou et al. | |
| 2006/0284190 | A1* | 12/2006 | Zimmerman | H10H 20/819 257/E33.068 |
| 2007/0007584 | A1 | 1/2007 | Hwang et al. | |
| 2009/0078955 | A1* | 3/2009 | Fan | H10H 29/10 438/46 |
| 2010/0072487 | A1* | 3/2010 | Tsai | H10H 20/816 257/E33.056 |
| 2010/0084668 | A1* | 4/2010 | Choi | H10W 90/00 257/89 |
| 2015/0362165 | A1 | 12/2015 | Chu et al. | |
| 2016/0035924 | A1 | 2/2016 | Oraw et al. | |
| 2016/0359084 | A1* | 12/2016 | El-Ghoroury | H10H 20/813 |
| 2017/0179432 | A1 | 6/2017 | Visweswaran et al. | |
| 2019/0207043 | A1* | 7/2019 | Yonkee | H10F 77/1246 |
| 2019/0229149 | A1 | 7/2019 | Yoo | |
| 2020/0259048 | A1* | 8/2020 | Or-Bach | G09G 3/32 |
| 2020/0328250 | A1 | 10/2020 | Chae et al. | |
| 2021/0057670 | A1 | 2/2021 | Wong et al. | |
| 2021/0294031 | A1* | 9/2021 | Or-Bach | G02B 6/12002 |
| 2021/0336083 | A1* | 10/2021 | Kim | H10H 29/142 |
| 2023/0069410 | A1 | 3/2023 | Pinos et al. | |
| 2023/0133315 | A1 | 5/2023 | Lopez et al. | |

* cited by examiner

DISPLAY SYSTEMS WITH LIGHT-EMITTING DIODES

This application claims the benefit of provisional patent application No. 63/337,932, filed May 3, 2022, and provisional patent application No. 63/337,936, filed May 3, 2022, which are hereby incorporated by reference herein in their entireties.

BACKGROUND

This relates generally to electronic devices and, more particularly, to electronic devices with displays.

If care is not taken, the components used in displaying content may be bulky and may not exhibit desired levels of optical performance and power consumption.

SUMMARY

An electronic device may have one or more displays that produce images for a user. The display may include a display module that generates light and an optical system that redirects the light from the display module. The display module may include an illumination engine. The illumination engine may include an array of light-emitting diodes.

Each light-emitting diode in the array of light-emitting diodes may include a plurality of vias. The vias may be arranged in an array of rows and columns. Each via may optionally have a main portion and one or more finger portions. Including multiple, smaller vias in each light-emitting diode (instead of one large via) may prevent the light-emitting diodes from having dark spots.

The light-emitting diodes in the array may share a common cathode. The common cathode may include a conductive layer formed from a reflective material. The conductive layer may be formed in a grid that defines a plurality of openings for the light-emitting diodes or may be formed around the periphery of the array.

Some arrays may include light-emitting diodes of different colors. The array may include light-emitting diodes of two different colors in a head-to-tail arrangement. The array may include light-emitting diodes of two different colors connected in series. The array may include light-emitting diodes of two different colors that share a common cathode. The array may include light-emitting diodes of three different colors. The light-emitting diodes of three different colors may be vertically stacked. The vertically stacked light-emitting diodes may share a common anode contact.

DETAILED DESCRIPTION

Figure 1:
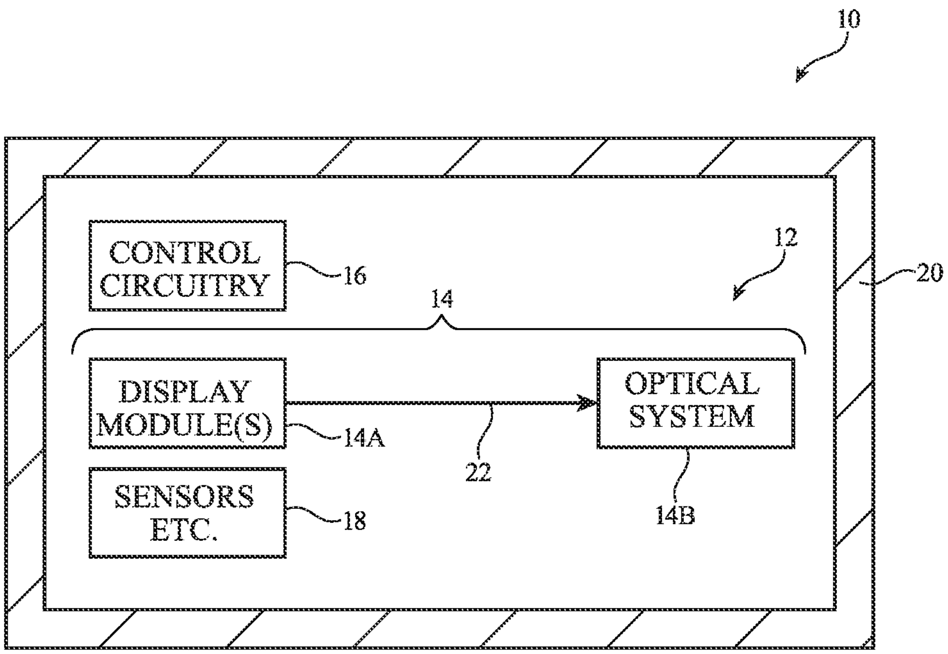
FIG. 1 is a diagram of an illustrative system having a display in accordance with some embodiments.

An illustrative system having a device with one or more display systems is shown in FIG. 1. System 10 may be a device having one or more displays such as displays 14 mounted within support structure (housing) 20. System 10 may be a portable device such as a handheld device or laptop computer, a head-mounted device, or other electrical equipment. Displays 14 may include one or more display modules such as display modules 14A and one or more optical systems such as optical systems 14B. Display modules 14A may be mounted in a support structure such as support structure 20. Each display module 14A may emit light 22 (image light) that is redirected using an associated one of optical systems 14B.

The operation of system 10 may be controlled using control circuitry 16. Control circuitry 16 may include storage and processing circuitry for controlling the operation of system 10. Circuitry 16 may include storage such as hard disk drive storage, nonvolatile memory (e.g., electrically-programmable-read-only memory configured to form a solid state drive), volatile memory (e.g., static or dynamic random-access-memory), etc. Processing circuitry in control circuitry 16 may be based on one or more microprocessors, microcontrollers, digital signal processors, baseband processors, power management units, audio chips, graphics processing units, application specific integrated circuits, and other integrated circuits. Software code (instructions) may be stored on storage in circuitry 16 and run on processing circuitry in circuitry 16 to implement operations for system 10 (e.g., data gathering operations, operations involving the adjustment of components using control signals, image rendering operations to produce image content to be displayed for a user, etc.).

System 10 may include input-output circuitry such as input-output devices 12. Input-output devices 12 may be used to allow data to be received by system 10 from external equipment (e.g., a tethered computer, a portable device such as a handheld device or laptop computer, or other electrical equipment) and to allow a user to provide device 10 with user input. Input-output devices 12 may also be used to gather information on the environment in which system 10 is operating. Output components in devices 12 may allow system 10 to provide a user with output and may be used to communicate with external electrical equipment. Input-output devices 12 may include sensors and other components 18 (e.g., image sensors for gathering images of real-world object that are digitally merged with virtual objects on a display in system 10, accelerometers, depth sensors, light sensors, haptic output devices, speakers, batteries, wireless communications circuits for communicating between system 10 and external electronic equipment, etc.). In one suitable arrangement that is sometimes described herein as an example, components 18 may include gaze tracking sensors. As an example, the gaze tracking sensors may include infrared or other light emitters that emit infrared light and image sensors that sense the infrared or other light reflected off of the user's eye (e.g., where the sensed light identifies the gaze direction of the user's eye).

Display modules 14A may include reflective displays (e.g., liquid crystal on silicon (LCOS) displays, digital-micromirror device (DMD) displays, or other spatial light modulators), emissive displays (e.g., micro-light-emitting diode (μLED) displays, organic light-emitting diode (OLED) displays, laser-based displays, etc.), or displays of other types. Light sources in display modules 14A may include μLEDs, OLEDs, LEDs, mini LEDs, lasers, combinations of these, or any other desired light-emitting components. The displays may be include one or more pixelated array packages (e.g., pixelated LED array packages). In one suitable arrangement that is described herein as an example, display module 14A may include a spatial light modulator and an illumination engine. The illumination engine may generate illumination light. The spatial light modulator may spatially modulate illumination light to produce image light 22 (e.g., using images to be displayed by the image light). The arrays of light sources in display module 14A may be formed in the illumination engine and may produce the illumination light. The spatial light modulator (33) may be a transmissive or reflective spatial light modulator.

Optical systems 14B may form lenses. If desired, optical system 14B may contain components (e.g., an optical combiner, etc.) to allow real-world image light from real-world images or objects to be combined optically with virtual (computer-generated) images such as virtual images in image light 22. Optical system 14B may include collimating optics. If desired, display module 14A and/or optical system 14B may be mounted within support structure 20 of FIG. 1. Other mounting arrangements may be used, if desired.

System 10 may, if desired, include wireless circuitry and/or other circuitry to support communications with a computer or other external equipment (e.g., a computer that supplies display 14 with image content). During operation, control circuitry 16 may supply image content to display 14. The content may be remotely received (e.g., from a computer or other content source coupled to system 10) and/or may be generated by control circuitry 16 (e.g., text, other computer-generated content, etc.).

Figure 2:
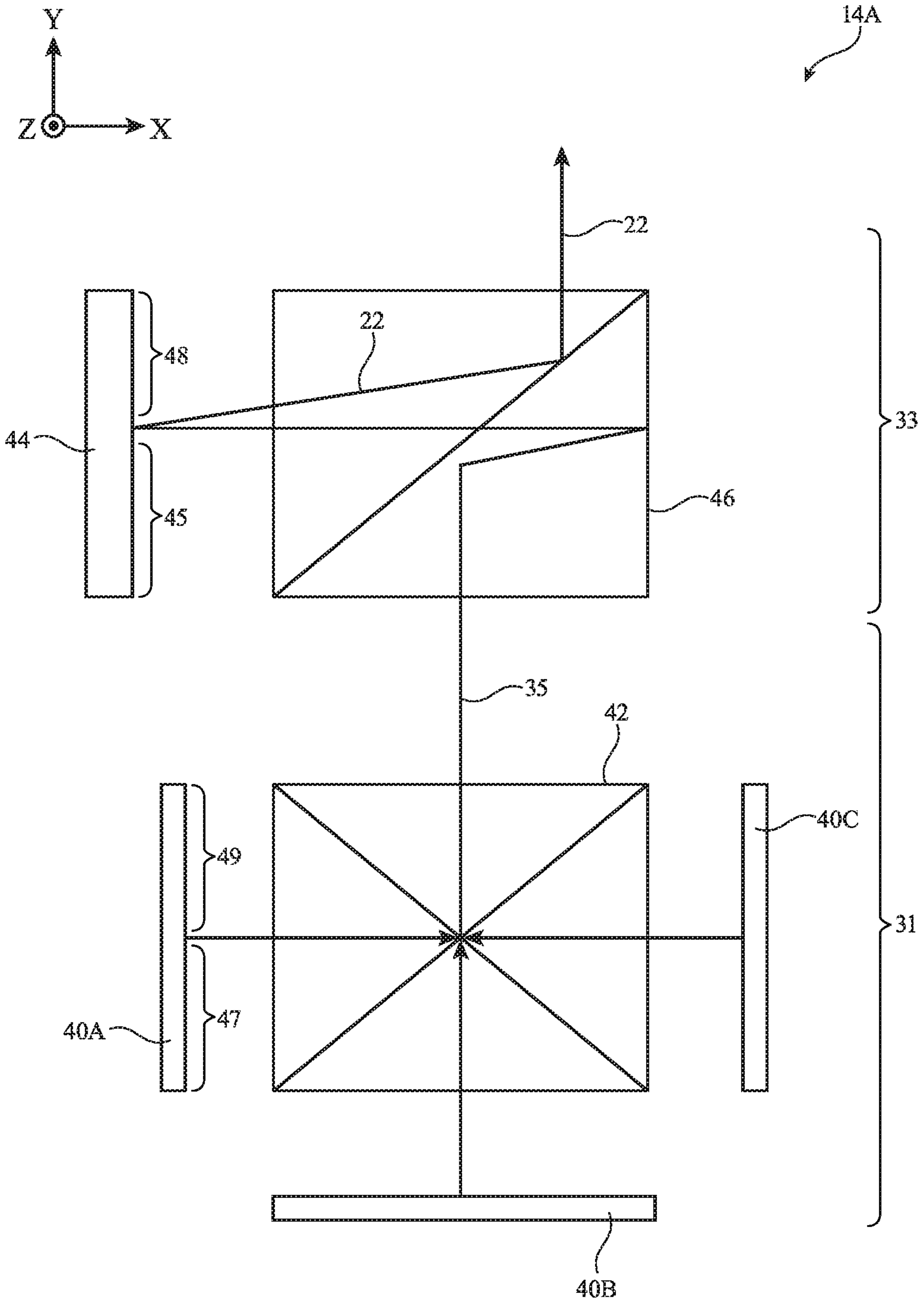
FIG. 2 is a top view of an illustrative display module having an illumination engine and a reflective display panel in accordance with some embodiments.

FIG. 2 is a top view of display module 14A with a spatial light modulator 33 and illumination engine 31. In the example of FIG. 2, spatial light modulator 33 is a reflective spatial light modulator. As shown in FIG. 2, illumination engine 31 may include light sources arranged in one or more arrays 40 (sometimes referred to herein as arrays of light sources 40) such as a first array 40A, a second array 40B, and a third array 40C. The light sources in arrays 40 may include any desired light sources (emitters). An example in which the light sources in arrays 40 are light-emitting diodes (LEDs) is described herein as an example. The LEDs may, if desired, include OLEDs, μLEDs, mini LEDs, and/or any other desired light emitting diodes.

Arrays 40A, 40B, and 40C may each emit illumination light 35 of a corresponding wavelength range (e.g., color). For example, array 40A may emit red light, array 40B may emit green light, and array 40C may emit blue light. Prism 42 (sometimes referred to as an optical combiner) may combine the light emitted by arrays 40A, 40B, and 40C into illumination light 35 (e.g., illumination light 35 may include red, green, and blue light, etc.) and may provide illumination light 35 to spatial light modulator 33. Time multiplexing may also be used to provide red, green, and blue illumination light 35 to spatial light modulator 33. Lenses or other optical components may be interposed between arrays 40A, 40B, and/or 40C and prism 42 and/or between prism 42 and spatial light modulator 33.

Spatial light modulator 33 may include prism 46 and a reflective display panel such as display panel 44. Display panel 44 may include a DMD panel, an LCOS panel, or other reflective display panel. Prism 46 may direct illumination light 35 to display panel 44 (e.g., to different pixels on display panel 44). Control circuitry 16 (FIG. 1) controls display panel 44 to selectively reflect illumination light 35 at each pixel location to produce image light 22 (e.g., image light having an image as modulated onto the illumination light by display panel 44). Prism 46 may direct image light 22 to collimating optics of the optical system. The example of FIG. 2 is merely illustrative. Illumination engine 31 may include any desired light sources arranged in any desired manner for providing illumination light 35 of any desired wavelengths to spatial light modulator 33. Illumination engine 31 may only include one or two of arrays 40A, 40B, and 40C or more than three arrays 40 if desired.

If desired, the light sources (e.g., LEDs) in arrays 40A, 40B, and 40C may be independently adjusted (e.g., by control circuitry 16 of FIG. 1) to adjust the spatial distribution of illumination light 35 on reflective display panel 44. Consider an example where region 48 of display 44 is configured to be dark (i.e., dim, off, close to minimum brightness, etc.) and region 45 of display 44 is configured to be bright (i.e., close to maximum brightness). If the light sources in array 40A were controlled in unison, the light sources would need to be close to maximum brightness to meet the brightness demands of region 45 of display 44. However, because the light sources are independently adjustable, the light sources in portion 49 of array 40A (corresponding to dim region 48 of display 44) may be turned off or to a low brightness level while the light sources in portion 47 of array 40A (corresponding to bright region 45 of display 44) may be turned on to a maximum or near-maximum brightness level.

In this way, control circuitry 16 may independently control the intensity, the emission duration, and/or duty cycles of light sources in arrays 40A, 40B, and 40C to control the brightness of illumination light 35 at different regions of display panel 44. For example, control circuitry 16 may independently control the intensity of the light sources in array portion 49 to control the amount of illumination light 35 provided to the pixels in region 48 of display panel 44. Similarly, control circuitry 16 may independently control the intensity, the emission duration, and/or duty cycles of the light sources in array portion 47 to control the amount of illumination light 35 provided to the pixels in region 45 of display panel 44. In this way, the brightness of different regions in the images of image light 22 may be independently controlled.

Including independently adjustable light sources in each array of illumination engine 31 may, for example, conserve power in display module 14A and provide a high quality image with enhanced dynamic range and contrast with locally-dimmed regions.

In general, each array may have any desired number of independently controllable light sources (e.g., every light source in each array may be independently controlled or groups of light sources in each array may be independently controlled). Arrays 40A, 40B, and 40C may be independently controlled (e.g., in addition to independently controlling different light sources within the arrays). In this way, display module 14A may perform local dimming of illumination light 35 and thus the images in image light 22 for any desired number of regions in the image, for regions of any desired size (e.g., for regions as small as one pixel), and in any desired color channels. This flexibility may serve to optimize the appearance of the images in image light 22 regardless of the contents of the images, while also optimizing consumption of resources in display module 14A, for example.

Figure 3:
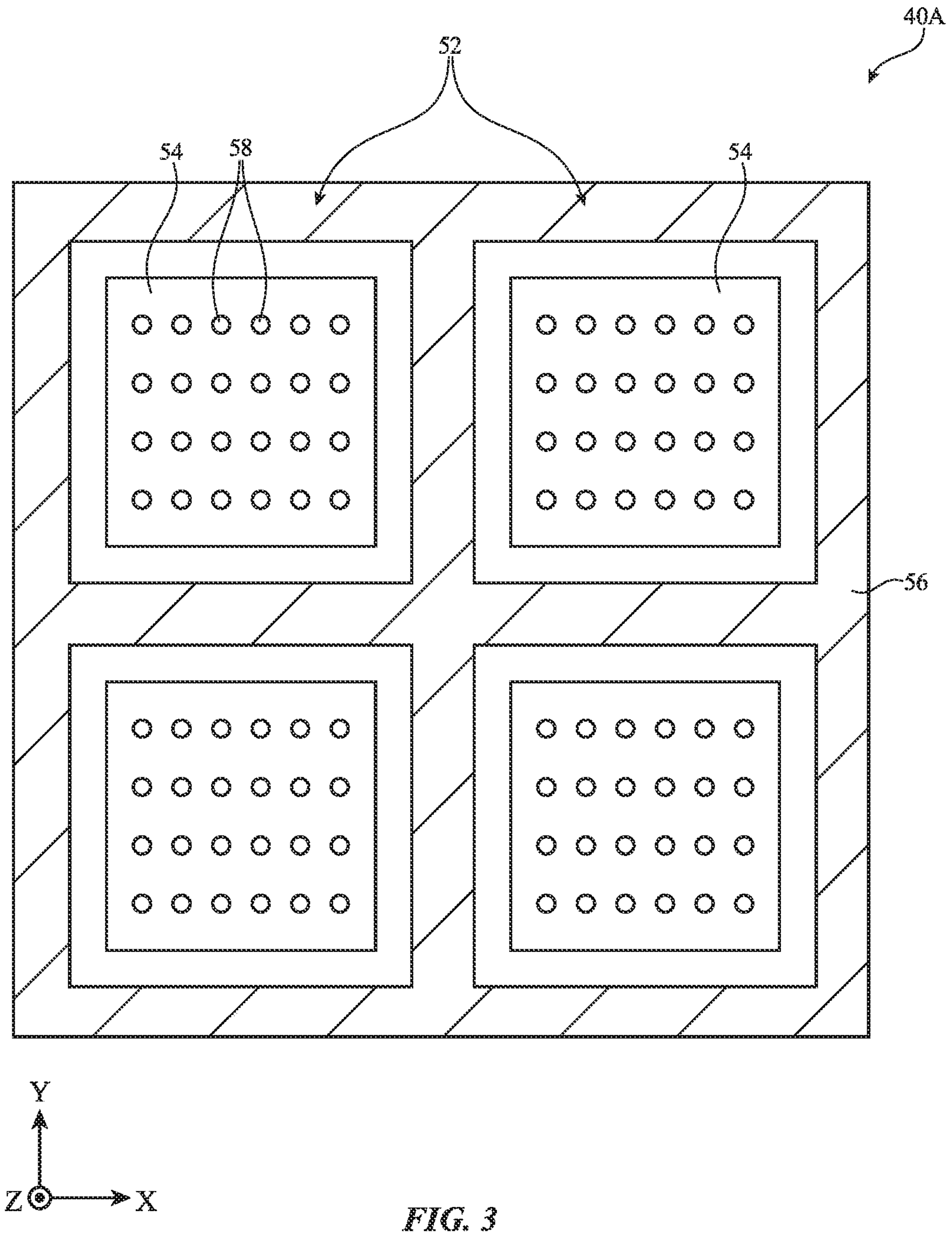
FIG. 3 is a top view of an illustrative light-emitting diode array with a common cathode formed in a grid in accordance with some embodiments.

FIG. 3 is a top view of an illustrative array of light-emitting diodes on a substrate. The array of light-emitting diodes may be, for example, array 40A, array 40B, or array 40C in FIG. 2. In the example herein the array will be referred to as array 40A.

As shown in FIG. 3, array 40A includes a plurality of light-emitting diodes 52. Each light-emitting diode may include a first electrode 54 (sometimes referred to as per-pixel electrode 54, pixel electrode 54, anode 54, etc.). The array also includes a common electrode 56 (sometimes referred to as cathode 56) that is shared between all of the light-emitting diodes in array 40A. Common electrode 56 is formed in a grid that defines a plurality of openings. Each opening overlaps a respective light-emitting diode and corresponding pixel electrode 54. The pixel electrodes 54 may contact a corresponding light-emitting diode through a plurality of vias 58. In the example of FIG. 3, there is a grid of vias 58 (e.g., four rows and six columns of vias for each light-emitting diode).

In the example of FIG. 3, the common electrode is the cathode for the light-emitting diodes and each per-pixel electrode serves as an anode for the light-emitting diodes. This example is merely illustrative and the inverse arrangement may be used if desired. In other words, the common electrode may be the anode for the light-emitting diodes and each per-pixel electrode may serve as a cathode for the light-emitting diodes. In general, in any of the embodiments herein the cathode and anode may be flipped if desired. However, the example will be described herein of a common cathode and per-pixel anodes.

Without the common electrode of FIG. 3, each light-emitting diode may require first and second vias (one for the anode and one for the cathode) at its upper surface. This may undesirably result in visible dark spots at the position of the vias. There may also be undesirable dark spots between light-emitting diodes in the array. In contrast, in the arrangement of FIG. 3, including multiple, smaller vias mitigates visible dark spots within each light-emitting diode. Additionally, the common electrode 56 may be formed from a reflective material that mitigates dark spots between the light-emitting diodes.

Figure 4:
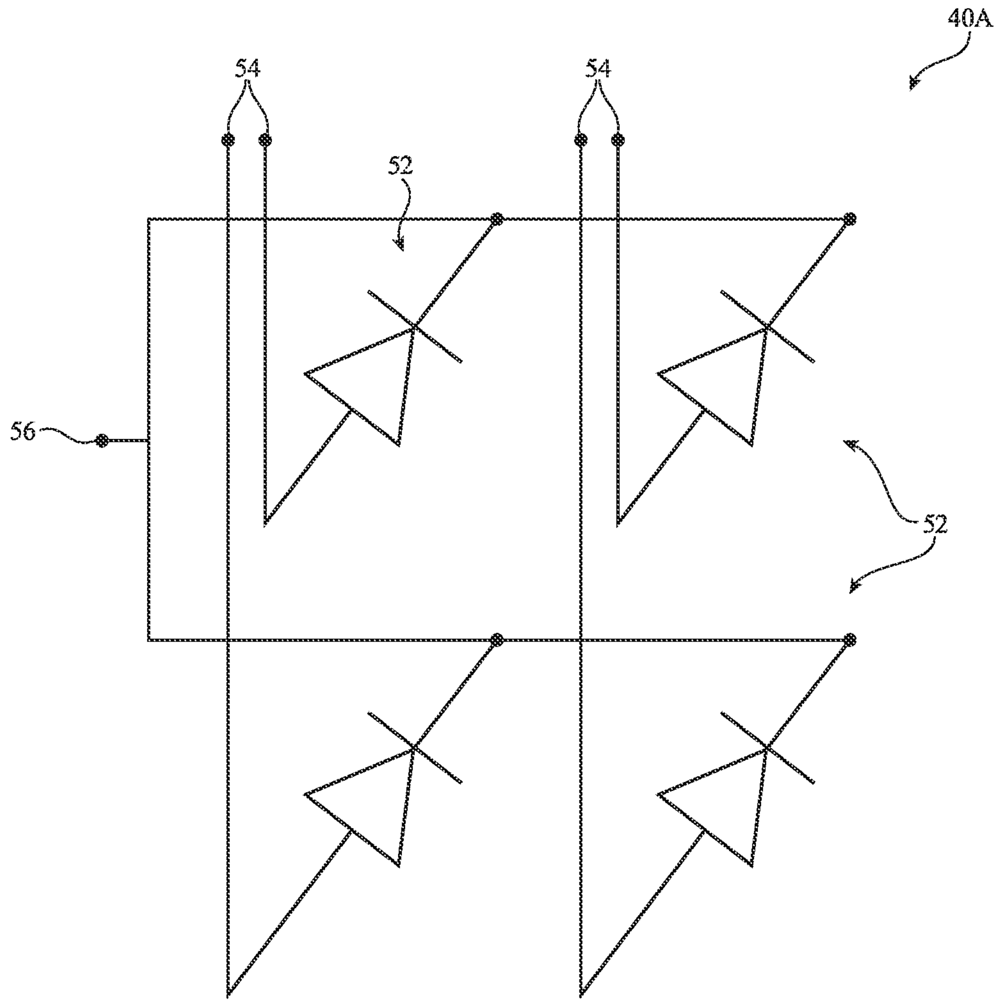
FIG. 4 is a circuit diagram of an illustrative light-emitting diode array with a common cathode in accordance with some embodiments.

FIG. 4 is a circuit diagram of an illustrative light-emitting diode array of the type shown in FIG. 3. As shown, the cathode terminal of each light-emitting diode 52 is electrically connected to a common cathode electrode 56. In contrast, the anode terminal of each light-emitting diode 52 is electrically connected to a respective anode electrode 54.

Figure 5:
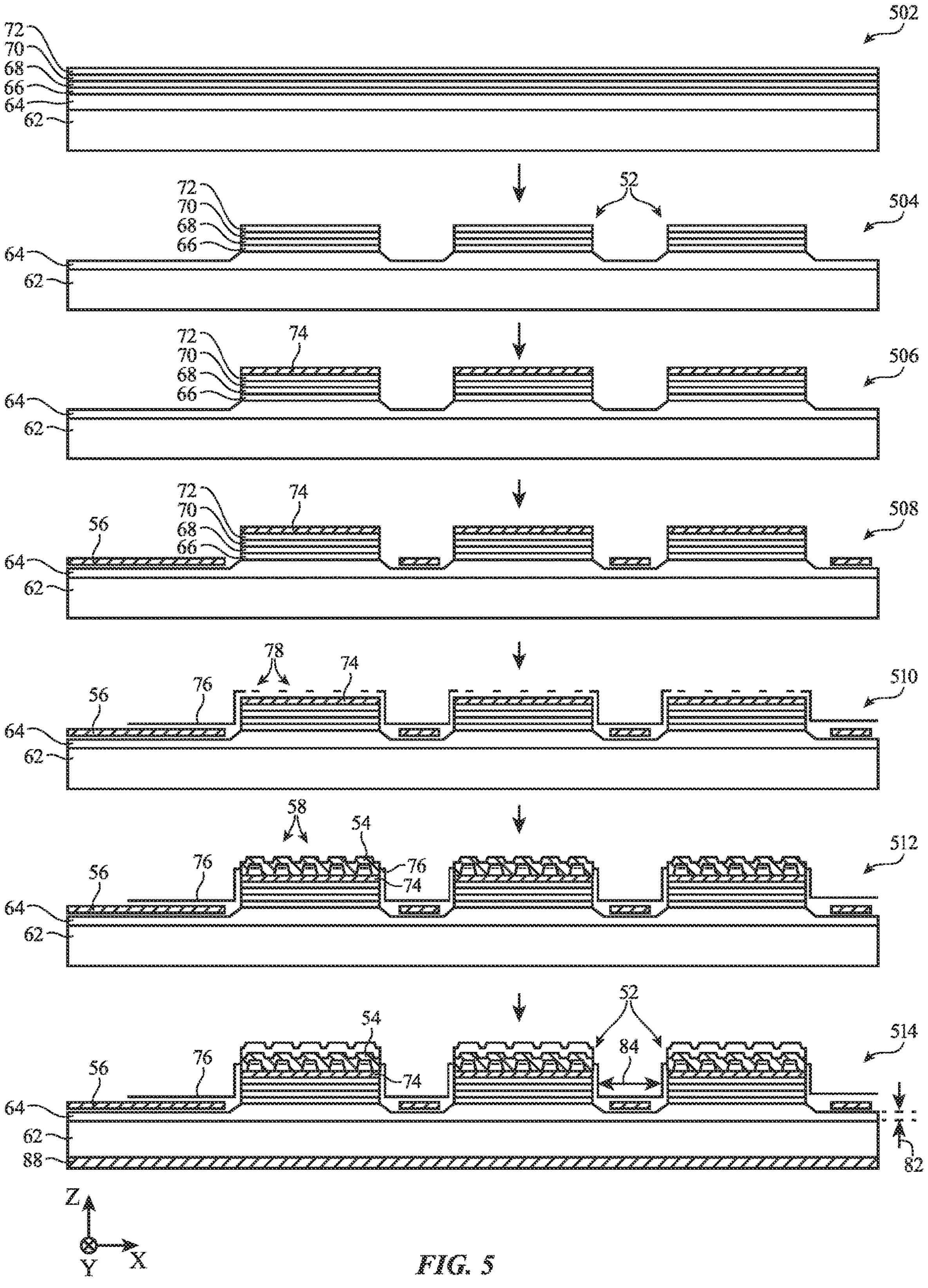
FIG. 5 is a cross-sectional side view of illustrative method steps for forming a light-emitting diode array with a common cathode formed in a grid in accordance with some embodiments.

FIG. 5 is a cross-sectional side view of an illustrative method for forming a light-emitting diode array of the type shown in FIGS. 3 and 4. First, at step 502, epitaxial layers may be grown on a substrate 62. Substrate 62 for the LEDs may sometimes be referred to as LED substrate 62, substrate layer 62, dielectric substrate 62, layer 62, dielectric layer 62, carrier 62, carrier layer 62, dielectric carrier 62, dielectric carrier layer 62, epitaxial growth substrate 62, etc. LED substrate 62 may be formed from sapphire, gallium nitride (GaN), gallium arsenic (GaAs), silicon, or any other desired semiconductor and dielectric materials. In one illustrative example, the LED substrate may be formed from sapphire for blue and green LEDs and may be formed from gallium arsenic for red LEDs.

Semiconductor layers may be formed on the LED substrate. At step 502, one or more n-type semiconductor layer(s) 64 is formed on LED substrate 62. The n-type semiconductor layer(s) may include materials such as n-type doped gallium nitride (GaN), n-type aluminum gallium indium phosphide (AlGaInP), etc. The n-type semiconductor layer(s) 64 may be an epitaxial layer (e.g., formed using epitaxy-type crystal growth/material deposition). N-type semiconductor layer(s) 64 may sometimes be referred to herein as n-type epitaxial layer(s) 64, n-type layer(s) 64, etc.

N-type semiconductor layer(s) 64 may ultimately serve as the common cathode for the LEDs in array 40. The LED also includes one or more p-type semiconductor layer(s) such as layers 70 and 72 that ultimately serve as anodes for the LEDs in array 40. Layer 70 may be a p-type doped gallium nitride (GaN) layer that serves as an electron-blocking layer for the light-emitting diodes. Layer 72 may be a p-type doped gallium nitride with a higher concentration of p-type dopant than layer 70 (e.g., a p++ GaN layer). These examples of materials for layers 70 and 72 are merely illustrative and in general the one or more p-type semiconductor layer(s) may be formed from any desired material. The p-type semiconductor layer(s) 70 and 72 may be epitaxial layers (e.g., formed using epitaxy-type crystal growth/material deposition). P-type semiconductor layer(s) 70 and 72 may sometimes be referred to herein as p-type epitaxial layer(s) 70 and 72, p-type layer(s) 70 and 72, etc.

Superlattice layer 66 and multi-quantum wells (MQW) such as MQW 68 may be formed at the interface between p-type layers 70 and 72 and n-type layer 64. MQW 68 ultimately forms the active light emitting area of LEDs 52. The MQW layer may include gallium nitride (GaN), gallium indium nitride (GaInN), aluminum gallium indium phosphide (AlGaInP), or any other desired materials. Multi-quantum wells 68 may sometimes be referred to as multi-quantum wells layer 68.

After forming the epitaxial layers at step 502, the epitaxial layers may be at least partially etched at step 504. In FIG. 5, layers 66, 68, 70 and 72 are completely removed in regions between adjacent light-emitting diodes 52 (and at the periphery of the array). Layer 64 is partially removed in regions between adjacent light-emitting diodes 52 (and at the periphery of the array). The etching of step 504 may sometimes be referred to as mesa development. The mesa development divides the epitaxial layers into discrete light-emitting diodes with a common n-type semiconductor layer 64.

At step 506, a conductive contact 74 is formed (e.g., deposited) over each light-emitting diode 52. The conductive contacts may be formed from a transparent material such as indium tin oxide (ITO).

Next, at step 508, conductive layer 56 (sometimes referred to as cathode 56) is formed in a grid across array 40. As shown in the top view of FIG. 3, conductive layer 56 forms a grid that defines a respective opening for each light-emitting diode 52. To improve the efficiency of the array, conductive layer 56 may be formed from a reflective metal. Conductive layer 56 may have a reflectance of greater than 70%, greater than 80%, greater than 90%, greater than 95%, etc. The high reflectance of conductive layer 56 may mitigate dark lines between light-emitting diodes 52 during operation of the array. Conductive layer 56 may be formed from any desired material (e.g., aluminum, silver, gold, etc.). Conductive layer 56 is formed on and in direct contact with n-type semiconductor layer 64. Conductive layer 56 therefore serves as a cathode contact that provides a common cathode voltage to the n-type semiconductor layer 64 for all of the light-emitting diodes 52. Conductive layer 56 and n-type semiconductor layer 64 may sometimes collectively be referred to as the cathode for the light-emitting diodes 52.

At step 510, one or more insulating layers 76 are formed (e.g., deposited and/or patterned) over the light-emitting diodes and conductive layer 56 between the light-emitting diodes. The one or more insulating layers 76 may include a passivation layer and a distributed Bragg reflector (DBR), as one example. The distributed Bragg reflector may reflect light at the wavelength emitted by the LEDs to improve the efficiency of the LEDs. The insulating layers 76 include a plurality of openings 78 over each conductive layer 74. Additionally, the insulating layers leave a portion of conductive layer 56 exposed for subsequent electrical contact.

At step 512, conductive layers 54 are formed over each light-emitting diode. Each conductive layer 54 overlaps a respective light-emitting diode and is electrically connected to a respective conductive layer 74 through a plurality of vias 58 (e.g., as shown in FIG. 3). Each via 58 may be formed through a respective opening 78 in insulating layer(s) 76. Conductive layers 54 therefore serve as anode contacts that provides an anode voltage to a respective conductive layer 74 and p-type semiconductor layer 72 for each respective light-emitting diode 52. Conductive layer 54, conductive layer 74, and p-type semiconductor layer 72 may sometimes collectively be referred to as the anode for the light-emitting diodes 52. In the arrangement of FIG. 5, including multiple, smaller vias 58 mitigates visible dark spots within each light-emitting diode.

Finally, at step 514, a bond pad 80 is formed over each conductive layer 54. Each bond pad may conform to a respective conductive layer 54 for a respective light-emitting diode 52. In FIG. 5, LEDs 52 emit light in the negative Z-direction through substrate 62. Also at step 514, a diffuser 88 may optionally be formed on substrate 62 such that light from the LEDs passes through diffuser 88 during operation of the LED array. Diffuser 88 may be formed from surface texture on substrate 62 (e.g., via etching with random or regular patterns), a surface or volume diffuser that is attached to substrate 62 with optically clear adhesive, or a surface or volume diffuser that is separated from substrate 62 by an air gap. The diffuser may help homogenize emission uniformity from array 40A. In some cases, substrate 62 may be removed at step 514 (e.g., a lift-off epitaxial substrate). In this case, diffuser 88 may be formed directly on n-type semiconductor layer 64. Diffuser 88 may be formed from surface texture on n-type semiconductor layer 64 (e.g., via etching with random or regular patterns), a surface or volume diffuser that is attached to n-type semiconductor layer 64 with optically clear adhesive, or a surface or volume diffuser that is separated from n-type semiconductor layer 64 by an air gap.

To improve the efficiency of the array, conductive layers 54 may be formed from a reflective metal. Each conductive layer 54 may have a reflectance of greater than 70%, greater than 80%, greater than 90%, greater than 95%, etc. The high reflectance of conductive layer 54 may improve efficiency in the light-emitting diodes. Alternatively, conductive layers 54 may be formed from transparent metal (if LED light is intended to be emitted in the direction of the conductive layers). Conductive layers 54 may be formed from any desired material (e.g., aluminum, silver, gold, etc.).

In FIG. 5, n-type semiconductor layer 64 has a thickness 82 between the light-emitting diodes (e.g., under conductive layer 56). In FIG. 5, this is a non-zero thickness.

Thickness 82 may be greater than 0.01 micron, greater than 0.1 micron, greater than 0.5 microns, greater than 1 micron, greater than 2 microns, greater than 5 microns, less than 0.1 micron, less than 0.5 microns, less than 1 micron, less than 2 microns, less than 5 microns, etc. In some cases, n-type semiconductor layer 64 may be totally removed between the light-emitting diodes. In other words, thickness 82 may be zero if desired.

The gap 84 between the light-emitting diodes (sometimes referred to as the mesa-to-mesa distance) may be greater than 1 micron, greater than 2 microns, greater than 3 microns, greater than 5 microns, greater than 10 microns, less than 1 micron, less than 2 microns, less than 3 microns, less than 5 microns, less than 10 microns, etc.

In the arrangement of FIGS. 3 and 5, cathode 56 is formed in a grid between the light-emitting diodes in array 40A. This example is merely illustrative. In another possible arrangement, shown in FIG. 6, cathode 56 is formed around the periphery of the array but not between adjacent light-emitting diodes within the array.

Figure 6:
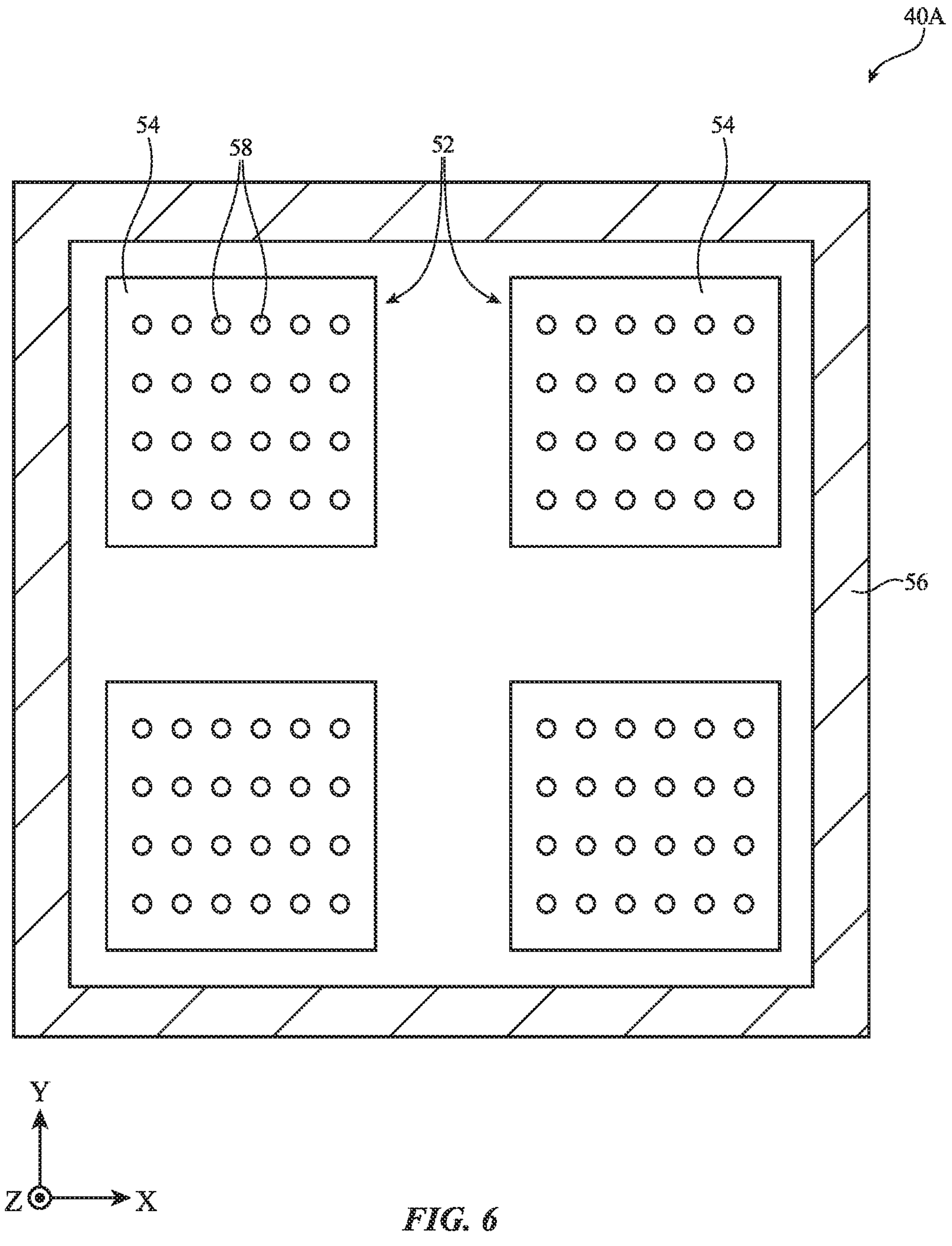
FIG. 6 is a top view of an illustrative light-emitting diode array with a common cathode formed around a periphery of the array in accordance with some embodiments.

As shown in FIG. 6, array 40A includes a plurality of light-emitting diodes 52. Each light-emitting diode may include a first electrode 54 (sometimes referred to as per-pixel electrode 54, pixel electrode 54, anode 54, etc.). The array also includes a common electrode 56 (sometimes referred to as cathode 56) that is shared between all of the light-emitting diodes in array 40A. Common electrode 56 is formed in a ring around the periphery of the array of light-emitting diodes. The pixel electrodes 54 may contact a corresponding light-emitting diode through a plurality of vias 58 (similar to as shown and discussed in connection with FIG. 3). The circuit diagram of the array of FIG. 6 is the same as previously shown in FIG. 4.

Figure 7:
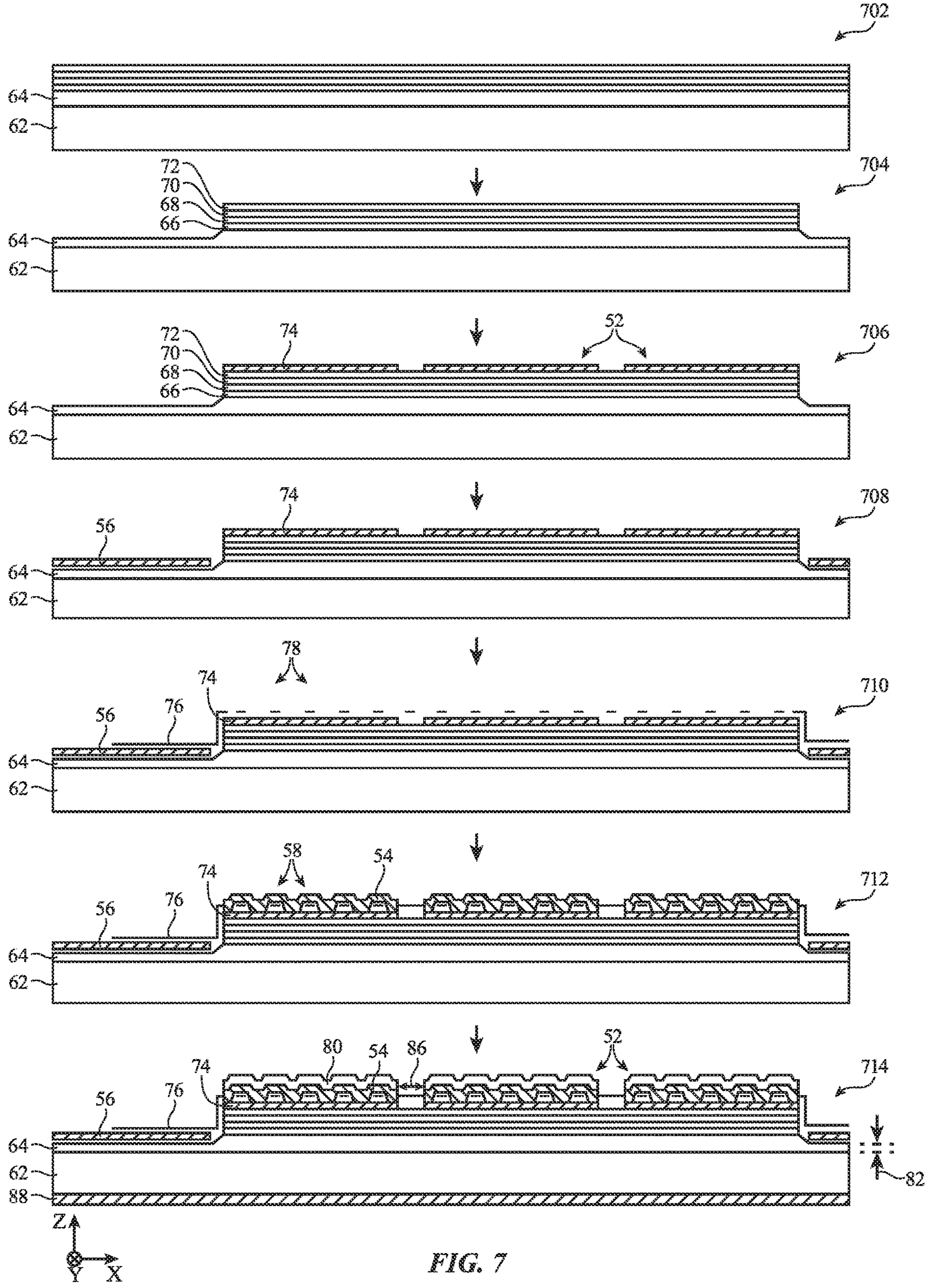
FIG. 7 is a cross-sectional side view of illustrative method steps for forming a light-emitting diode array with a common cathode formed around a periphery of the array in accordance with some embodiments.

FIG. 7 is a cross-sectional side view of an illustrative method for forming a light-emitting diode array of the type shown in FIGS. 4 and 6. Step 702 in FIG. 7 is the same as step 502 in FIG. 5, with one or more n-type semiconductor layer(s) 64, superlattice layer 66, multi-quantum wells (MQW) layer 68, and p-type semiconductor layers 70 and 72 formed on substrate 62. For brevity, the details of this step will not be repeated in connection with FIG. 7.

Next, at step 704, the epitaxial layers may be at least partially etched at step 704. In FIG. 7, layers 64, 66, 68, 70 and 72 are not removed in the active area of the light-emitting diode array. In other words, there is no removal of layers 64, 66, 68, 70 and 72 between adjacent light-emitting diodes within the array. Layer 64 is at least partially removed in the periphery of the array outside the active area of the array (e.g., in a ring around the array).

At step 706, a conductive contact 74 is formed (e.g., deposited) over each light-emitting diode 52. The conductive contacts may be formed from a transparent material such as indium tin oxide (ITO). In FIG. 7, the area of each light-emitting diode is defined by the patterning of conductive contacts 74. Each conductive contact 74 overlaps and defines a footprint for a respective light-emitting diode.

Next, at step 708, conductive layer 56 (sometimes referred to as cathode 56) is formed around the periphery of array 40. As shown in the top view of FIG. 6, conductive layer 56 forms a ring around the array of light-emitting diodes 52. To improve the efficiency of the array, conductive layer 56 may be formed from a reflective metal. Conductive layer 56 may have a reflectance of greater than 70%, greater than 80%, greater than 90%, greater than 95%, etc. Conductive layer 56 may be formed from any desired material (e.g., aluminum, silver, gold, etc.). Conductive layer 56 is formed on and in direct contact with n-type semiconductor layer 64. Conductive layer 56 therefore serves as a cathode contact that provides a common cathode voltage to the n-type semiconductor layer 64 for all of the light-emitting diodes 52. Conductive layer 56 and n-type semiconductor layer 64 may sometimes collectively be referred to as the cathode for the light-emitting diodes 52.

At step 710, one or more insulating layers 76 are formed (e.g., deposited and/or patterned) over the light-emitting diodes and conductive layer 56 between the light-emitting diodes. The one or more insulating layers 76 may include a passivation layer and a distributed Bragg reflector (DBR), as one example. The DBR may reflect the wavelength(s) of light emitted by LEDs 52 to improve the efficiency of the LEDs. The insulating layers 76 include a plurality of openings 78 over each conductive layer 74. Additionally, the insulating layers leave a portion of conductive layer 56 exposed for subsequent electrical contact.

At step 712, conductive layers 54 are formed over each light-emitting diode. Each conductive layer 54 overlaps a respective light-emitting diode and is electrically connected to a respective conductive layer 74 through a plurality of vias 58 (e.g., as shown in FIG. 6). Each via 58 may be formed through a respective opening 78 in insulating layer(s) 76. Conductive layers 54 therefore serve as anode contacts that provides an anode voltage to a respective conductive layer 74 and p-type semiconductor layer 72 for each respective light-emitting diode 52. Conductive layer 54, conductive layer 74, and p-type semiconductor layer 72 may sometimes collectively be referred to as the anode for the light-emitting diodes 52. In the arrangement of FIG. 7, including multiple, smaller vias 58 mitigates visible dark spots within each light-emitting diode.

Finally, at step 714, a bond pad 80 is be formed over each conductive layer 54. Each bond pad may conform to a respective conductive layer 54 for a respective light-emitting diode 52. In FIG. 7, LEDs 52 emit light in the negative Z-direction through substrate 62. Also at step 714, a diffuser 88 may optionally be formed on substrate 62 such that light from the LEDs passes through diffuser 88 during operation of the LED array. Diffuser 88 may be formed from surface texture on substrate 62 (e.g., via etching with random or regular patterns), a surface or volume diffuser that is attached to substrate 62 with optically clear adhesive, or a surface or volume diffuser that is separated from substrate 62 by an air gap. The diffuser may help homogenize emission uniformity from array 40A. In some cases, substrate 62 may be removed at step 714 (e.g., a lift-off epitaxial substrate). In this case, diffuser 88 may be formed directly on n-type semiconductor layer 64. Diffuser 88 may be formed from surface texture on n-type semiconductor layer 64 (e.g., via etching with random or regular patterns), a surface or volume diffuser that is attached to n-type semiconductor layer 64 with optically clear adhesive, or a surface or volume diffuser that is separated from n-type semiconductor layer 64 by an air gap.

To improve the efficiency of the array, conductive layers 54 in FIG. 7 may be formed from a reflective metal. Each conductive layer 54 may have a reflectance of greater than 70%, greater than 80%, greater than 90%, greater than 95%, etc. The high reflectance of conductive layer 54 may improve efficiency in the light-emitting diodes. Alternatively, conductive layers 54 may be formed from transparent metal (if LED light is intended to be emitted in the direction of the conductive layers). Conductive layers 54 may be formed from any desired material (e.g., aluminum, silver, gold, etc.).

In FIG. 7, n-type semiconductor layer 64 has a thickness 82 between the light-emitting diodes (e.g., under conductive layer 56). In FIG. 7, this is a non-zero thickness. Thickness 82 may be greater than 0.01 micron, greater than 0.1 micron, greater than 0.5 microns, greater than 1 micron, greater than 2 microns, greater than 5 microns, less than 0.1 micron, less than 0.5 microns, less than 1 micron, less than 2 microns, less than 5 microns, etc. In some cases, n-type semiconductor layer 64 may be totally removed under cathode 56. In other words, thickness 82 may be zero if desired.

The gap 86 between the light-emitting diodes in FIG. 7 is defined as the distance between adjacent conductive contacts 74. The magnitude of gap 86 may be greater than 1 micron, greater than 2 microns, greater than 3 microns, greater than 5 microns, greater than 10 microns, less than 1 micron, less than 2 microns, less than 3 microns, less than 5 microns, less than 10 microns, etc. Weak emission of light may occur from between the light-emitting diodes (e.g., in each gap 86) due to the lateral conductivity of the light-emitting diode layers.

Figure 8A:
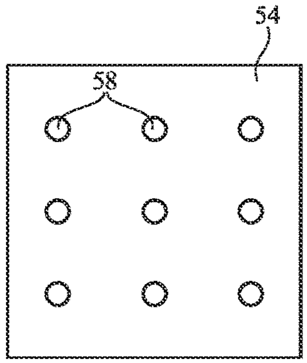
FIGS. 8A-8G are top views of an illustrative light-emitting diode showing various arrangements for one or more vias in accordance with some embodiments.
Figure 8B:
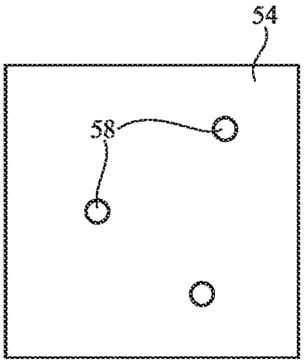
Figure 8C:
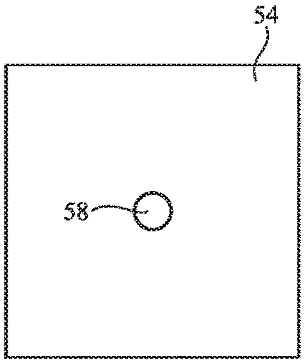

In the examples of FIGS. 3 and 6, each light-emitting diode has an array of vias 58 with four rows and six columns. This example is merely illustrative. In general, the vias 58 (between conductive layer 74 and anode 54, as shown in FIGS. 5 and 7) may have any desired shapes and arrangement. As shown in FIG. 8A, the vias may be arranged in a regularly spaced grid with m rows and n columns (e.g., an m×n grid). The magnitude of n may be equal to the magnitude of m (e.g., in FIG. 8A with a 3×3 grid) or the magnitude of n may not be equal to the magnitude of m (e.g., in FIG. 3 with a 4×6 grid). The vias may not necessarily have regularly spaced rows and columns, as shown in FIG. 8B with three vias in a triangular pattern. In other possible arrangements, only a single via may be included. FIG. 8C shows an example where a single circular via is included. The example in FIGS. 8A-8C of the vias having circular footprints is merely illustrative. In general, the vias may have footprints of any desired shape.

Figure 8D:
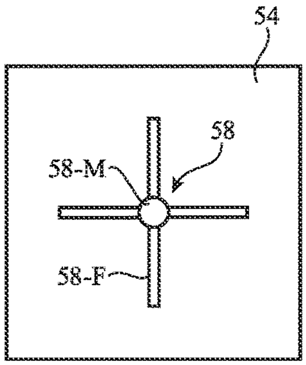
Figure 8E:
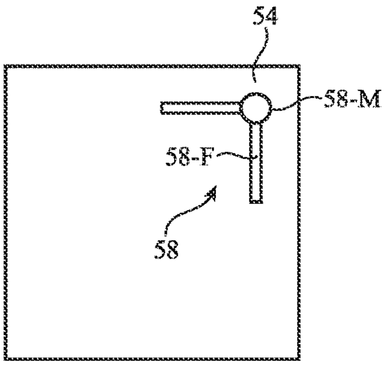

In other examples, shown in FIGS. 8D-8G, the vias may have irregular footprints. As shown in FIG. 8D, a single via 58 may be included that has a main portion 58-M and one or more finger portions 58-F. In FIG. 8D, the main portion 58-M is a circular via portion in a central portion of via 58. Finger portions 58-F extend radially outwards away from the main portion 58-M. Finger portions 58-F may help spread the light-emitting diode current across a wider area of light-emitting diode 52 during operation of the LED array. The via may have any desired number of finger portions (e.g., one, two, three, four, more than four, etc.). In FIG. 8D, main via portion 58 is in the center of anode 54. This example is merely illustrative. In another possible arrangement (shown in FIG. 8E), main via portion 58-M is in a corner portion of anode 54.

Figure 8F:
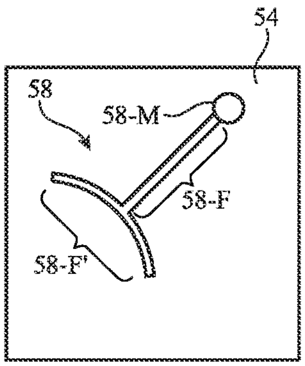
Figure 8G:
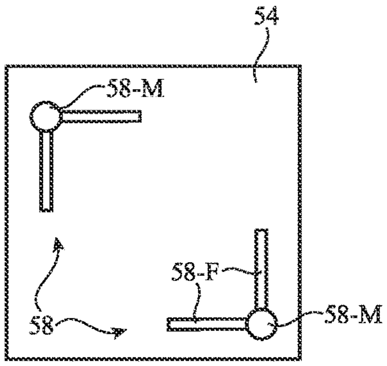

In another possible arrangement, shown in FIG. 8F, the via may include a first finger portion 58-F and a second finger portion 58-F' that extends from the first finger portion and has at least one portion that is orthogonal to the second finger portion 58-F. The second finger portion 58-F' may be curved (as in FIG. 8F) or linear. Multiple vias with finger portions may be included in a single light-emitting diode, as shown in FIG. 8G (with two vias having the structure of FIG. 8E).

Each via for a given light-emitting diode may have the same footprint or different vias for a given light-emitting diode may have different footprints. To prevent the vias from creating dark spots in the light-emitting diodes, each portion of each via (e.g., in FIGS. 8A-8G) may have a minimum dimension that is less than 5 microns, less than 3 microns, less than 2 microns, less than 1 micron, less than 0.5 microns, less than 0.1 microns, etc. For example, the circular vias in FIG. 8A may each have a diameter that is less than 5 microns, less than 3 microns, less than 2 microns, less than 1 micron, less than 0.5 microns, less than 0.1 microns, etc. In FIG. 8D, the main via portion 58-M may have a diameter that is less than 5 microns, less than 3 microns, less than 2 microns, less than 1 micron, less than 0.5 microns, less than 0.1 microns, etc. Each finger portion 58-F in FIG. 8D has a width that is less than 5 microns, less than 3 microns, less than 2 microns, less than 1 micron, less than 0.5 microns, less than 0.1 microns, etc.

Figure 9A:
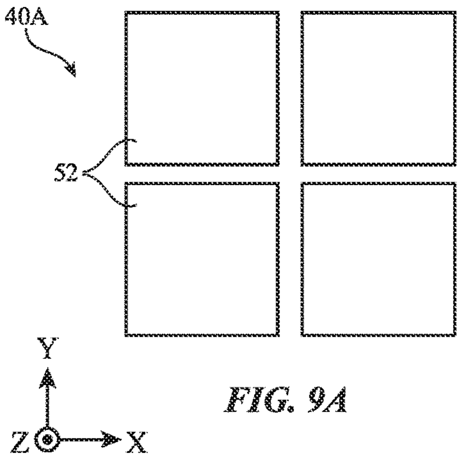
FIGS. 9A-9G are top views of illustrative light-emitting diode arrays showing various layouts for the arrays in accordance with some embodiments.

In the example of FIGS. 3 and 6, array 40A has an array of square light-emitting diodes with two rows and two columns. As shown in FIG. 9A, the light-emitting diodes may have square footprints and may be arranged in a regularly spaced grid with m rows and n columns (e.g., an m×n grid). The magnitude of n may be equal to the magnitude of m (e.g., in FIG. 9A with a 2×2 grid) or the magnitude of n may not be equal to the magnitude of m (e.g., a 3×2 or 2×3 grid).

Figure 9B:
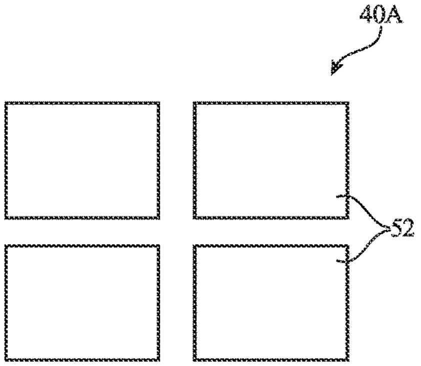

Alternatively, the array of light-emitting diodes may include light-emitting diodes having non-square rectangular footprints. As shown in FIG. 9B, the non-square rectangular light-emitting diodes may be arranged in a regularly spaced grid with m rows and n columns (e.g., an m×n grid). The magnitude of n may be equal to the magnitude of m (e.g., in FIG. 9B with a 2×2 grid) or the magnitude of n may not be equal to the magnitude of m (e.g., a 3×2 or 2×3 grid).

Figure 9C:
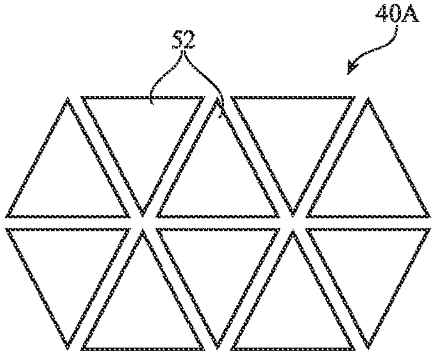
Figure 9D:
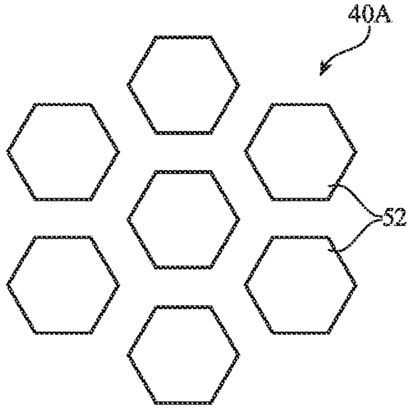

The example of footprint shapes for the light-emitting diodes in FIGS. 9A and 9B are merely illustrative. The light-emitting diodes may have footprints with other desired shapes such as triangular (as in FIG. 9C) or hexagonal (as in FIG. 9D).

Figure 9E:
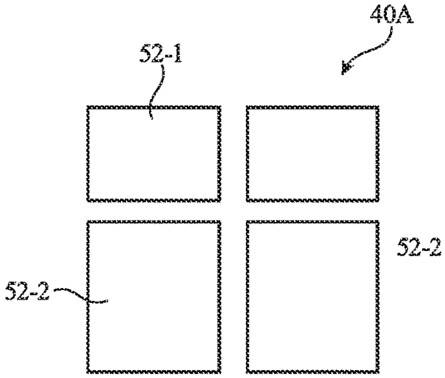

Different light-emitting diodes in the same array may have different shapes. For example, as shown in FIG. 9E, first light-emitting diodes 52-1 may have a first shape whereas second light-emitting diodes 52-2 have a second shape that is different than the first shape. In FIG. 9E, light-emitting diodes 52-2 have a different aspect ratio (ratio of length to width) than light-emitting diodes 52-1.

Figure 9F:
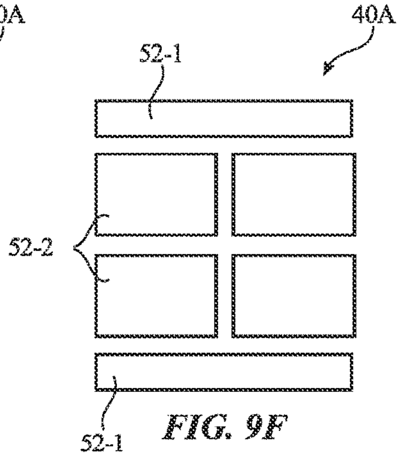
Figure 9G:
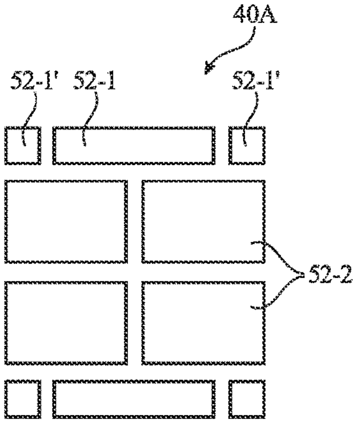

In one possible arrangement, shown in FIG. 9F, a grid of light-emitting diodes 52-2 is surrounded on either side by a single rectangular light-emitting diode 52-1. In other words, the width of each LED 52-1 is more than 2× greater than the width of each LED 52-2. However, the height of each LED 52-2 may be at least 2× greater than the height of each 52-1. FIG. 9G shows a similar arrangement as FIG. 9F, except LED 52-1 is split into a main rectangular LED 52-1 surrounded on either side by smaller LEDs 52-1'.

In general, each light-emitting diode array may include any number of light-emitting diodes (e.g., at least two, at least four, at least six, at least ten, at least twenty, at least thirty, at least fifty, at least one hundred, etc.). Each light-emitting diode may have any desired footprint (e.g., a square footprint, non-square rectangular footprint, triangular footprint, hexagonal footprint etc.). The light-emitting diodes may be regularly spaced (e.g., in a grid of rows and columns) or may be irregularly spaced. The layout of the light-emitting diodes in the array may be tailored for the specific application of the array and/or to optimize manufacturing and assembly of the array.

Figure 10:
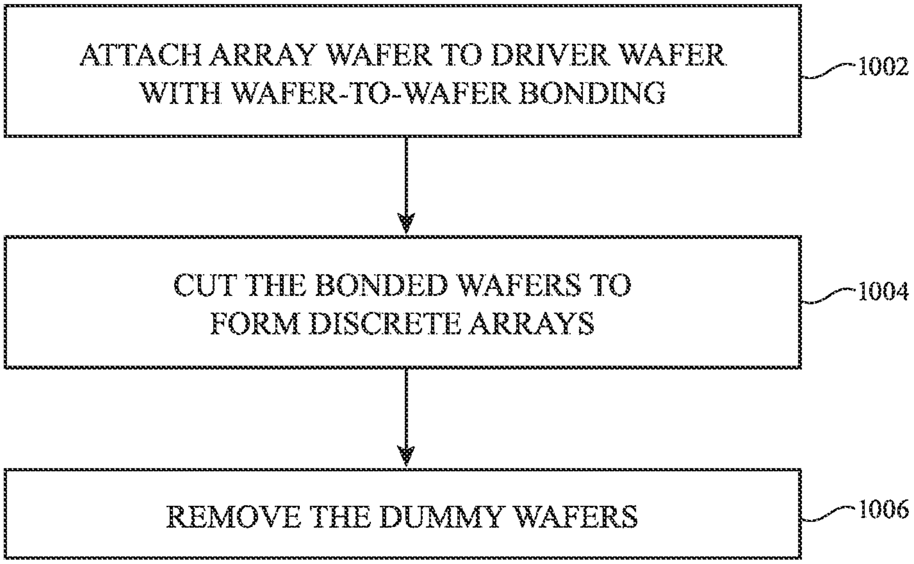
FIG. 10 is a flowchart of illustrative method steps for forming a light-emitting diode array using wafer-to-wafer bonding in accordance with some embodiments.

To integrate the light-emitting diode array into a larger module/device, the light-emitting diode array (e.g., formed in FIG. 5 or FIG. 7) may be bonded to a substrate with driver circuitry. FIG. 10 is a flowchart of illustrative method steps for attaching the light-emitting diodes to driving circuitry. At step 1002, the light-emitting diodes for at least one array (and optionally multiple arrays) may be attached to an array wafer (sometimes referred to as a dummy wafer). Similarly, a substrate with driving circuitry (sometimes referred to as a driver or driver substrate) for at least one array (and optionally multiple arrays) may be attached to a driver wafer (sometimes referred to as a dummy wafer). At step 1002, the array wafer and the driver wafer may be attached using wafer-to-wafer bonding. In other words, driving circuitry in the substrate is mechanically and electrically attached to the light-emitting diodes (e.g., using solder, copper pillars, etc.).

After the wafer-to-wafer bonding of step 1002, the bonded wafers may be cut to form discrete arrays (i.e., singulation) at step 1004. Finally, at step 1006, the dummy wafers (e.g., the array wafer attached to the light-emitting diodes and the driver wafer attached to the driving circuitry) may optionally be removed. An example of an array formed using the process of FIG. 10 is shown in FIG. 11.

Figure 11:
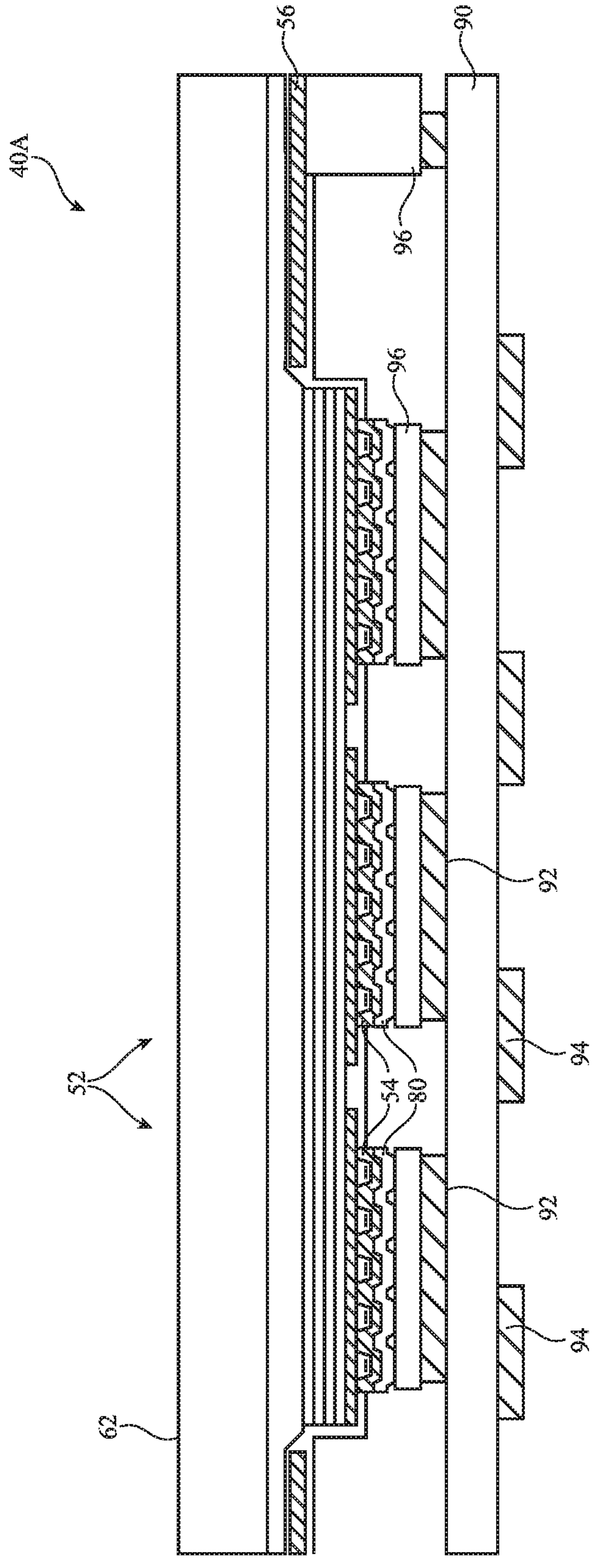
FIG. 11 is a cross-sectional side view of an illustrative light-emitting diode array formed using the steps of FIG. 10 in accordance with some embodiments.

FIG. 11 is a cross-sectional side view of array 40A with light-emitting diodes 52 bonded to a driver substrate. In FIG. 11, the light-emitting diodes have the arrangement of FIG. 7. However, the light-emitting diodes may instead have the arrangement of FIG. 5 if desired. The light-emitting diodes are mechanically and electrically connected to a substrate 90. Substrate 90 may include driving circuitry that controls the light-emitting diodes 52. In some cases, a common electrode for array 40A is realized using the trace layout design on driver substrate 90. Substrate 90 has bond pads 92 on a first surface that are configured to bond to the bond pads 80 of the light-emitting diodes. Substrate 90 also has bond pads 94 on a second surface that is opposing to the first surface. Bond pads 94 may be used for subsequent bonding of array 40A to a larger system such as electronic device 10 in FIG. 1. For example, bond pads 94 may be bonded to a printed circuit board or a flexible printed circuit in device 10. As shown in FIG. 11, a conductive material 96 may be included to bond the bond pads 92 to bond pads 80 for the light-emitting diodes. A bond pad may optionally be included between cathode 56 and conductive material 96.

In some cases, conductive material 96 may be formed from copper. During the wafer-to-wafer bonding of step 1002, copper pillars may be formed on bond pads 92 on driver substrate 90. Surface mount technology (SMT) bonding is then used to bond each bond pad 80 to a respective copper pillar on a respective bond pad 92. As another example, during the wafer-to-wafer bonding of step 1002, copper pillars may be formed on bond pads 80 on light-emitting diodes 52. In this case, a copper pillar may optionally be formed directly on conductive layer 56. Surface mount technology (SMT) bonding is then used to bond each bond pad 92 to a respective copper pillar on a respective bond pad 80.

The examples of forming copper pillars on bond pads 80 or bond pads 92 is merely illustrative. In general, any desired material may be formed between bond pads 80 and bond pads 92 during the wafer-to-wafer bonding of step 1002. As other examples, solder may be printed on one of bond pads 80 and bond pads 92 before the wafer-to-wafer bonding, a metal may be coated (e.g., using physical vapor deposition) on one of bond pads 80 and bond pads 92 before the wafer-to-wafer bonding, or a metal may be plated on one of bond pads 80 and bond pads 92 before the wafer-to-wafer bonding.

Figure 12:
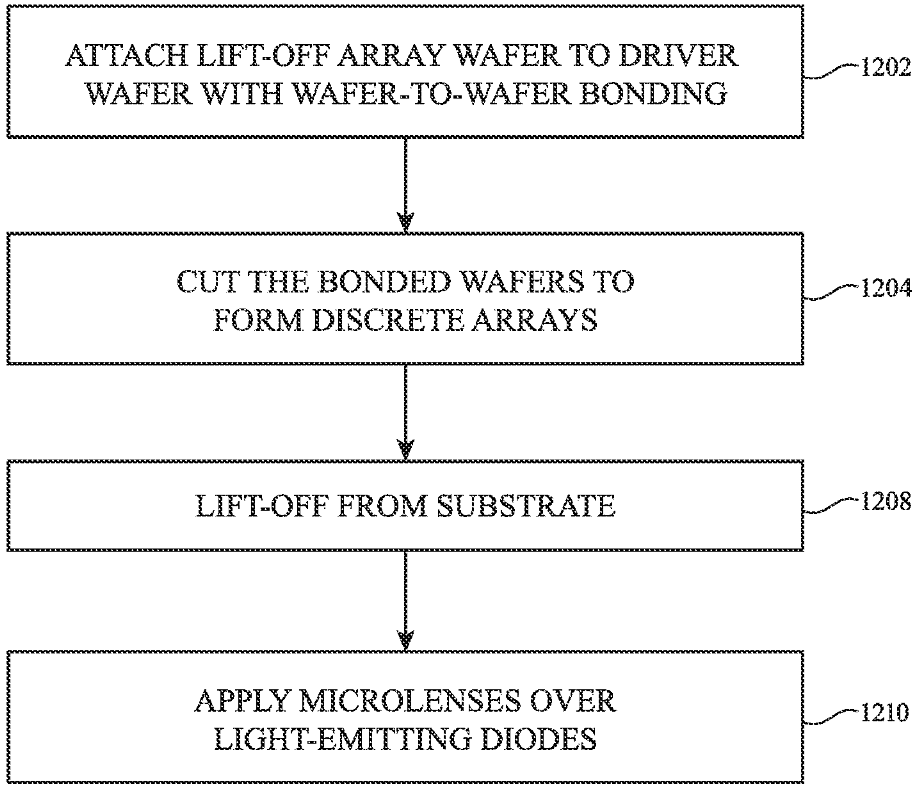
FIG. 12 is a flowchart of illustrative method steps for forming a light-emitting diode array using substrate lift-off in accordance with some embodiments.

FIG. 12 is a flowchart of another illustrative method for attaching the light-emitting diodes to driving circuitry. The light-emitting diodes may be attached to a lift-off array wafer (sometimes referred to as a dummy wafer). Similarly, a substrate with driving circuitry (sometimes referred to as a driver or driver substrate) for at least one array (and optionally multiple arrays) may be attached to a driver wafer (sometimes referred to as a dummy wafer). At step 1202, the lift-off array wafer and the driver wafer may be attached using wafer-to-wafer bonding. In other words, driving circuitry in the substrate is mechanically and electrically attached to the light-emitting diodes (e.g., using solder, copper pillars, etc.). After the wafer-to-wafer bonding of step 1202, the bonded wafers may be cut to form discrete arrays (i.e., singulation) at step 1204. At step 1206, the light-emitting diodes (e.g., array 40A) may be removed from its substrate (e.g., substrate 62 in FIGS. 5 and 7). This may be referred to as substrate lift-off. After substrate lift-off, microlenses or another desired light extraction structure may be formed over the light-emitting diodes at step 1208 (e.g., directly on the n-type semiconductor layer for the light-emitting diodes). The light extraction structure may improve light extraction efficiency. The light extraction structure may include a moth eye structure, an anti-reflective coating, and/or microlenses.

The dummy wafers (e.g., the lift-off array wafer attached to the light-emitting diodes and the driver wafer attached to the driving circuitry) may optionally be removed after step 1208 if desired. An example of an array formed using the process of FIG. 12 is shown in FIG. 13.

Figure 13:
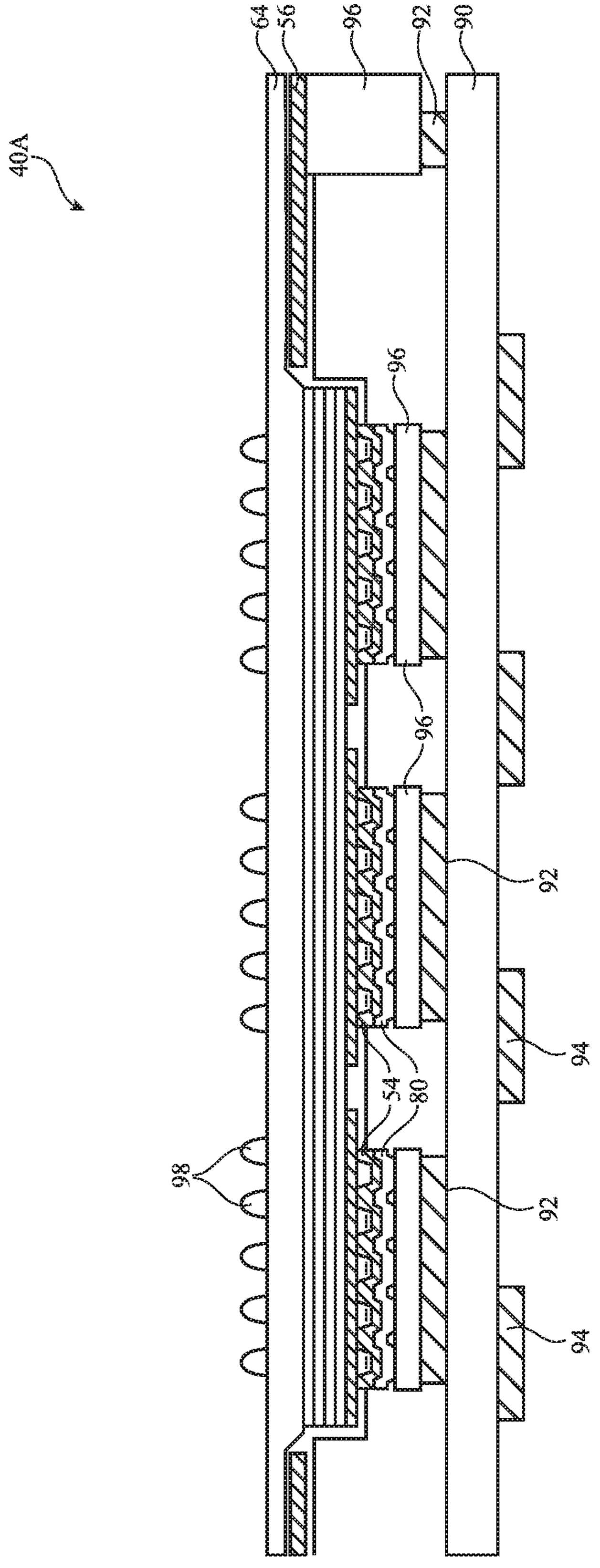
FIG. 13 is a cross-sectional side view of an illustrative light-emitting diode array formed using the steps of FIG. 12 in accordance with some embodiments.

FIG. 13 is a cross-sectional side view of array 40A with light-emitting diodes 52 bonded to a driver substrate. The array of FIG. 13 is the same as the array in FIG. 11, except for substrate 62 from FIG. 11 is omitted in FIG. 13. Instead, the array of FIG. 11 includes light extraction structures 98 (sometimes referred to as microlenses 98) formed directly on n-type semiconductor layer 64. As shown in FIG. 13, multiple microlenses 98 may overlap each light-emitting diode if desired. The LEDs may emit light through n-type semiconductor layer 64 and microlenses 98. The light-emitting diodes in FIG. 13 may instead have the arrangement of FIG. 5 instead of the arrangement of FIG. 7 if desired.

The examples of FIGS. 10-13 are merely illustrative. In general, light-emitting diodes may be bonded to a driver substrate using any desired techniques. In any given light-emitting diode array, substrate lift-off may be performed (as in FIGS. 12 and 13). In any given light-emitting diode array, light extraction structures such as microlenses may be formed over the light-emitting diodes (as in FIGS. 12 and 13). Wafer-to-wafer bonding (with metal pre-deposited on bond pads for the light-emitting diodes and/or for the driver substrate) may be used when bonding light-emitting diodes to a driver substrate. In some cases, the light-emitting diodes may be bonded directly to a flexible printed circuit in device 10 (i.e., without an intervening driver substrate 90).

In the example of FIG. 2, illumination engine 31 includes light sources arranged in three discrete arrays 40. In particular, array 40A may emit red light, array 40B may emit green light, and array 40C may emit blue light. Prism 42 (sometimes referred to as an optical combiner) may combine the light emitted by arrays 40A, 40B, and 40C into illumination light 35 (e.g., illumination light 35 may include red, green, and blue light, etc.). This example is merely illustrative. It may be desirable to reduce the number of light arrays to mitigate the cost, complexity, and size of display module 14A.

Figure 14:
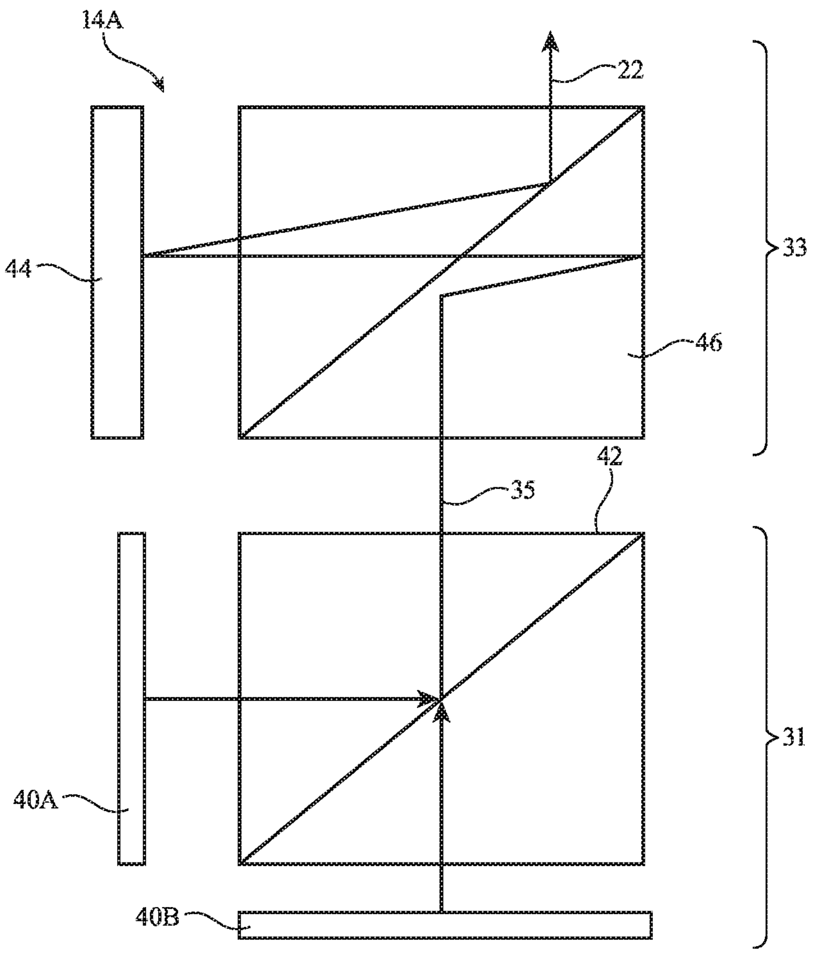
FIG. 14 is a top view of an illustrative display module having an illumination engine with a single light-emitting diode array that includes light-emitting diodes of two different colors in accordance with some embodiments.

FIG. 14 is a schematic diagram of an illustrative display module 14A with two LED arrays instead of three LED arrays (as in FIG. 2). For example, array 40A may emit red light (as in FIG. 2). However, array 40B may emit both green light and blue light. In other words, array 40B includes both blue light-emitting diodes and green light-emitting diodes. This allows for one of the three arrays in FIG. 2 (e.g., array 40C) to be omitted. Prism 42 (sometimes referred to as an optical combiner) may combine the light emitted by arrays 40A and 40B into illumination light 35 (e.g., illumination light 35 may include red, green, and blue light, etc.).

Figure 15:
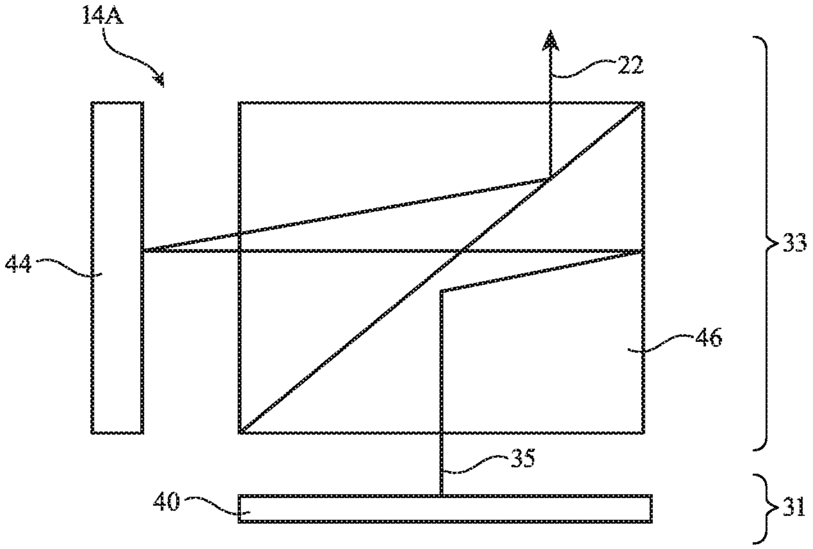
FIG. 15 is a top view of an illustrative display module having an illumination engine with a single light-emitting diode array that includes light-emitting diodes of three different colors in accordance with some embodiments.

FIG. 15 is a schematic diagram of an illustrative display module 14A with one LED array instead of two or three LED arrays (as in FIGS. 2 and 14). Array 40 may emit red light, blue, and green light. In other words, array 40 in FIG. 15 includes blue light-emitting diodes, green light-emitting diodes, and red light-emitting diodes. This allows for two of the three arrays in FIG. 2 to be omitted. This allows for array 40A in FIG. 14 to be omitted. Additionally, prism 42 (sometimes referred to as an optical combiner) from FIGS. 2 and 14 may be omitted in FIG. 15. Instead, array 40 may emit illumination light 35 (that includes red, green, and blue light, etc.) directly into prism 46.

Figure 16A:
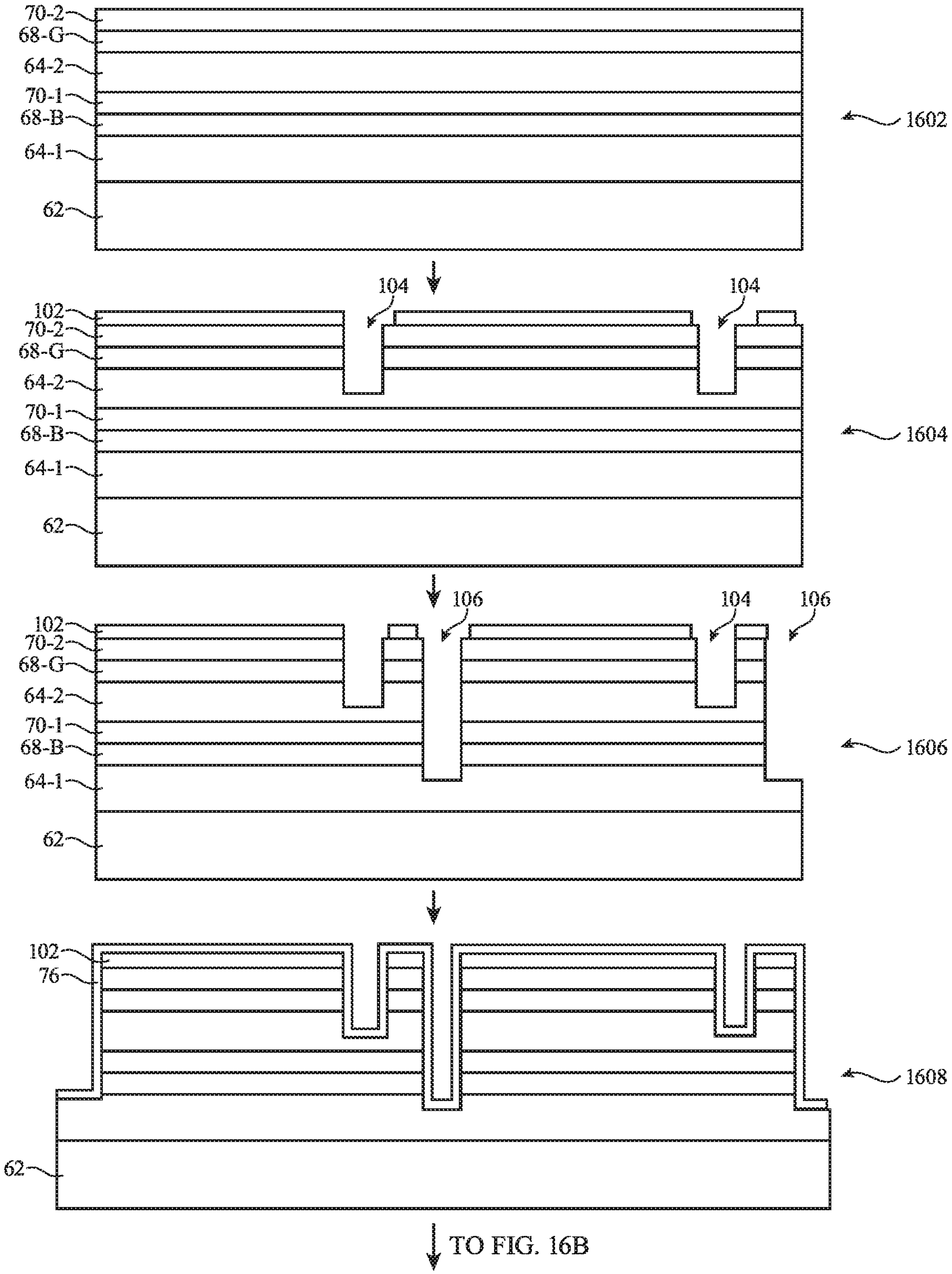
FIGS. 16A and 16B are cross-sectional side views of illustrative method steps for forming a light-emitting diode array with light-emitting diodes of two different colors in accordance with some embodiments.
Figure 16B:
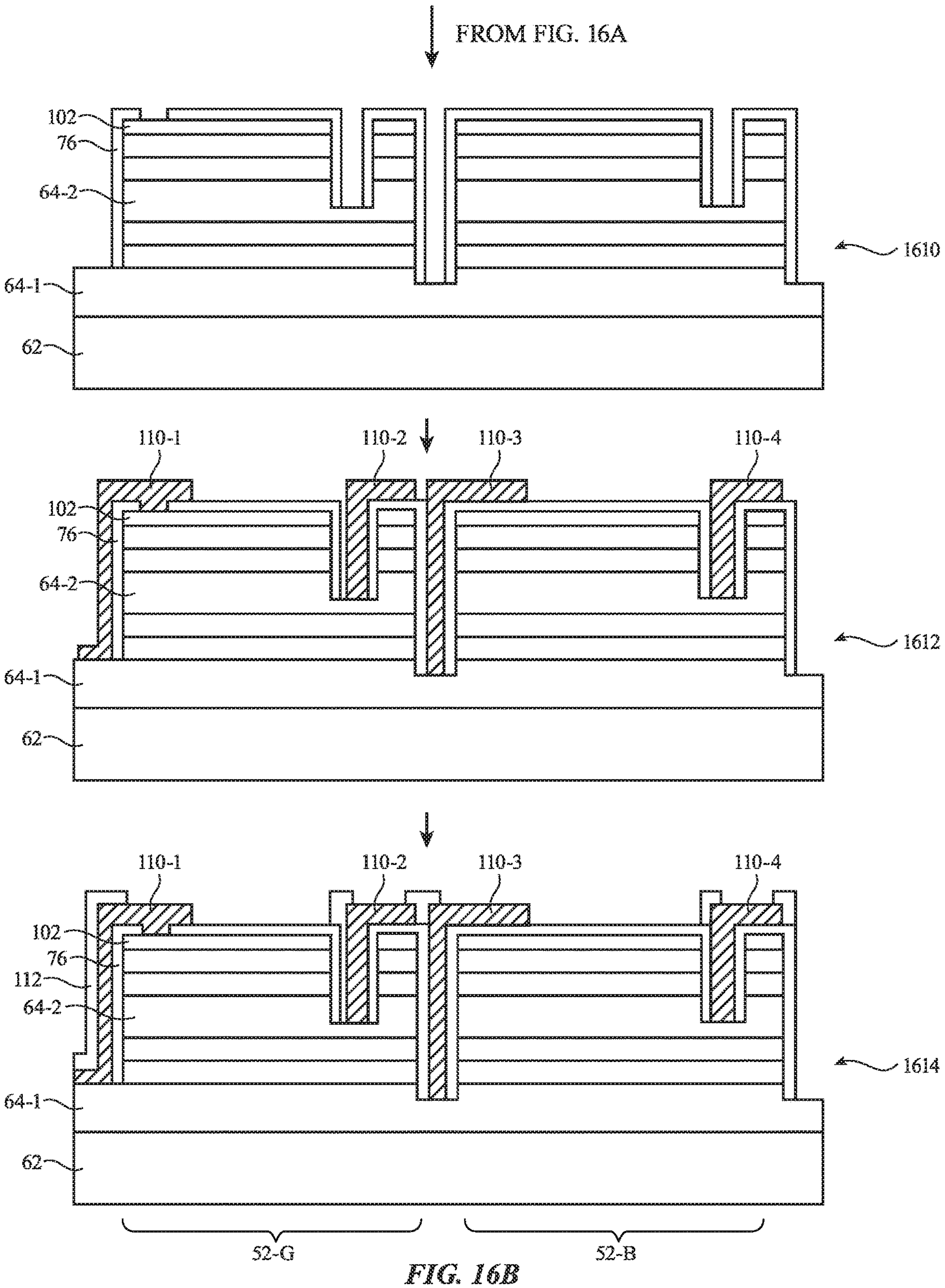

FIGS. 16A and 16B (sometimes collectively referred to as FIG. 16) are cross-sectional side views of an illustrative method for forming an array with two different color light-emitting diodes. First, at step 1602, epitaxial layers may be grown on a substrate 62. Substrate 62 for the LEDs may sometimes be referred to as LED substrate 62, substrate layer 62, dielectric substrate 62, layer 62, dielectric layer 62, carrier 62, carrier layer 62, dielectric carrier 62, dielectric carrier layer 62, epitaxial growth substrate 62, etc. LED substrate 62 may be formed from sapphire, gallium nitride (GaN), gallium arsenic (GaAs), silicon, or any other desired semiconductor and dielectric materials. In one illustrative example, the LED substrate may be formed from sapphire for blue and green LEDs and may be formed from gallium arsenic for red LEDs.

Semiconductor layers may be formed on the LED substrate at step 1602. The additional semiconductor layers include one or more n-type semiconductor layer(s) 64-1 and one or more n-type semiconductor layer(s) 64-2. The n-type semiconductor layer(s) 64-1 and 64-2 may include materials such as n-type doped gallium nitride (GaN), n-type aluminum gallium indium phosphide (AlGaInP), etc. The n-type semiconductor layer(s) 64-1 and 64-2 may be epitaxial layers (e.g., formed using epitaxy-type crystal growth/material deposition). N-type semiconductor layer(s) 64 may sometimes be referred to herein as n-type epitaxial layer(s) 64, n-type layer(s) 64, etc.

The semiconductor layers in step 1602 also include one or more p-type semiconductor layer(s) 70-1 and one or more p-type semiconductor layer(s) 70-2. Layers 70-1 and 70-2 may include p-type doped gallium nitride (GaN) layers. These examples of materials for layers 70 are merely illustrative and in general the one or more p-type semiconductor layer(s) may be formed from any desired material. The p-type semiconductor layer(s) 70 may be epitaxial layers (e.g., formed using epitaxy-type crystal growth/material deposition). P-type semiconductor layer(s) 70 may sometimes be referred to herein as p-type epitaxial layer(s) 70, p-type layer(s) 70, etc.

As shown in FIG. 16, a blue multi-quantum wells (MQW) layer 68-B is interposed between n-type semiconductor layer 64-1 and p-type semiconductor layer 70-1 while a green multi-quantum wells (MQW) layer 68-G is interposed between n-type semiconductor layer 64-2 and p-type semiconductor layer 70-2. N-type semiconductor layer(s) 64-1 may ultimately serve as a cathode for the blue LEDs in array 40 whereas p-type semiconductor layer(s) 70-1 may ultimately serve as an anode for the blue LEDs in array 40. N-type semiconductor layer(s) 64-2 may ultimately serve as a cathode for the green LEDs in array 40 whereas p-type semiconductor layer(s) 70-2 may ultimately serve as an anode for the green LEDs in array 40. MQW 68-B ultimately forms the active light emitting area of the blue LEDs in the array whereas MQW 68-G ultimately forms the active light emitting area of the green LEDs in the array. MQW layers 68-G and 68-B may include gallium nitride (GaN), gallium indium nitride (GaInN), aluminum gallium indium phosphide (AlGaInP), or any other desired materials.

After forming the epitaxial layers at step 1602, the epitaxial layers may be at least partially etched at step 1604. At step 1604, trenches 104 are formed through all of layers 70-2 and 68-G. Trenches 104 also extend partially into n-type semiconductor layer 64-2. Trenches 104 are used for mesa development of the green light-emitting diodes in the array. Also at step 1604, a conductive layer 102 may be formed over layer 70-2. Conductive layer 102 may sometimes be referred to as a p-contact layer or p-metal.

After forming the first trenches 104 at step 1604, additional trenches 106 may be formed in the epitaxial layers at step 1606. Trenches 106 are formed through all of layers 70-2, 68-G, 64-2, 70-1, and 68-B. Trenches 106 also extend partially into n-type semiconductor layer 64-1. Trenches 106 are used for mesa development of the blue light-emitting diodes in the array.

At step 1608, one or more insulating layers 76 are formed (e.g., deposited and/or patterned) over the light-emitting diodes. The one or more insulating layers 76 may include a passivation layer and a distributed Bragg reflector (DBR), as one example. At step 1608, the insulating layers are formed within trenches 76 so as to completely cover the semiconductor layers across the array.

At step 1610, insulating layers 76 are patterned to include openings 108. The openings 108 may expose underlying layers such as p-metal 102, n-type semiconductor layer 64-2, and n-type semiconductor layer 64-1.

At step 1612, conductive contacts 110 are formed over the array of light-emitting diodes. A first conductive contact 110-1 may be electrically connected to p-metal 102 (e.g., the anode for the green light-emitting diode) and n-type semiconductor layer 64-1 (e.g., the cathode for the blue light-emitting diode). A second conductive contact 110-2 may be electrically connected to n-type semiconductor layer 64-2 (e.g., the cathode for the green light-emitting diode). A third conductive contact 110-3 may be electrically connected to p-metal 102 (e.g., the anode for the green light-emitting diode) and n-type semiconductor layer 64-1 (e.g., the cathode for the blue light-emitting diode). A fourth conductive contact 110-4 may be electrically connected to n-type semiconductor layer 64-2. Because layer 64-2 is adjacent to layer 70-1, conductive contacts 110-2 and 110-4 may be sufficient to provide signals to layer 70-1 (e.g., the anode for the blue light-emitting diode) as well as layer 64-2 (e.g., the cathode for the green light-emitting diode). In some cases, conductive contacts 110-2 and/or 110-4 may be electrically connected directly to layer 70-1.

Finally, at step 1614, an additional insulating layer 112 may be formed over conductive contacts 110. Portions of contacts 110 may be exposed through layer 112 for subsequent electrical connections. Ultimately, the array formed in FIG. 16 includes both green light-emitting diodes 52-G and blue light-emitting diodes 52-B.

Figure 17:
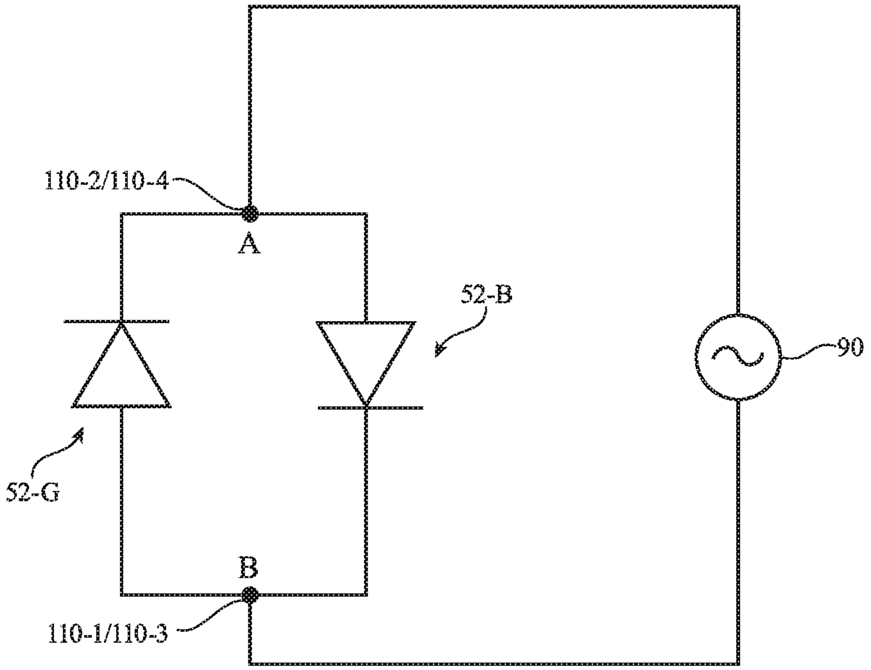
FIG. 17 is a circuit diagram of an illustrative pixel in a light-emitting diode array of the type shown in FIG. 16 in accordance with some embodiments.
Figure 18A:
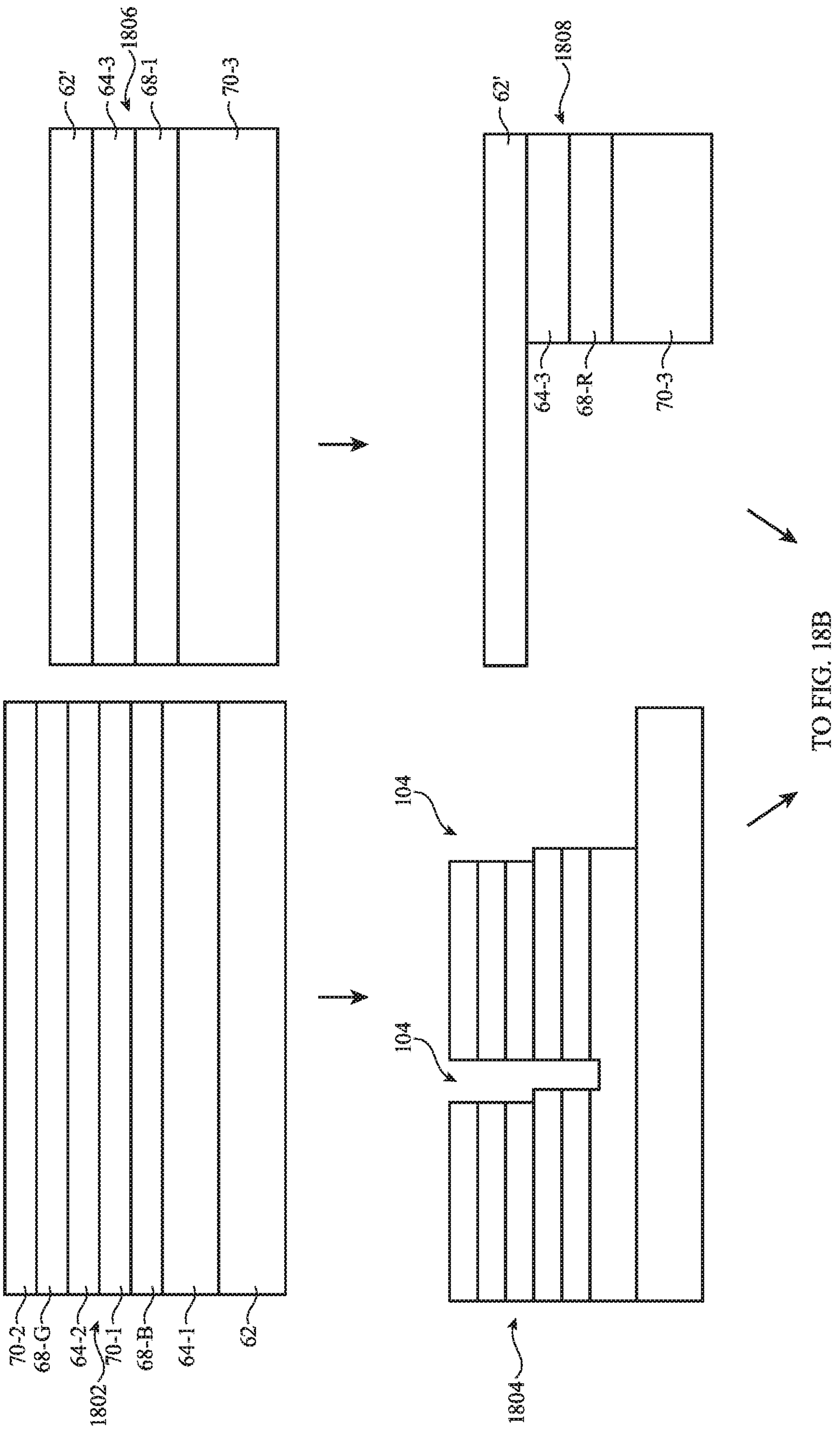
FIGS. 18A-18E are cross-sectional side views of illustrative method steps for forming a light-emitting diode array with light-emitting diodes of three different colors in accordance with some embodiments.
Figure 18B:
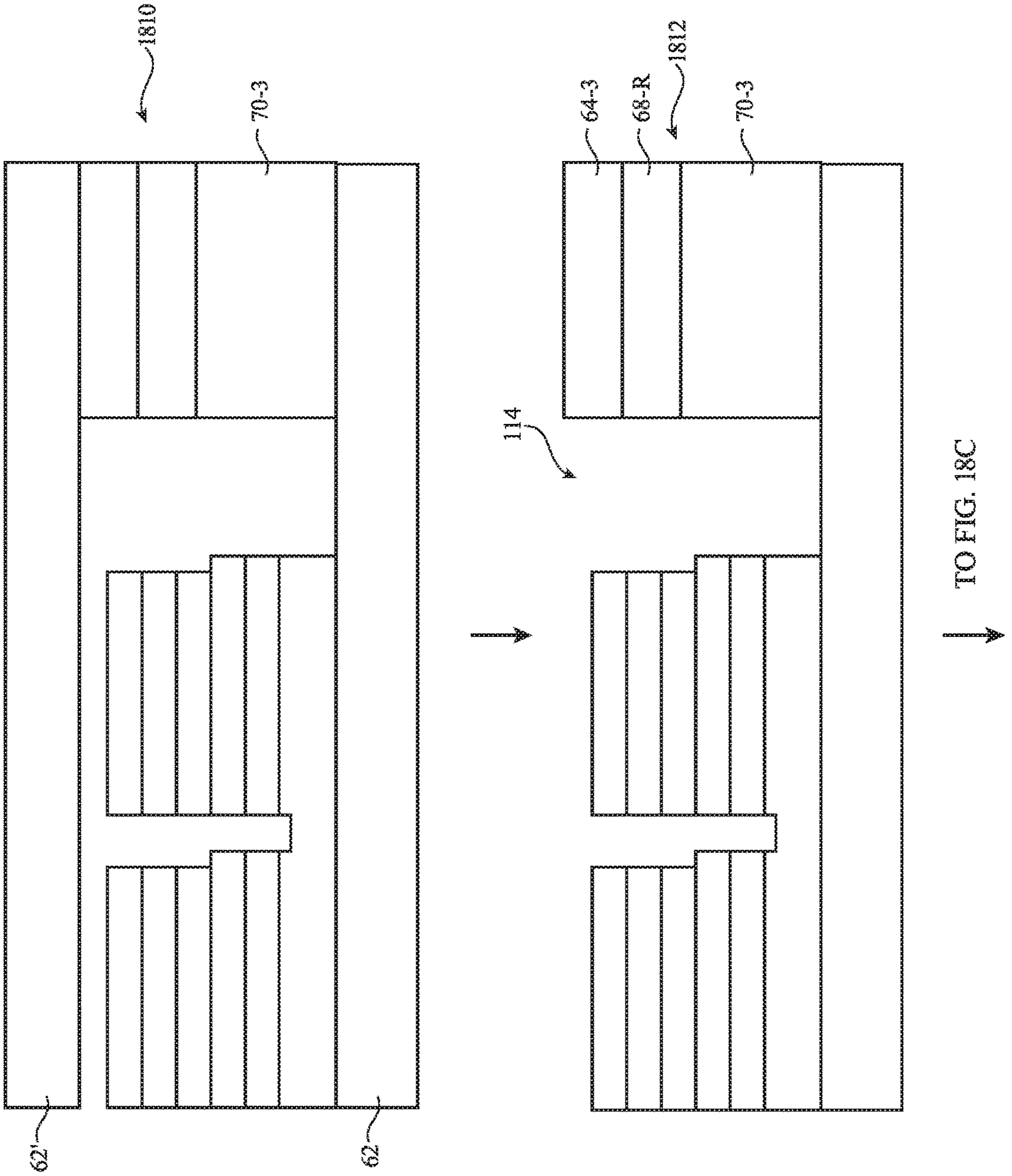
Figure 18C:
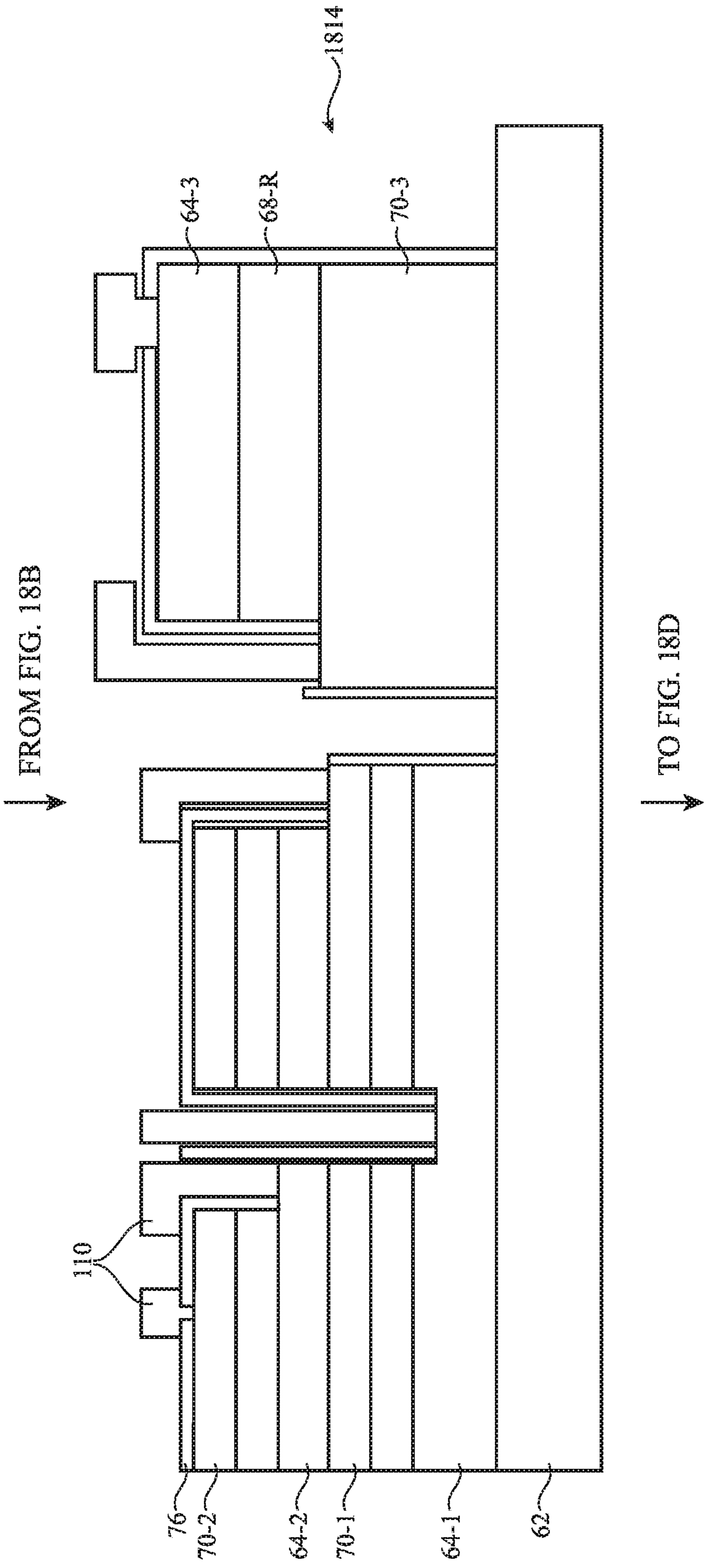
Figure 18D:
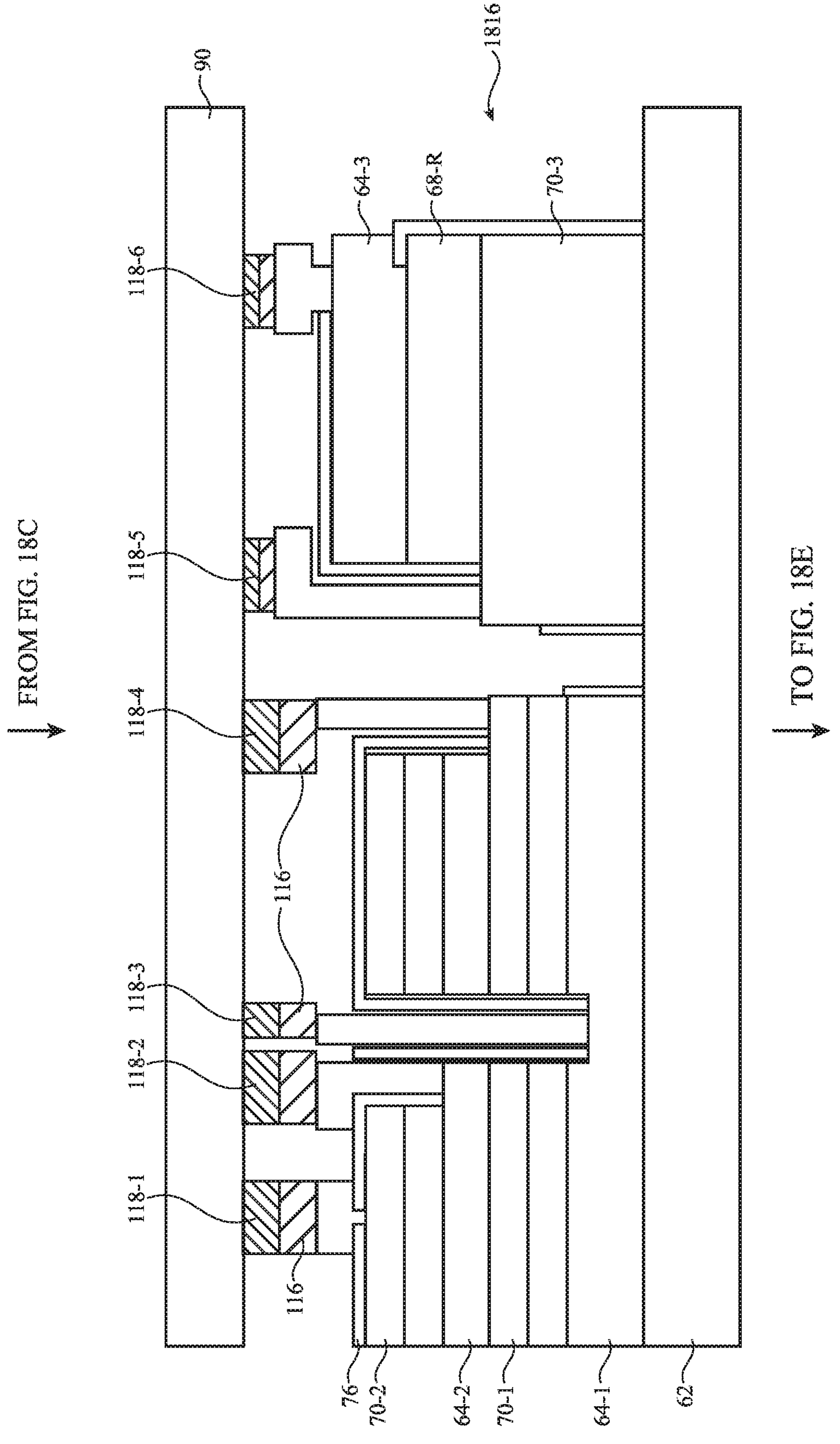
Figure 18E:
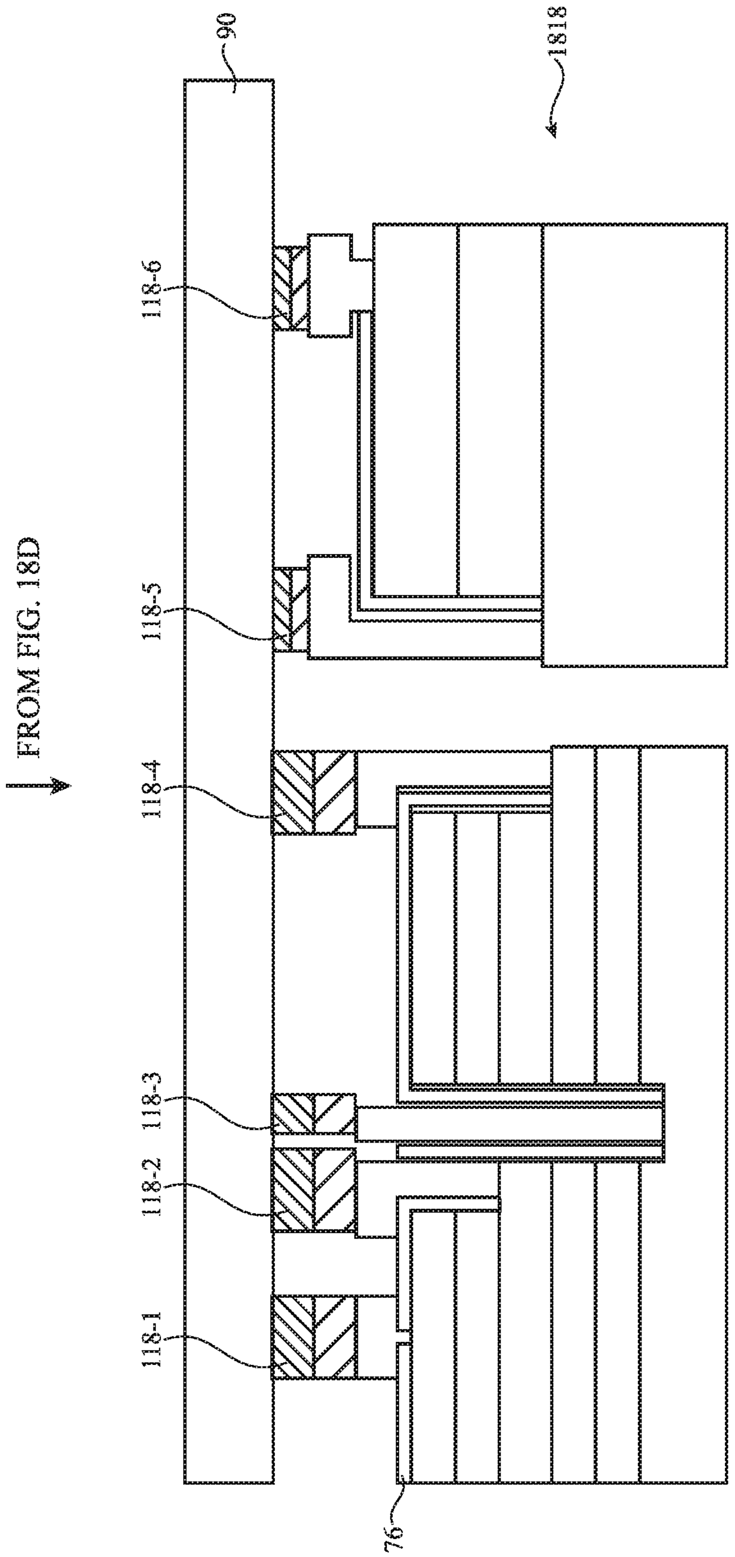

FIG. 17 is a circuit diagram of the light-emitting diodes in the array of FIG. 16. As shown, the blue and green light-emitting diodes are in a head-to-tail arrangement. In other words, the green light-emitting diode 52-G has a cathode that is coupled to node A and an anode that is coupled to node B. In contrast, light-emitting diode 52-B has an anode that is coupled to node A and a cathode that is coupled to node B. Driver circuitry 90 may control the voltage applied to nodes A and B to control the light emitted by light-emitting diodes 52-B and 52-G.

Node A may be electrically connected to both contacts 110-2 and 110-4 in FIG. 16. Contacts 110-2 and 110-4 may be used to provide the voltage at node A in FIG. 17 to the cathode of the green light-emitting diode 52-G and the anode of the blue light-emitting diode 52-G. Node B may be electrically connected to both contacts 110-1 and 110-3 in FIG. 16. Contacts 110-1 and 110-3 may be used to provide the voltage at node B in FIG. 17 to the anode of the green light-emitting diode 52-G and to the cathode of the blue light-emitting diode 52-B.

Because LEDs 52-G and 52-B are driven in parallel by driving circuit 90, the LEDs may be driven in a time-multiplexed fashion. In other words, driving circuitry 90 may alternate between driving LED 52-G to emit light and driving LED 52-B to emit light. The array of FIG. 16 may include a plurality of pixels, with each pixel having the circuit diagram of FIG. 17.

The array in FIGS. 16 and 17 includes blue and green light-emitting diodes. This type of array may be used in, for example, FIG. 14. The example of forming green and blue LEDs in the array of FIG. 16 is merely illustrative. In general, the techniques of FIGS. 16 and 17 may be used to form an array with LEDs of any two desired colors (e.g., green and red, red and blue, etc.).

FIGS. 18A-18E (sometimes collectively referred to as FIG. 18) are cross-sectional side views of an illustrative method for forming an array with three different color light-emitting diodes. First, at step 1802, epitaxial layers may be grown on a substrate 62. Substrate 62 for the LEDs may sometimes be referred to as LED substrate 62, substrate layer 62, dielectric substrate 62, layer 62, dielectric layer 62, carrier 62, carrier layer 62, dielectric carrier 62, dielectric carrier layer 62, epitaxial growth substrate 62, etc. LED substrate 62 may be formed from sapphire, gallium nitride (GaN), gallium arsenic (GaAs), silicon, or any other desired semiconductor and dielectric materials. In one illustrative example, LED substrate 62 in FIG. 18 may be formed from sapphire.

Additional semiconductor layers may be formed on the LED substrate at step 1802. The additional semiconductor layers include one or more n-type semiconductor layer(s) 64-1 and one or more n-type semiconductor layer(s) 64-2. The n-type semiconductor layer(s) 64-1 and 64-2 may include materials such as n-type doped gallium nitride (GaN), n-type aluminum gallium indium phosphide (AlGaInP), etc. The n-type semiconductor layer(s) 64-1 and 64-2 may be epitaxial layers (e.g., formed using epitaxy-type crystal growth/material deposition). N-type semiconductor layer(s) 64 may sometimes be referred to herein as n-type epitaxial layer(s) 64, n-type layer(s) 64, etc.

The semiconductor layers in step 1802 also include one or more p-type semiconductor layer(s) 70-1 and one or more p-type semiconductor layer(s) 70-2. Layers 70-1 and 70-2 may include p-type doped gallium nitride (GaN) layers. These examples of materials for layers 70 are merely illustrative and in general the one or more p-type semiconductor layer(s) may be formed from any desired material. The p-type semiconductor layer(s) 70 may be epitaxial layers (e.g., formed using epitaxy-type crystal growth/material deposition). P-type semiconductor layer(s) 70 may sometimes be referred to herein as p-type epitaxial layer(s) 70, p-type layer(s) 70, etc.

As shown in FIG. 18, a blue multi-quantum wells (MQW) layer 68-B is interposed between n-type semiconductor layer 64-1 and p-type semiconductor layer 70-1 while a green multi-quantum wells (MQW) layer 68-G is interposed between n-type semiconductor layer 64-2 and p-type semiconductor layer 70-2. N-type semiconductor layer(s) 64-1 may ultimately serve as a cathode for the blue LEDs in array 40 whereas p-type semiconductor layer(s) 70-1 may ultimately serve as an anode for the blue LEDs in array 40. N-type semiconductor layer(s) 64-2 may ultimately serve as a cathode for the green LEDs in array 40 whereas p-type semiconductor layer(s) 70-2 may ultimately serve as an anode for the green LEDs in array 40. MQW 68-B ultimately forms the active light emitting area of the blue LEDs in the array whereas MQW 68-G ultimately forms the active light emitting area of the green LEDs in the array. MQW layers 68-G and 68-B may include gallium nitride (GaN), gallium indium nitride (GaInN), aluminum gallium indium phosphide (AlGaInP), or any other desired materials.

After forming the epitaxial layers at step 1802, the epitaxial layers may be at least partially etched at step 1804. At step 1804, trenches 104 are formed through some of the semiconductor layers on substrate 62. Trenches 104 include portions that extend completely through layers 70-2, 68-G, and 64-2 but not through layers 70-1, 68-B, or 64-1. Trenches 104 also include portions that extend completely through layers 70-2, 68-G, 64-2, 70-1, and 68-B, and partially through layer 64-1.

In parallel with the forming of green and blue light-emitting diodes in steps 1802 and 1804, red light-emitting diodes may be formed in steps 1806 and 1808. First, at step 1806, epitaxial layers may be grown on a substrate 62'. Substrate 62' for the red LEDs may sometimes be referred to as LED substrate 62', substrate layer 62', dielectric substrate 62', layer 62', dielectric layer 62', carrier 62', carrier layer 62', dielectric carrier 62', dielectric carrier layer 62', epitaxial growth substrate 62', etc. LED substrate 62' may be formed from sapphire, gallium nitride (GaN), gallium arsenic (GaAs), silicon, or any other desired semiconductor and dielectric materials. In one illustrative example, LED substrate 62' in FIG. 18 may be formed from gallium arsenic.

Semiconductor layers may be formed on substrate 62' at step 1806. The additional semiconductor layers include one or more n-type semiconductor layer(s) 64-3. The n-type semiconductor layer(s) 64-3 may include materials such as n-type doped gallium nitride (GaN), n-type aluminum gallium indium phosphide (AlGaInP), etc. The n-type semiconductor layer(s) 64-3 may be epitaxial layers (e.g., formed using epitaxy-type crystal growth/material deposition). N-type semiconductor layer(s) 64-3 may sometimes be referred to herein as n-type epitaxial layer(s) 64-3, n-type layer(s) 64-3, etc.

The semiconductor layers in step 1806 also include one or more p-type semiconductor layer(s) 70-3. Layers 70-3 may include p-type doped aluminum gallium indium phosphide (AlGaInP), p-type doped gallium nitride (GaN), etc. These examples of materials for layers 70-3 are merely illustrative and in general the one or more p-type semiconductor layer(s) may be formed from any desired material. The p-type semiconductor layer(s) 70-3 may be epitaxial layers (e.g., formed using epitaxy-type crystal growth/material deposition). P-type semiconductor layer(s) 70-3 may sometimes be referred to herein as p-type epitaxial layer(s) 70-3, p-type layer(s) 70-3, etc.

As shown in FIG. 18, a red multi-quantum wells (MQW) layer 68-R is interposed between n-type semiconductor layer 64-3 and p-type semiconductor layer 70-3. N-type semiconductor layer(s) 64-3 may ultimately serve as a cathode for the red LEDs in array 40 whereas p-type semiconductor layer(s) 70-3 may ultimately serve as an anode for the red LEDs in array 40. MQW layers 68-R may include gallium nitride (GaN), gallium indium nitride (GaInN), aluminum gallium indium phosphide (AlGaInP), or any other desired materials.

After forming the epitaxial layers at step 1806, the epitaxial layers may be at least partially etched at step 1808. In particular, the semiconductor layers may be completely removed in portions not intended to form light-emitting diodes 52-R.

At step 1810, the red light-emitting diodes (on substrate 62') are laminated to substrate 62 for the blue and green light-emitting diodes. A polymer filler (that is later removed) may optionally be included between the LEDs (and between substrates 62 and 62') at this step. Adhesive may be included between p-type semiconductor layer 70-3 and substrate 62 to attach the red light-emitting diodes to substrate 62. Next, at step 1812, substrate 62' may be removed (e.g., by grinding). Additionally, a trench 114 may be formed in layers 64-3 and 68-R for the red LEDS.

At step 1814, one or more insulating layers 76 are formed (e.g., deposited and/or patterned) over the light-emitting diodes. The one or more insulating layers 76 may include a passivation layer and a distributed Bragg reflector (DBR), as one example. The insulating layers 76 include a plurality of openings (e.g., to expose a portion of layer 70-2, to expose a portion of layer 64-3, to expose layers in the trenches, etc.) for subsequent electrical contact. Conductive contacts 110 are then added to overlap the openings in insulating layer(s) 76. As shown in step 1814, the conductive contacts may be in direct contact with (from left to right) the p-type semiconductor layer 70-2, the n-type semiconductor layer 64-2, the n-type semiconductor layer 64-1, the p-type semiconductor layer 70-1, the p-type semiconductor layer 70-3, and the n-type semiconductor layer 64-3.

At step 1816, the contacts 110 may be bonded to bond pads 118 of a driver substrate 90 that includes driving circuitry (as discussed in connection with FIGS. 10 and 11, for example). A conductive material 116 (e.g., solder) may mechanically and electrically connect conductive contacts 110 to bond pads 118. As shown in step 1816, the bond pads provide signals to (from left to right) the p-type semiconductor layer 70-2 (from bond pad 118-1), the n-type semiconductor layer 64-2 (from bond pad 118-2), the n-type semiconductor layer 64-1 (from bond pad 118-3), the p-type semiconductor layer 70-1 (from bond pad 118-4), the p-type semiconductor layer 70-3 (from bond pad 118-5), and the n-type semiconductor layer 64-3 (from bond pad 118-6). Finally, at step 1818, substrate 62 may optionally be removed.

Figure 19:
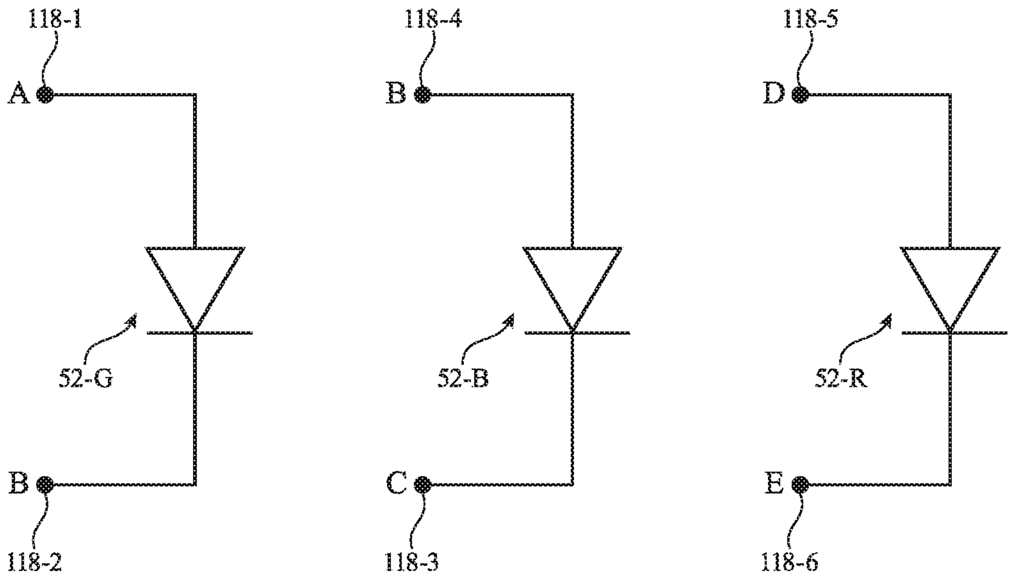
FIG. 19 is a circuit diagram of an illustrative pixel in a light-emitting diode array of the type shown in FIG. 18 in accordance with some embodiments.

FIG. 19 is a circuit diagram of the light-emitting diodes in the array of FIG. 18. The array of FIG. 18 may include a plurality of pixels, with each pixel having the circuit diagram of FIG. 19. As shown, each light-emitting diode in FIGS. 18 and 19 may be driven simultaneously (and independently). In other words, time-multiplexing is not required for the operation of the array in FIGS. 18 and 19. In FIG. 19, the green light-emitting diode 52-G has an anode that is coupled to node A and a cathode that is coupled to node B.

The blue light-emitting diode 52-B has an anode that is also coupled to node B and a cathode that is coupled to node C. The red light-emitting diode 52-R has an anode that is coupled to node D and a cathode that is coupled to node E. Driver circuitry 90 may control the voltage applied to nodes A, B, C, D, and E to control the light emitted by light-emitting diodes 52-B, 52-G, and 52-R.

Node B may be electrically connected to both bond pads 118-2 and 118-4 in FIG. 18. In other words, the same voltage is applied to the cathode of the green light-emitting diode (using bond pad 118-2) and the anode of the blue light-emitting diode (using bond pad 118-4). Bond pad 118-1 is used to provide the voltage at node A to the anode of the green light-emitting diode 52-G. Bond pad 118-3 is used to provide the voltage at node C to the cathode of the blue light-emitting diode 52-B. Bond pad 118-5 is used to provide the voltage at node D to the anode of the red light-emitting diode 52-R. Bond pad 118-6 is used to provide the voltage at node E to the cathode of the red light-emitting diode 52-R.

The array in FIGS. 18 and 19 includes red, blue, and green light-emitting diodes. This type of array may be used in, for example, FIG. 15.

Figure 20A:
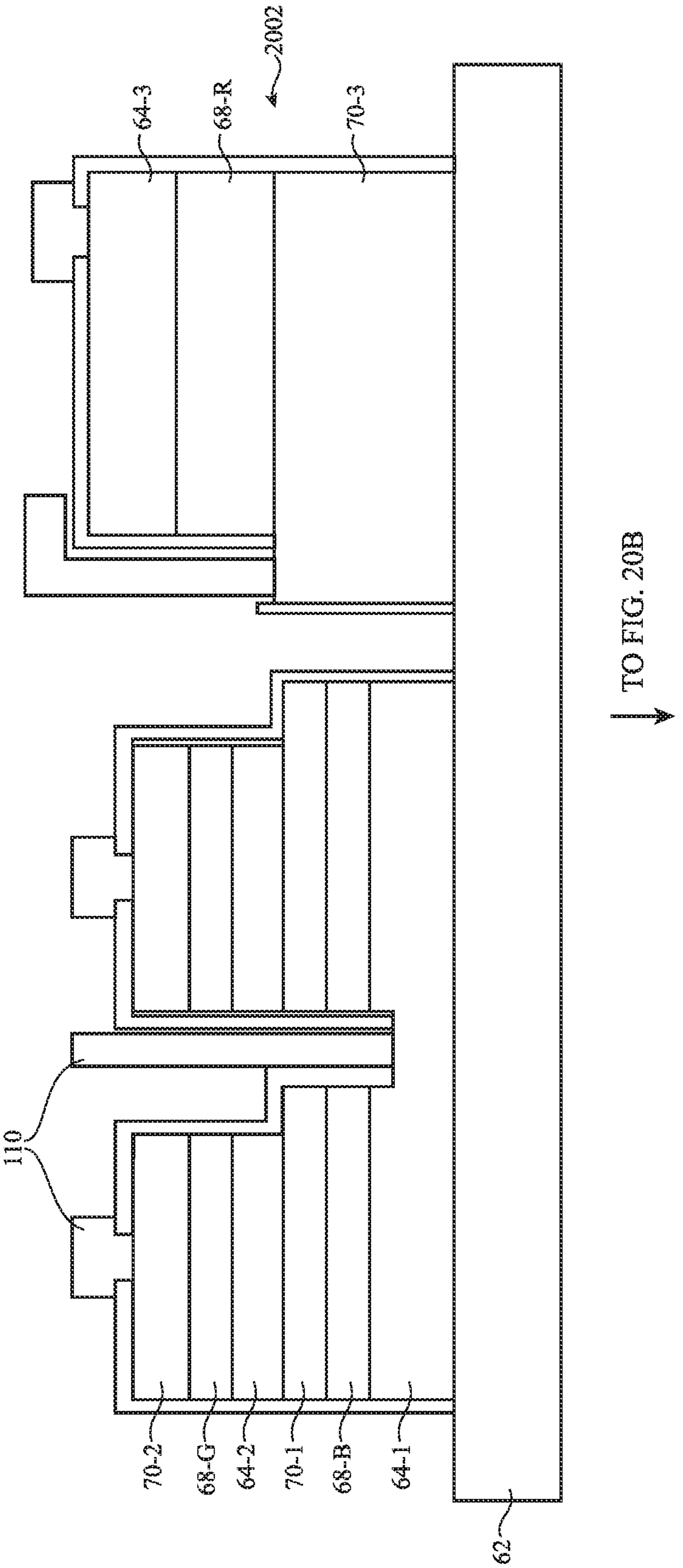
FIGS. 20A and 20B are cross-sectional side views of illustrative method steps for forming a light-emitting diode array with light-emitting diodes of three different colors including light-emitting diodes of two different colors that are connected in series in accordance with some embodiments.
Figure 20B:
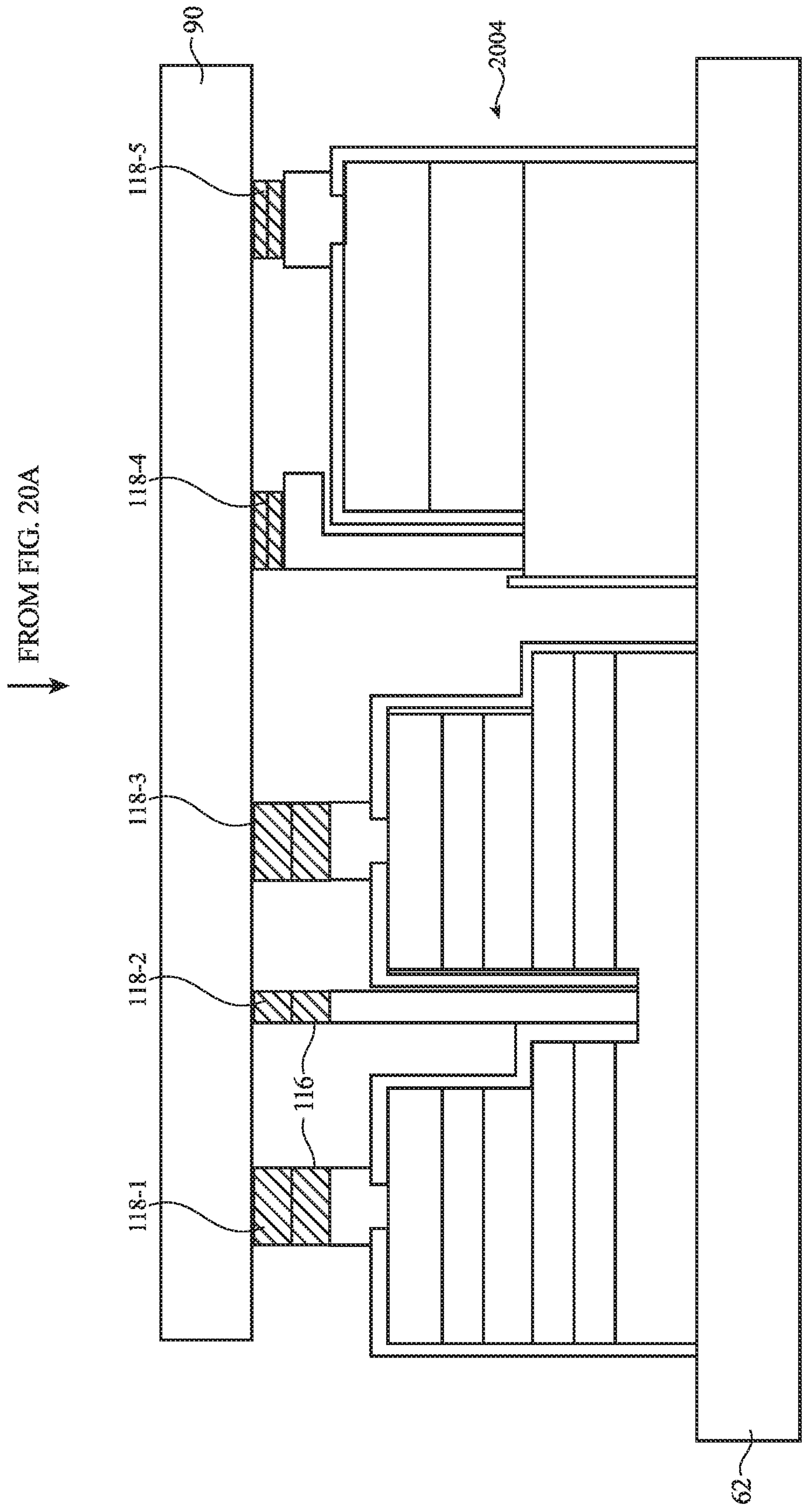

FIG. 18 shows one example for forming contacts to the LEDs (e.g., at step 1814) and an associated driving scheme (e.g., as reflected in the circuit diagram of FIG. 19). However, other driving schemes and associated LED contact arrangements may be used. FIGS. 20A and 20B (sometimes collectively referred to as FIG. 20) are cross-sectional side views showing how contacts may be formed for an array with a different driving scheme than in FIG. 18.

Step 2002 in FIG. 20 may succeed steps 1802-1812 of FIG. 18. In step 2002, one or more insulating layers 76 are formed (e.g., deposited and/or patterned) over the light-emitting diodes. The one or more insulating layers 76 may include a passivation layer and a distributed Bragg reflector (DBR), as one example. The insulating layers 76 include a plurality of openings (e.g., to expose a portion of layer 70-2, to expose a portion of layer 64-3, to expose layers in the trenches, etc.) for subsequent electrical contact. Conductive contacts 110 are then added to overlap the openings in insulating layer(s) 76. As shown in step 2002, the conductive contacts may be in direct contact with (from left to right), the p-type semiconductor layer 70-2, the n-type semiconductor layer 64-1, the p-type semiconductor layer 70-2, the p-type semiconductor layer 70-3, and the n-type semiconductor layer 64-3.

At step 2004, the contacts 110 may be bonded to bond pads 118 of a driver substrate 90 that includes driving circuitry (as discussed in connection with FIGS. 10 and 11, for example). A conductive material 116 (e.g., solder) may mechanically and electrically connect conductive contacts 110 to bond pads 118. As shown in step 2004, the bond pads provide signals to (from left to right) the p-type semiconductor layer 70-2 (from bond pad 118-1), the n-type semiconductor layer 64-1 (from bond pad 118-2), the p-type semiconductor layer 70-2 (from bond pad 118-3), the p-type semiconductor layer 70-3 (from bond pad 118-4), and the n-type semiconductor layer 64-3 (from bond pad 118-5). Substrate 62 may optionally be removed after step 2004 (e.g., as in step 1818 of FIG. 18).

Figure 21:
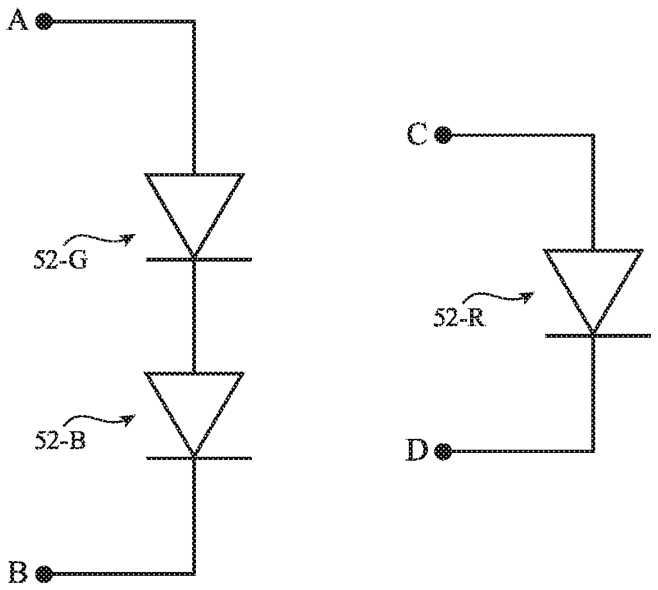
FIG. 21 is a circuit diagram of an illustrative pixel in a light-emitting diode array of the type shown in FIG. 20 in accordance with some embodiments.
Figure 22A:
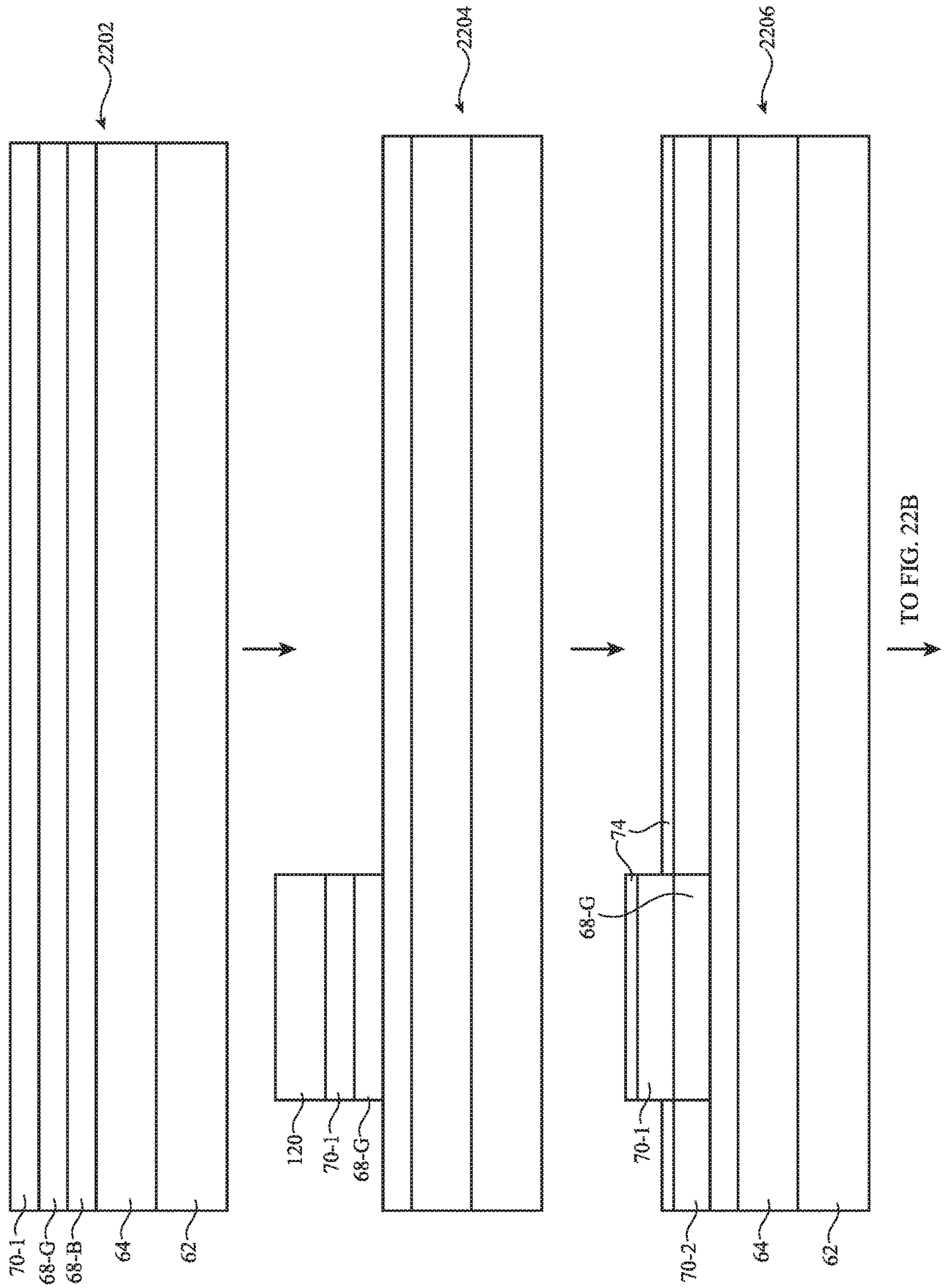
FIGS. 22A-22D are cross-sectional side views of illustrative method steps for forming a light-emitting diode array with light-emitting diodes of three different colors including light-emitting diodes of two different colors that share a common cathode in accordance with some embodiments.
Figure 22B:
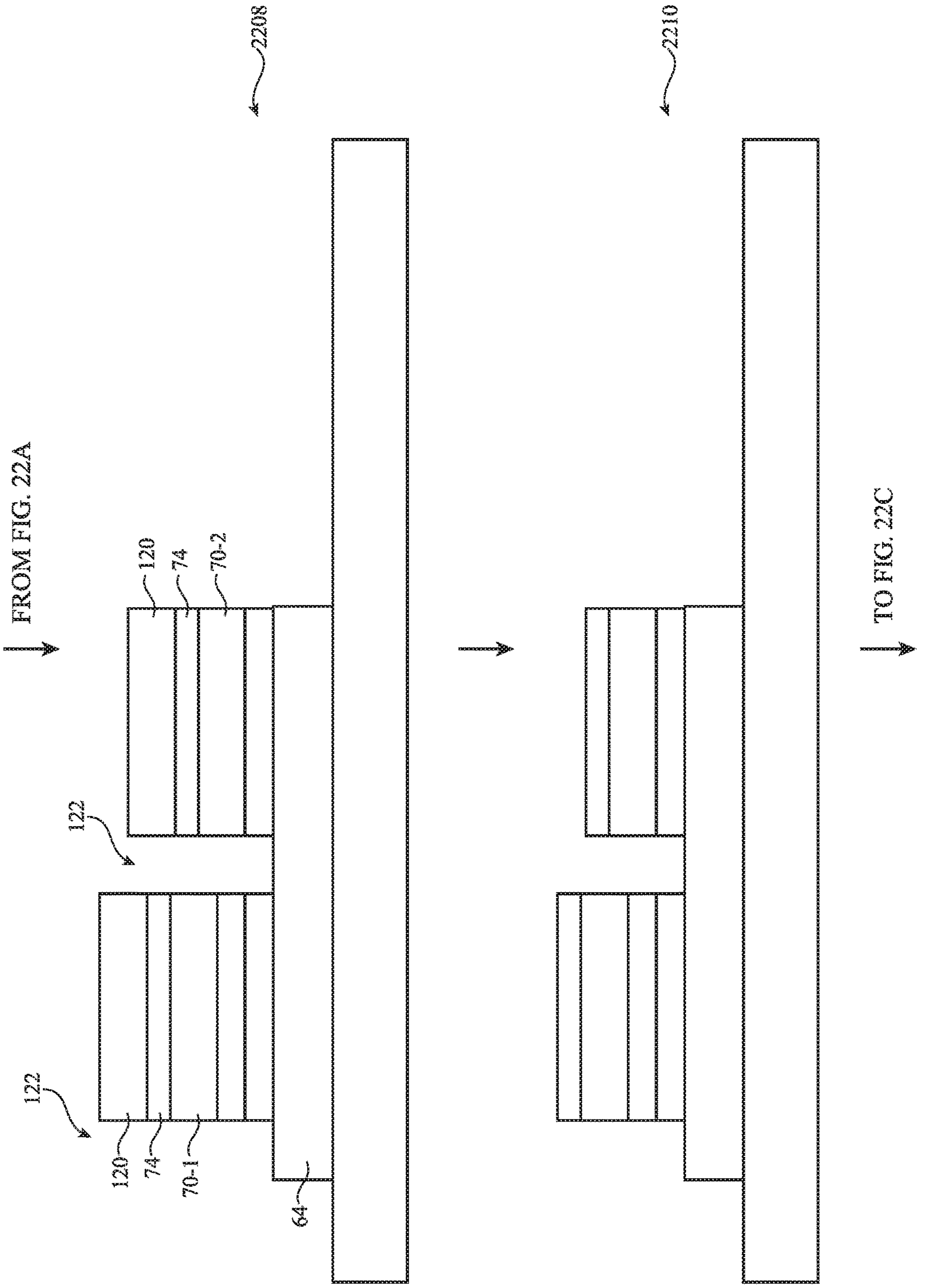
Figure 22C:
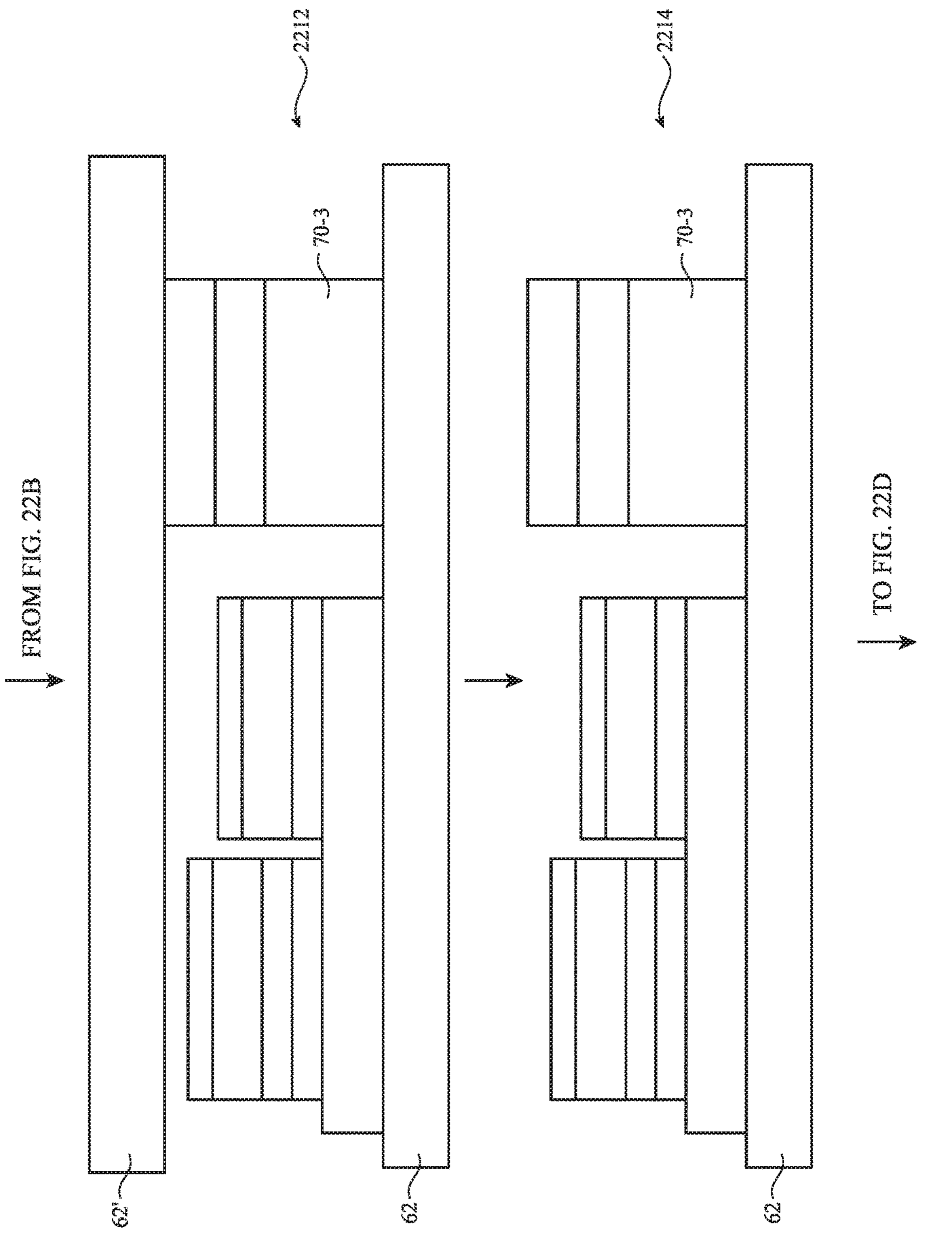
Figure 22D:
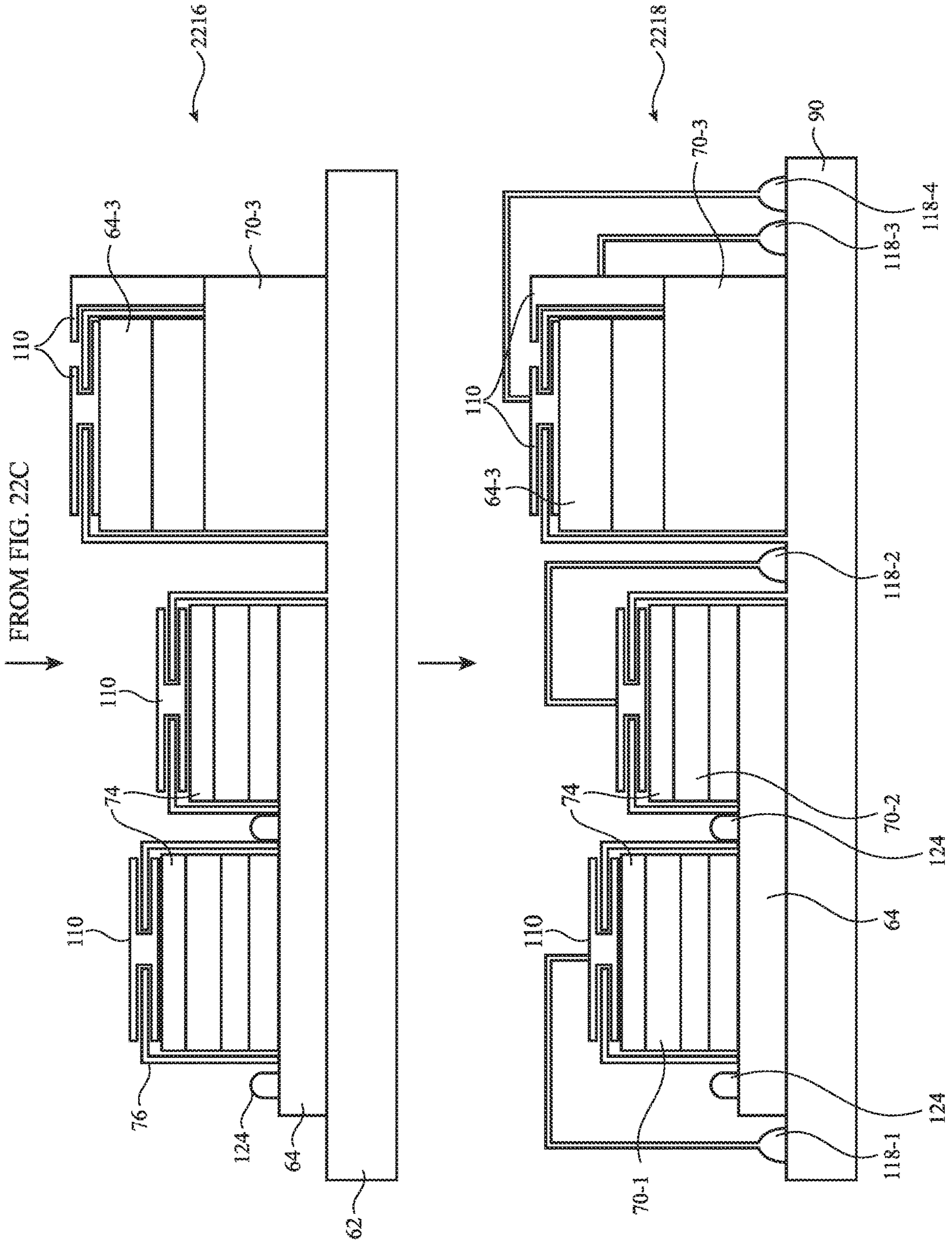

FIG. 21 is a circuit diagram of the light-emitting diodes in the array of FIG. 20. The array of FIG. 20 may include a plurality of pixels, with each pixel having the circuit diagram of FIG. 20. As shown, the green LEDs 52-G and blue LEDs 52-B are connected in series. In FIG. 21, the green light-emitting diode 52-G has an anode that is coupled to node A and a cathode that is coupled to the anode of blue light-emitting diode 52-B. The blue light-emitting diode 52-B has an anode that is also coupled to the cathode of green light-emitting diode 52-G and a cathode that is coupled to node B. The red light-emitting diode 52-R has an anode that is coupled to node C and a cathode that is coupled to node D. Driver circuitry 90 may control the voltage applied to nodes A, B, C, and D to control the light emitted by light-emitting diodes 52-B, 52-G, and 52-R.

Node A may be electrically connected to both bond pads 118-1 and 118-3 in FIG. 20. Bond pad 118-2 is used to provide the voltage at node B to the cathode of the blue light-emitting diode 52-B. Bond pad 118-4 is used to provide the voltage at node C to the anode of the red light-emitting diode 52-R. Bond pad 118-5 is used to provide the voltage at node D to the cathode of the red light-emitting diode 52-R.

The array in FIGS. 20 and 21 includes red, blue, and green light-emitting diodes. This type of array may be used in, for example, FIG. 15.

FIGS. 22A-22D (sometimes collectively referred to as FIG. 22) are cross-sectional side views of an illustrative method for forming an array with three different color light-emitting diodes. First, at step 2202, epitaxial layers may be grown on a substrate 62. Substrate 62 for the LEDs may sometimes be referred to as LED substrate 62, substrate layer 62, dielectric substrate 62, layer 62, dielectric layer 62, carrier 62, carrier layer 62, dielectric carrier 62, dielectric carrier layer 62, epitaxial growth substrate 62, etc. LED substrate 62 may be formed from sapphire, gallium nitride (GaN), gallium arsenic (GaAs), silicon, or any other desired semiconductor and dielectric materials. In one illustrative example, LED substrate 62 in FIG. 22 may be formed from sapphire.

Additional semiconductor layers may be formed on the LED substrate at step 2202. The additional semiconductor layers include one or more n-type semiconductor layer(s) 64. The n-type semiconductor layer(s) 64 may include materials such as n-type doped gallium nitride (GaN), n-type aluminum gallium indium phosphide (AlGaInP), etc. The n-type semiconductor layer(s) 64 may be epitaxial layers (e.g., formed using epitaxy-type crystal growth/material deposition). N-type semiconductor layer(s) 64 may sometimes be referred to herein as n-type epitaxial layer(s) 64, n-type layer(s) 64, etc.

The semiconductor layers in step 2202 also include one or more p-type semiconductor layer(s) 70-1. Layers 70-1 may include p-type doped gallium nitride (GaN) layers. These examples of materials for layers 70 are merely illustrative and in general the one or more p-type semiconductor layer(s) may be formed from any desired material. The p-type semiconductor layer(s) 70 may be epitaxial layers (e.g., formed using epitaxy-type crystal growth/material deposition). P-type semiconductor layer(s) 70 may sometimes be referred to herein as p-type epitaxial layer(s) 70, p-type layer(s) 70, etc.

As shown in FIG. 22, a blue multi-quantum wells (MQW) layer 68-B and a green multi-quantum wells (MQW) layer are interposed between n-type semiconductor layer 64 and p-type semiconductor layer 70-1. MQW 68-B ultimately forms the active light emitting area of the blue LEDs in the array whereas MQW 68-G ultimately forms the active light emitting area of the green LEDs in the array. MQW layers 68-G and 68-B may include gallium nitride (GaN), gallium indium nitride (GaInN), aluminum gallium indium phosphide (AlGaInP), or any other desired materials.

After forming the epitaxial layers at step 2202, the epitaxial layers may be at least partially etched at step 2204. As shown, a photoresist 120 may be formed over a portion of the semiconductor layers (over a portion that will eventually form a green light-emitting diode). Portions of p-type semiconductor layer 70-1 and green MQW 68-G that are not covered by photoresist 120 may be completely removed at step 2204. Blue MQW 68-B and n-type semiconductor layer 64 are not removed at step 2204.

At step 2206, photoresist 120 from step 2204 is removed and additional layers are added to the array. First, an additional p-type semiconductor layer 70-2 may be formed. The additional p-type semiconductor layer 70-2 may laterally surround green MQW 68-G (and some of p-type semiconductor layer 70-1. Next, a conductive layer 74 is formed (e.g., deposited) as a blanket layer over the entire array. The conductive layer 74 may be formed from a transparent material such as indium tin oxide (ITO). P-type semiconductor layers 70-1 and 70-2 are each covered by conductive layer 74.

Next, at step 2208, photoresists 120 are formed over the remaining green MQW 68-G (which forms the green LEDs) and other portions of the array (which will form blue LEDs). Trenches 122 may be formed that completely remove conductive layer 74, p-type semiconductor layer 70-1, p-type semiconductor layer 70-2, green MQW 68-G, and blue MQW 68-B. N-type semiconductor layer 64 is not removed in the green and blue LED areas. However, n-type semiconductor layer 64 may be removed in other portions of the array, as shown in step 2208 of FIG. 22. After etching is complete, the photoresists 120 may be removed at step 2210.

In parallel with the forming of green and blue light-emitting diodes in steps 2202-2210, red light-emitting diodes may be formed in parallel (e.g., as shown in steps 1806 and 1808 of FIG. 18). At step 2212, the red light-emitting diodes (on substrate 62') are laminated to substrate 62 for the blue and green light-emitting diodes. Adhesive may be included between p-type semiconductor layer 70-3 and substrate 62 to attach the red light-emitting diodes to substrate 62. Next, at step 2214, substrate 62' may be removed (e.g., by grinding).

At step 2216, a trench may be formed in layers 64-3 and 68-R for the red LEDs. Additionally, one or more insulating layers 76 are formed (e.g., deposited and/or patterned) over the light-emitting diodes at step 2216. The one or more insulating layers 76 may include a passivation layer and a distributed Bragg reflector (DBR), as one example. The insulating layers 76 include a plurality of openings (e.g., to expose portions of layer 64-3, portions of conductive layer 74, etc.)

Conductive contacts 110 are then added to overlap the openings in insulating layer(s) 76. As shown in step 2216, the conductive contacts may be in direct contact with (from left to right) the conductive layer 74 that overlaps green MQW 68-G (e.g., p-metal for the green LED), the conductive layer 74 that does not overlap green MQW 68-G (e.g., p-metal for the blue LED), the n-type semiconductor layer 64-3, and the p-type semiconductor layer 70-3. Also at step 2216, first and second bond pads 124 (sometimes referred to as contact pads or conductive contacts) are formed directly on an upper surface of n-type semiconductor layer 64.

At step 2218, substrate 62 may be removed and the contacts 110 may be bonded to bond pads 118 of a driver substrate 90 that includes driving circuitry (as discussed in connection with FIGS. 10 and 11, for example). A conductive material (e.g., wire bonds) may mechanically and electrically connect conductive contacts 110 to bond pads 118. As shown in step 2218, the bond pads provide signals to (from left to right) the p-type semiconductor layer 70-1 (from bond pad 118-1 and through conductive contact layer 74), the p-type semiconductor layer 70-2 (from bond pad 118-2 and through conductive contact layer 74), the p-type semiconductor layer 70-3 (from bond pad 118-3), and the n-type semiconductor layer 64-3 (from bond pad 118-4). Although not explicitly shown in FIG. 22, driver substrate 90 may also include an electrical connection to bond pads 124 to provide signals to n-type semiconductor layer 64.

Figure 23:
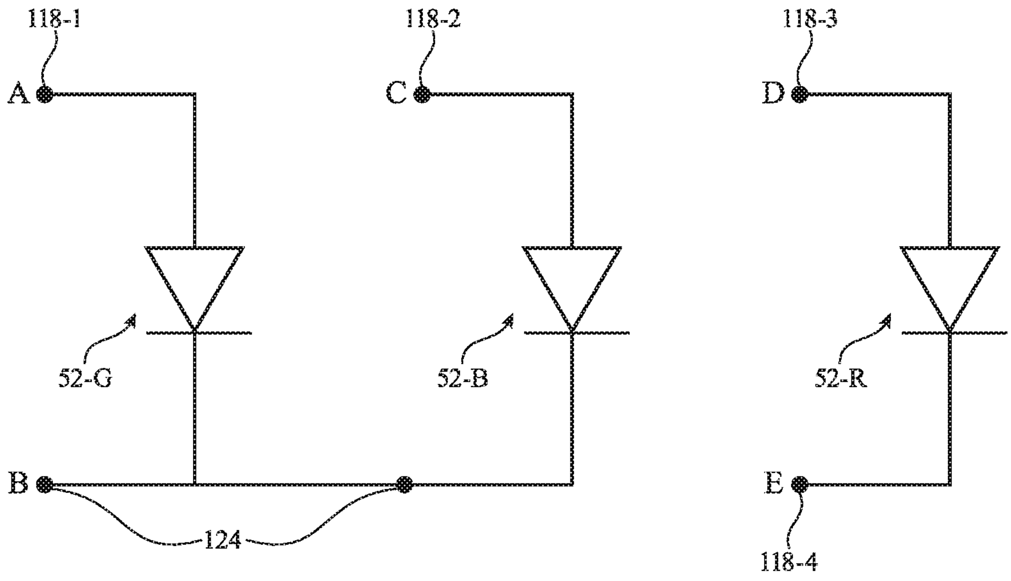
FIG. 23 is a circuit diagram of an illustrative pixel in a light-emitting diode array of the type shown in FIG. 22 in accordance with some embodiments.

FIG. 23 is a circuit diagram of the light-emitting diodes in the array of FIG. 22. The array of FIG. 22 may include a plurality of pixels, with each pixel having the circuit diagram of FIG. 23. As shown, the green LEDs 52-G and blue LEDs 52-B share a common cathode. In particular, the green light-emitting diode 52-G has an anode that is coupled to node A and a cathode that is coupled to node B. The blue light-emitting diode 52-B has an anode that is coupled to node C and a cathode that is also coupled to node B. The red light-emitting diode 52-R has an anode that is coupled to node D and a cathode that is coupled to node E. Driver circuitry 90 may control the voltage applied to nodes A, B, C, D, and E to control the light emitted by light-emitting diodes 52-B, 52-G, and 52-R.

Bond pad 118-1 is used to provide the voltage at node A to the anode of the green LED 52-G. Bond pad 118-2 is used to provide the voltage at node C to the anode of the blue LED 52-B. Bond pad 118-3 is used to provide the voltage at node D to the anode of the red LED 52-R. Bond pad 118-4 is used to provide the voltage at node E to the cathode of the red light-emitting diode 52-R. Conductive contacts 124 may be used to provide the voltage at node B to the common cathode for LEDs 52-G and 52-B.

The array in FIGS. 22 and 23 includes red, blue, and green light-emitting diodes. This type of array may be used in, for example, FIG. 15.

Figure 24:
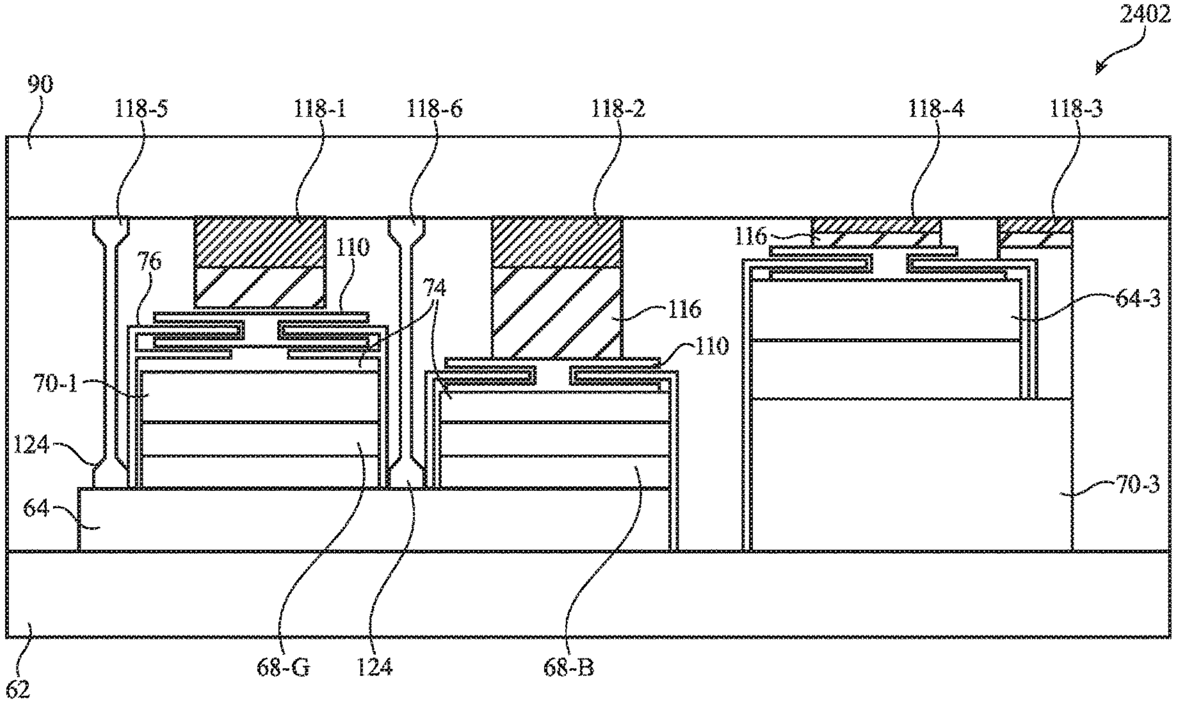
FIG. 24 is a cross-sectional side view of illustrative method steps for forming a light-emitting diode array with light-emitting diodes of three different colors that are bonded to a driver substrate in accordance with some embodiments.
Figure 24:
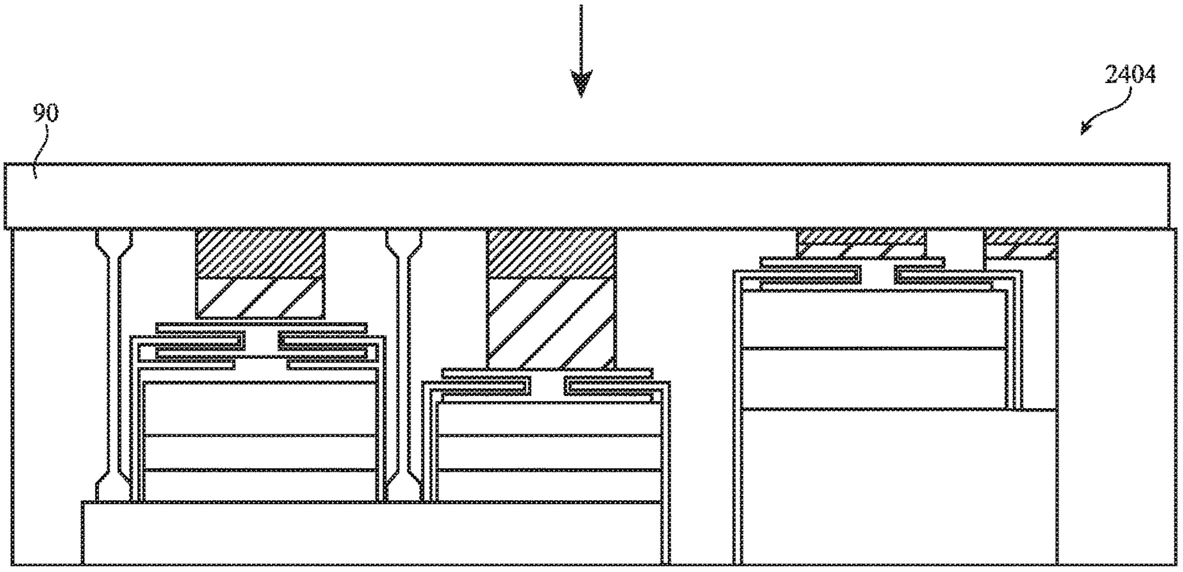

FIG. 22 shows one example for forming contacts to the LEDs (e.g., at step 2218). However, other associated LED contact arrangements may be used. FIG. 24 is a cross-sectional side view showing an alternative method of forming contacts for the LED array. Step 2402 in FIG. 24 may succeed steps 2202-2216 of FIG. 22.

At step 2402, the contacts 110 may be bonded to bond pads 118 of a driver substrate 90 that includes driving circuitry (as discussed in connection with FIGS. 10 and 11, for example). A conductive material 116 (e.g., solder) may mechanically and electrically connect conductive contacts 110 to bond pads 118. As shown in step 2402, bond pad 118-1 is mechanically and electrically connected a conductive contact 110 that provides signals to p-type semiconductor layer 70-1. Bond pad 118-2 is mechanically and electrically connected a conductive contact 110 that provides signals to p-type semiconductor layer 70-2. Bond pad 118-3 is mechanically and electrically connected a conductive contact 110 that provides signals to p-type semiconductor layer 70-3. Bond pad 118-4 is mechanically and electrically connected a conductive contact 110 that provides signals to n-type semiconductor layer 64-3. Bond pads 118-5 and 118-6 may be electrically connected (e.g., using wire bonds) to conductive contacts 124 on n-type semiconductor layer 64. Substrate 62 may optionally be removed at step 2404. Encapsulant may also optionally be formed between (in conformal contact with) the LEDs at step 2402. The circuit diagram for the array of FIG. 24 is the same as already shown in connection with FIG. 23.

Figure 25:
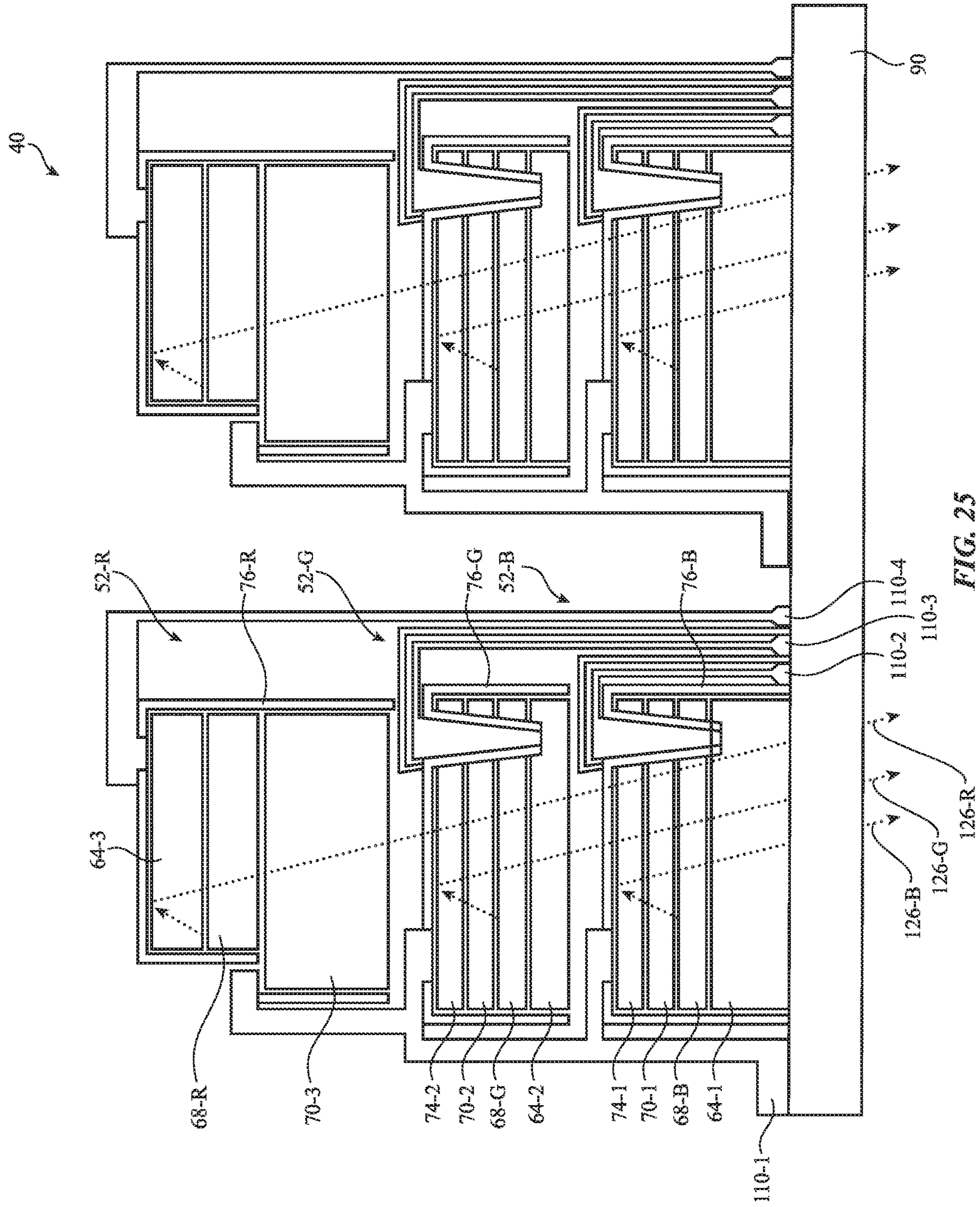
FIG. 25 is a cross-sectional side view of an illustrative light-emitting diode array with stacked light-emitting diodes of three different colors in accordance with some embodiments.

FIG. 25 is a cross-sectional side view of another LED array 40. The LED array of FIG. 25 includes stacks of red, green, and blue light-emitting diodes. As shown in FIG. 25, epitaxial layers for the LED are formed on a driver substrate 90 (e.g., that includes driving circuitry). Substrate 90 may be formed from sapphire, gallium nitride (GaN), gallium arsenic (GaAs), silicon, or any other desired semiconductor and dielectric materials.

Blue light-emitting diode 52-B includes a n-type semiconductor layer 64-1, a blue multi-quantum wells layer 68-B, a p-type semiconductor layer 70-1, and a conductive contact 74-1. Green light-emitting diode 52-G includes a n-type semiconductor layer 64-2, a green multi-quantum wells layer 68-G, a p-type semiconductor layer 70-2, and a conductive contact 74-2. Red light-emitting diode 52-R includes a n-type semiconductor layer 64-3, a blue multi-quantum wells layer 68-R, and a p-type semiconductor layer 70-3.

The n-type semiconductor layer(s) 64-1, 64-2, and 64-3 may include materials such as n-type doped gallium nitride (GaN), n-type aluminum gallium indium phosphide (AlGaInP), etc. The n-type semiconductor layer(s) 64 may be epitaxial layers (e.g., formed using epitaxy-type crystal growth/material deposition). N-type semiconductor layer(s) 64 may sometimes be referred to herein as n-type epitaxial layer(s) 64, n-type layer(s) 64, etc.

Layers 70-1, 70-2, and 70-3 may include p-type doped gallium nitride (GaN) layers or p-type doped aluminum gallium indium phosphide (AlGaInP). These examples of materials for layers 70 are merely illustrative and in general the one or more p-type semiconductor layer(s) may be formed from any desired material. The p-type semiconductor layer(s) 70 may be epitaxial layers (e.g., formed using epitaxy-type crystal growth/material deposition). P-type semiconductor layer(s) 70 may sometimes be referred to herein as p-type epitaxial layer(s) 70, p-type layer(s) 70, etc.

As shown in FIG. 25, a blue multi-quantum wells (MQW) layer 68-B is interposed between n-type semiconductor layer 64-1 and p-type semiconductor layer 70-1, a green multi-quantum wells (MQW) layer 68-G is interposed between n-type semiconductor layer 64-2 and p-type semiconductor layer 70-2, and a red multi-quantum wells (MQW) layer 68-R is interposed between n-type semiconductor layer 64-3 and p-type semiconductor layer 70-3. N-type semiconductor layer(s) 64-1 may ultimately serve as a cathode for the blue LEDs in array 40 whereas p-type semiconductor layer(s) 70-1 may ultimately serve as an anode for the blue LEDs in array 40. N-type semiconductor layer(s) 64-2 may ultimately serve as a cathode for the green LEDs in array 40 whereas p-type semiconductor layer(s) 70-2 may ultimately serve as an anode for the green LEDs in array 40. N-type semiconductor layer(s) 64-3 may ultimately serve as a cathode for the red LEDs in array 40 whereas p-type semiconductor layer(s) 70-3 may ultimately serve as an anode for the red LEDs in array 40. MQW 68-B ultimately forms the active light emitting area of the blue LEDs in the array, MQW 68-G ultimately forms the active light emitting area of the green LEDs in the array, and MQW 68-R ultimately forms the active light emitting area of the red LEDs in the array. MQW layers 68-G, 68-B, and 68-R may include gallium nitride (GaN), gallium indium nitride (GaInN), aluminum gallium indium phosphide (AlGaInP), or any other desired materials.

In FIG. 25, a common anode contact 110-1 is electrically connected to conductive contact 74-1 (to provide signals to the anode of the blue LED), conductive contact 74-2 (to provide signals to the anode of the green LED), and p-type semiconductor layer 70-3 (to provide signals to the anode of the red LED). Each LED has a dedicated contact for its respective cathode. A second contact 110-2 is electrically connected to n-type semiconductor layer 64-1 (to provide signals to the cathode of the blue LED), a third contact 110-3 is electrically connected to n-type semiconductor layer 64-2 (to provide signals to the cathode of the green LED), and a fourth contact 110-4 is electrically connected to n-type semiconductor layer 64-3 (to provide signals to the cathode of the red LED). Insulating layers may optionally be formed between the electrical connections to contacts 110-2, 110-3, and 110-4.

Each LED may be at least partially surrounded by at least one insulating layer. In particular, a first distributed Bragg reflector (DBR) 76-B is formed around the blue LED 52-B, a second distributed Bragg reflector (DBR) 76-G is formed around the green LED 52-G, and a third distributed Bragg reflector (DBR) 76-R is formed around the red LED 52-R. DBR 76-B may reflect blue light 126-B (e.g., light at wavelengths between 400 nanometers and 500 nanometers) while passing red and green light. This allows for light 126-G from green LED 52-G and light 126-R from red LED 52-R to pass through DBR 76-B. DBR 76-G may reflect blue light 126-B and green light 126-G (e.g., light at wavelengths between 400 nanometers and 600 nanometers) while passing red light. This allows for light 126-R from red LED 52-R to pass through DBR 76-G. However, light 126-B and 126-G are reflected to increase the efficiency of the array. DBR 76-R may reflect blue light 126-B, green light 126-G, and red light 126-R (e.g., light at wavelengths between 400 nanometers and 700 nanometers). Reflecting light 126-B, 126-G, and 126-R increases the efficiency of the array.

A non-conductive bonding layer (e.g., epoxy or silicon dioxide) may be interposed between adjacent LEDs in the vertical stack of FIG. 25 (e.g., between LEDs 52-R and 52-G and/or between LEDs 52-G and 52-B).

Figure 26:
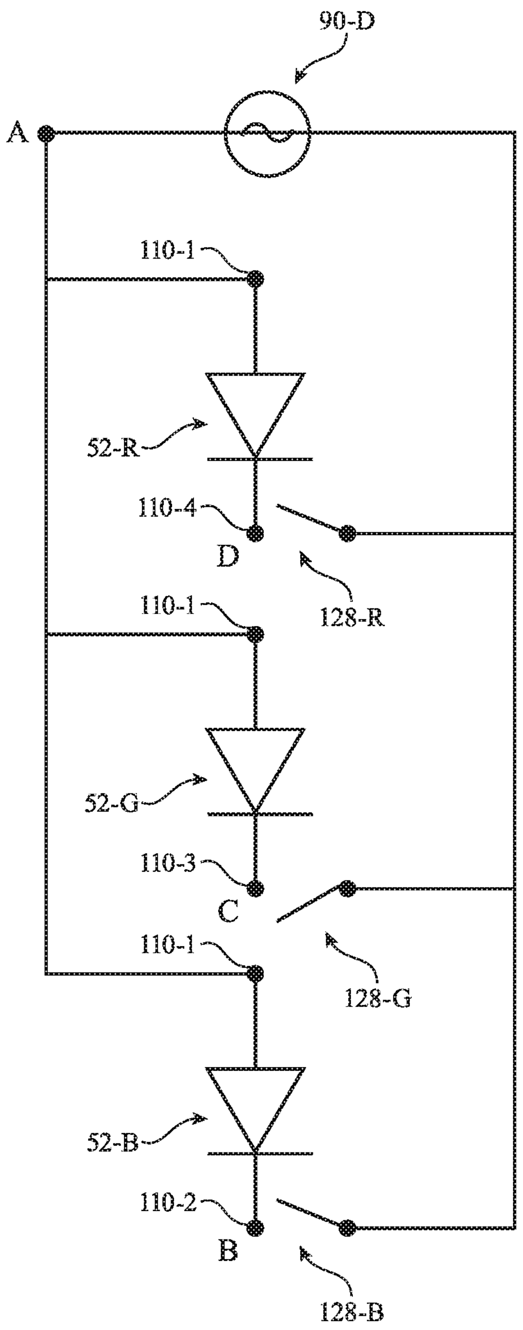
FIG. 26 is a circuit diagram of an illustrative pixel in a light-emitting diode array of the type shown in FIG. 25 in accordance with some embodiments.

FIG. 26 is a circuit diagram of the light-emitting diodes in the array of FIG. 25. The array of FIG. 25 may include a plurality of pixels, with each pixel having the circuit diagram of FIG. 26. As shown, LEDs 52-R, 52-G, and 52-B share a common anode that is coupled to node A. Red LED 52-R has a cathode that is coupled to node D. Green LED 52-G has a cathode that is coupled to node C. Blue LED 52-B has a cathode that is coupled to node B. The driving circuitry in substrate 90 may include switches 128 that are configured to selectively connect one of LEDs 52-R, 52-G, and 52B to the driving circuit 90-D. As shown, a switch 128-R is interposed between node D and driving circuit 90-D, a switch 128-G is interposed between node C and driving circuit 90-D, and a switch 128-B is interposed between node B and driving circuit 90-D. One of the three switches 128 may be closed to close the driving circuit with the respective LED associated with that switch. Time-multiplexing may therefore be used to emit light with the red, blue, and green LEDs in array 40.

Driver circuitry 90 may control the voltage applied to nodes A, B, C, and D (as well as switches 128-R, 128-G, and 128-B) to control the light emitted by light-emitting diodes 52-B, 52-G, and 52-R. Node A may be electrically connected to contact 110-1. Node B may be electrically connected to contact 110-2. Node C may be electrically connected to contact 110-3. Node D may be electrically connected to contact 110-4.

The array in FIGS. 25 and 26 includes red, blue, and green light-emitting diodes. This type of array may be used in, for example, FIG. 15.

Figure 27A:
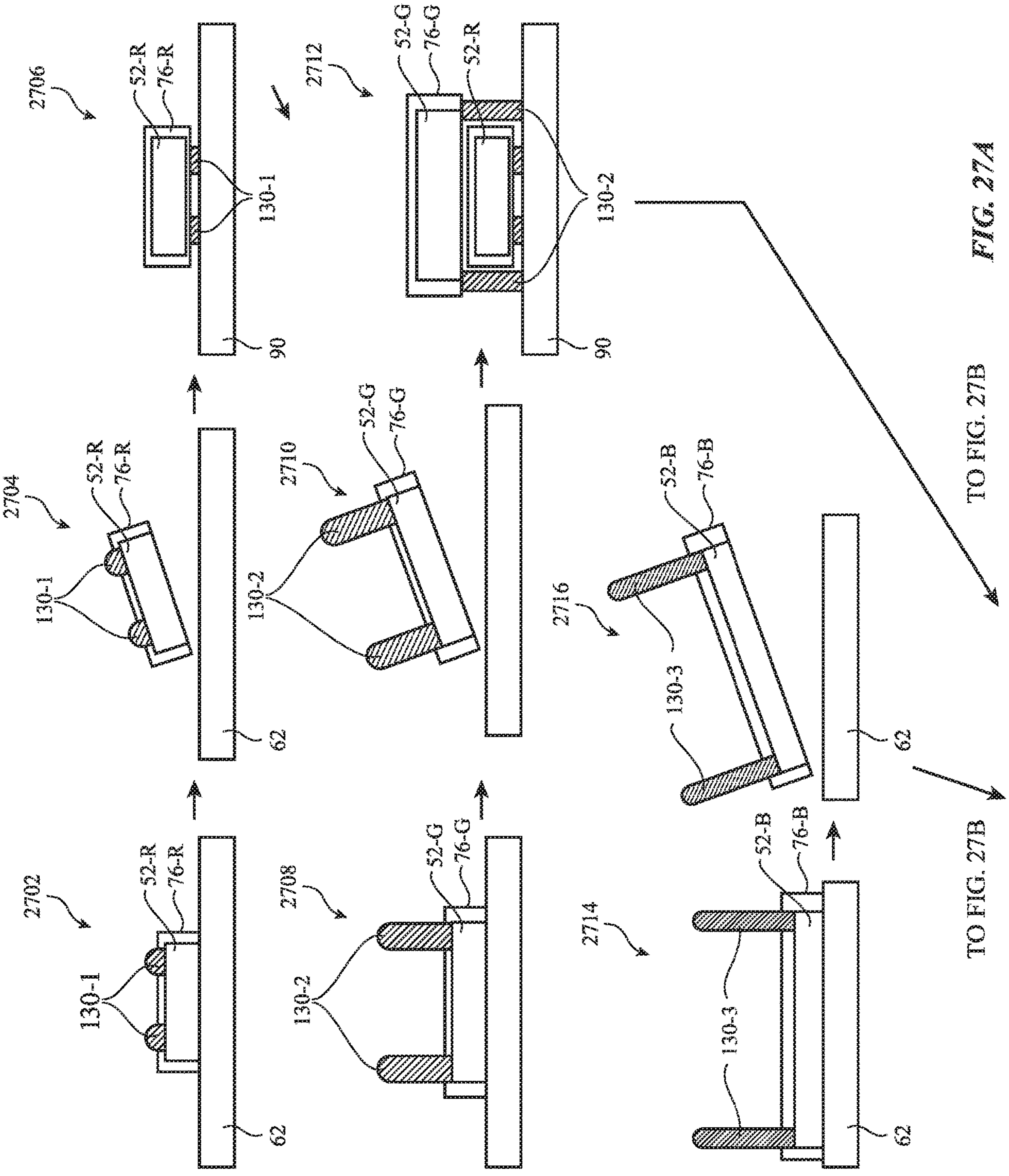
FIGS. 27A and 27B are cross-sectional side views of illustrative method steps for forming a light-emitting diode array with stacked light-emitting diodes of three different colors in accordance with some embodiments.
Figure 27B:
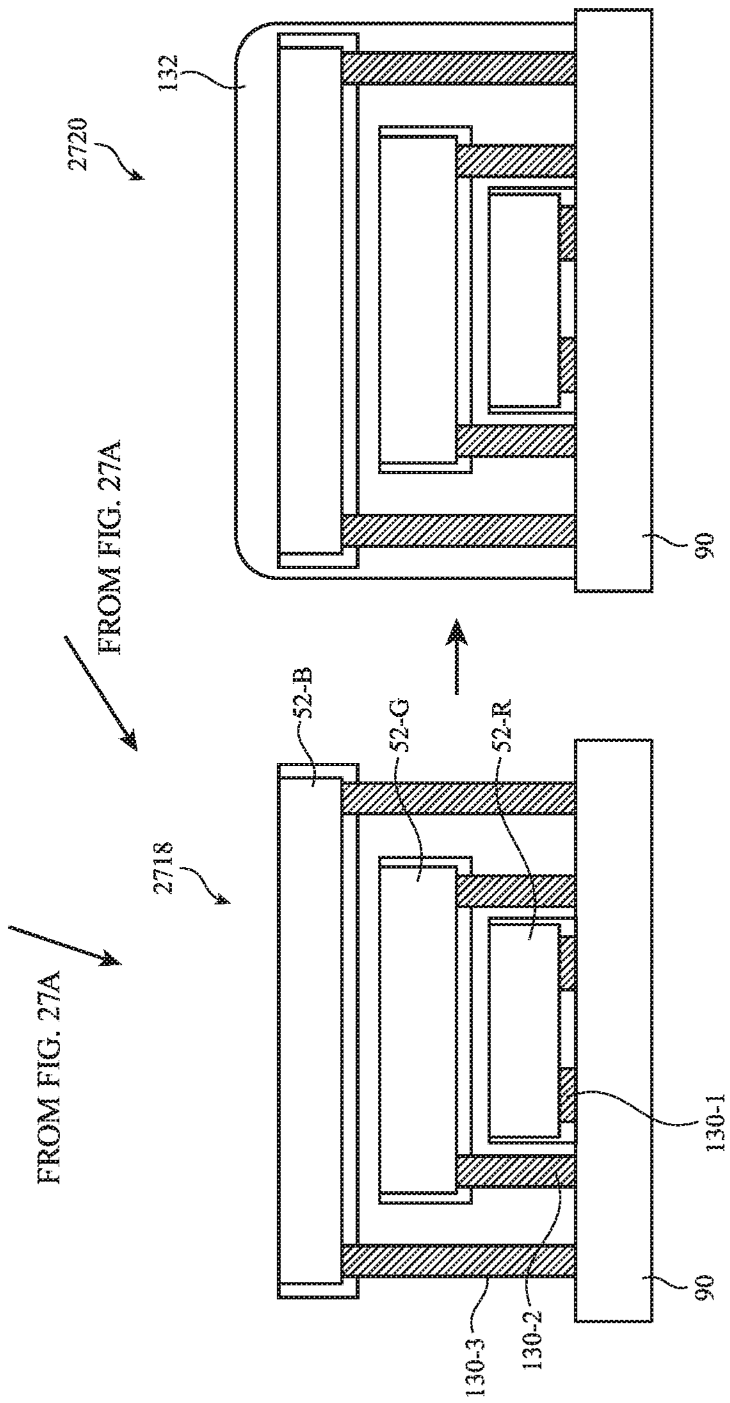

FIGS. 27A and 27B (sometimes collectively referred to as FIG. 27) include a plurality of cross-sectional side views of an illustrative method for forming an array with three different color light-emitting diodes. First, at step 2702, red light-emitting diodes 52-R (e.g., with one or more n-type semiconductor layers, a MQW layer, and one or more p-type semiconductor layers) may be formed on substrate 62 (e.g., similar to as discussed earlier herein). The red LED 52-R includes conductive contacts 130-1 (e.g., one contact for the anode of the red LED and one contact for the cathode of the red LED). A distributed Bragg reflector 76-R may be formed around the red LED. DBR 76-R may reflect blue light, green light, and red light (e.g., light at wavelengths between 400 nanometers and 700 nanometers).

At step 2704, the red LED 52-R is removed from substrate 62. Then, at step 2706, the red LED is bonded to driver substrate 90. In particular, contacts 130-1 may be bonded to respective bond pads in driver substrate 90.

At step 2708, green light-emitting diodes 52-G (e.g., with one or more n-type semiconductor layers, a MQW layer, and one or more p-type semiconductor layers) may be formed on substrate 62 (e.g., similar to as discussed earlier herein). The green LED 52-G includes conductive contacts 130-2 (e.g., one contact for the anode of the green LED and one contact for the cathode of the green LED). A distributed Bragg reflector 76-G may be formed around the green LED. DBR 76-G may reflect blue light and green light (e.g., light at wavelengths between 400 nanometers and 600 nanometers) while passing red light.

At step 2710, the green LED 52-G is removed from substrate 62. Then, at step 2712, the green LED is bonded to driver substrate 90 (which already is bonded to red LED 52-R). In particular, contacts 130-2 may be bonded to respective bond pads in driver substrate 90.

At step 2714, blue light-emitting diodes 52-B (e.g., with one or more n-type semiconductor layers, a MQW layer, and one or more p-type semiconductor layers) may be formed on substrate 62 (e.g., similar to as discussed earlier herein). The blue LED 52-B includes conductive contacts 130-3 (e.g., one contact for the anode of the blue LED and one contact for the cathode of the blue LED). A distributed Bragg reflector 76-B may be formed around the blue LED. DBR 76-B may reflect blue light (e.g., light at wavelengths between 400 nanometers and 500 nanometers) while passing red light and green light.

At step 2716, the blue LED 52-B is removed from substrate 62. Then, at step 2718, the blue LED is bonded to driver substrate 90 (which already is bonded to red LED 52-R and blue LED 52-B). In particular, contacts 130-3 may be bonded to respective bond pads in driver substrate 90.

Finally, at step 2720, encapsulation 132 (sometimes referred to as underfill 132) may be formed over the LEDs to fully encapsulate the LEDs.

In all of the LED arrangements herein, an LED array may be formed on a single substrate or between two substrates. When the LED is formed on a single substrate, the single substrate may be a driver substrate that includes driving circuitry to control the LEDs in the array. The LEDs may emit light through the driver substrate (e.g., bottom-emission) or away from the driver substrate (e.g., top-emission). When the LED is formed between two substrates, the LEDs may emit light in one direction through either one of the substrates or may be a double-sided array that emits light in two directions through both of the substrates.

It should be noted that structures and methods for LEDs that are used in an array with LEDs of two colors (as in FIG. 14) may instead be used in array with LEDs of three colors (as in FIG. 15). As a specific example, consider FIG. 16 where blue and green LEDs are formed in an array. If desired, red LEDs may also be added to the array (e.g., with a non-conductive adhesive). The red LEDs may be added to the array after manufacturing of the blue and green LEDs (including metallization) is complete or further upstream so that metallization for all three color LEDs is performed in parallel (e.g., as in FIG. 18). Similarly, the structures and methods for LEDs that are used in an array with LEDs of three colors (as in FIG. 15) may instead be used in array with LEDs of two colors (as in FIG. 14). As a specific example, the steps involving the red LEDs in FIG. 18 may be omitted to form an array with only blue and green LEDs.

In all of the various methods of forming LED arrays described herein, it should be noted that encapsulant and/or filler may be added to the array at any desired point. The encapsulant may conform to the LEDs and provide mechanical support for the LEDs. In some cases, encapsulant may be included as an intermediate material that is removed later in manufacturing.

The foregoing is merely illustrative and various modifications can be made to the described embodiments. The foregoing embodiments may be implemented individually or in any combination.

What is claimed is:

1. An electronic device comprising:
- a first n-type semiconductor layer;
- a first p-type semiconductor layer;
- a multi-quantum wells layer of a first color that is interposed between the first n-type semiconductor layer and the first p-type semiconductor layer, wherein the first n-type semiconductor layer, the first p-type semiconductor layer, and the multi-quantum wells layer of the first color define a first plurality of light-emitting diodes of the first color;
- a second n-type semiconductor layer different than the first n-type semiconductor layer, wherein the first p-type semiconductor layer is interposed between the second n-type semiconductor layer and the multi-quantum wells layer of the first color;
- a second p-type semiconductor layer;
- a multi-quantum wells layer of a second color that is different than the first color that is interposed between the second n-type semiconductor layer and the second p-type semiconductor layer, wherein the second n-type semiconductor layer, the second p-type semiconductor layer, and the multi-quantum wells layer of the second color define a second plurality of light-emitting diodes of the second color; and
- a third n-type semiconductor layer different than the first and second n-type semiconductor layers.

2. The electronic device defined in claim 1, wherein the first plurality of light-emitting diodes and the second plurality of light-emitting diodes are arranged in a plurality of pixels and wherein each pixel includes a light-emitting diode of the first color and a light-emitting diode of the second color that are electrically coupled in a head-to-tail arrangement.

3. The electronic device defined in claim 2, further comprising:
- driving circuitry that is configured to alternately emit light with the first plurality of light-emitting diodes and the second plurality of light-emitting diodes using time-multiplexing.

4. The electronic device defined in claim 1, further comprising:
- a first conductive contact that is configured to provide signals to both the first n-type semiconductor layer and the second p-type semiconductor layer.

5. The electronic device defined in claim 4, further comprising:
- a second conductive contact that is configured to provide signals to both the second n-type semiconductor layer and the first p-type semiconductor layer.

6. The electronic device defined in claim 1, wherein the first plurality of light-emitting diodes and the second plurality of light-emitting diodes are arranged in a plurality of pixels, wherein each pixel includes a first light-emitting diode of the first color and a second light-emitting diode of the second color, wherein an anode of the first light-emitting diode is shorted to a cathode of the second light-emitting diode, and wherein an anode of the second light-emitting diode is shorted to a cathode of the first light-emitting diode.

7. The electronic device defined in claim 1, further comprising:
- a first conductive contact that is configured to provide signals to the second p-type semiconductor layer; and
- a second conductive contact that is configured to provide signals to the first p-type semiconductor layer and the second n-type semiconductor layer.

8. The electronic device defined in claim 7, further comprising:
- a third conductive contact that is configured to provide signals to the first n-type semiconductor layer; and
- a fourth conductive contact that is configured to provide signals to the first p-type semiconductor layer and the second n-type semiconductor layer.

9. The electronic device defined in claim 1, further comprising:
- a third p-type semiconductor layer; and
- a multi-quantum wells layer of a third color that is interposed between the third n-type semiconductor layer and the third p-type semiconductor layer, wherein the third n-type semiconductor layer, the third p-type semiconductor layer, and the multi-quantum wells layer of the third color define a third plurality of light-emitting diodes of the third color.

10. The electronic device defined in claim 9, further comprising:
- a driver substrate with driver circuitry, wherein the first, second, and third pluralities of light-emitting diodes are electrically connected to the driver substrate, wherein the first p-type semiconductor layer is interposed between the first n-type semiconductor layer and the driver substrate, wherein the second p-type semiconductor layer is interposed between the second n-type semiconductor layer and the driver substrate, and wherein the third n-type semiconductor layer is interposed between the third p-type semiconductor layer and the driver substrate.

11. The electronic device defined in claim 1, further comprising:
- a first conductive contact that is configured to provide signals to the second p-type semiconductor layer;
- a second conductive contact that is configured to provide signals to the second p-type semiconductor layer; and
- a third conductive contact that is configured to provide signals to the first n-type semiconductor layer.

12. The electronic device defined in claim 1, wherein the first plurality of light-emitting diodes and the second plurality of light-emitting diodes are arranged in a plurality of pixels and wherein each pixel includes a light-emitting diode of the first color and a light-emitting diode of the second color that are electrically connected in series.

13. An electronic device comprising:

a first n-type semiconductor layer;

a first p-type semiconductor layer that overlaps a first portion of the first n-type semiconductor layer;

a multi-quantum wells layer of a first color that is interposed between the first n-type semiconductor layer and the first p-type semiconductor layer;

a multi-quantum wells layer of a second color that is different than the first color having a first portion that is interposed between the first portion of the first n-type semiconductor layer and the first p-type semiconductor layer; and a second p-type semiconductor layer that overlaps a second portion of the first n-type semiconductor layer, wherein the multi-quantum wells layer of the second color has a second portion that is interposed between the second portion of the first n-type semiconductor layer and the second p-type semiconductor layer, wherein the first n-type semiconductor layer, the first p-type semiconductor layer, and the multi-quantum wells layer of the first color define a first light-emitting diode of the first color, and wherein the first n-type semiconductor layer, the second p-type semiconductor layer, and the second portion of the multi-quantum wells layer of the second color define a second light-emitting diode of the second color.

14. The electronic device defined in claim 13, wherein the first and second light-emitting diodes share a common cathode that includes the first n-type semiconductor layer.

15. The electronic device defined in claim 13, further comprising:

a second n-type semiconductor layer;

a third p-type semiconductor layer; and a multi-quantum wells layer of a third color that is interposed between the second n-type semiconductor layer and the third p-type semiconductor layer, wherein the second n-type semiconductor layer, the third p-type semiconductor layer, and the multi-quantum wells layer of the third color define a third light-emitting diode of the third color.

16. The electronic device defined in claim 15, further comprising:

a driver substrate with driver circuitry, wherein the first, second, and third light-emitting diodes are electrically connected to the driver substrate, wherein the first n-type semiconductor layer is interposed between the first p-type semiconductor layer and the driver substrate, wherein the first n-type semiconductor layer is interposed between the second p-type semiconductor layer and the driver substrate, and wherein the third p-type semiconductor layer is interposed between the second n-type semiconductor layer and the driver substrate.

17. The electronic device defined in claim 15, further comprising:

a driver substrate with driver circuitry, wherein the first, second, and third light-emitting diodes are electrically connected to the driver substrate, wherein the first p-type semiconductor layer is interposed between the first n-type semiconductor layer and the driver substrate, wherein the second p-type semiconductor layer is interposed between the first n-type semiconductor layer and the driver substrate, and wherein the second n-type semiconductor layer is interposed between the third p-type semiconductor layer and the driver substrate.

18. An electronic device comprising a light-emitting diode array with a plurality of pixels, wherein each pixel comprises:

a blue light-emitting diode comprising a first n-type semiconductor layer, a first p-type semiconductor layer, and a blue multi-quantum wells layer interposed between the first n-type semiconductor layer and the first p-type semiconductor layer;

a green light-emitting diode comprising a second n-type semiconductor layer, a second p-type semiconductor layer, and a green multi-quantum wells layer interposed between the second n-type semiconductor layer and the second p-type semiconductor layer;

a red light-emitting diode comprising a third n-type semiconductor layer, a third p-type semiconductor layer, and a red multi-quantum wells layer interposed between the third n-type semiconductor layer and the third p-type semiconductor layer, wherein the blue, red, and green light-emitting diodes are vertically stacked; and a first conductive contact that provides signals to the first p-type semiconductor layer, the second p-type semiconductor layer, and the third p-type semiconductor layer.

19. The electronic device defined in claim 18, wherein each pixel further comprises:

a second conductive contact that provides signals to the first n-type semiconductor layer;

a third conductive contact that provides signals to the second n-type semiconductor layer; and a fourth conductive contact that provides signals to the third n-type semiconductor layer.

20. The electronic device defined in claim 19, wherein each pixel further comprises:

a first switch that is coupled to the second conductive contact;

a second switch that is coupled to the third conductive contact; and a third switch that is coupled to the fourth conductive contact.

21. The electronic device defined in claim 18, wherein each pixel further comprises:

a first distributed Bragg reflector that at least partially surrounds the blue light-emitting diode, wherein the first distributed Bragg reflector reflects blue light and transmits red light and green light;

a second distributed Bragg reflector that at least partially surrounds the green light-emitting diode, wherein the second distributed Bragg reflector reflects blue light and green light and transmits red light; and a third distributed Bragg reflector that at least partially surrounds the red light-emitting diode, wherein the third distributed Bragg reflector reflects blue light, green light, and red light.

22. The electronic device defined in claim 1, wherein each pixel further comprises:

a distributed Bragg reflector that at least partially surrounds a given light-emitting diode of the first plurality of light-emitting diodes of the first color.

23. The electronic device defined in claim 22, wherein the distributed Bragg reflector reflects light of the first color.

* * * * *